(12) United States Patent
Kandanarachchi et al.

(10) Patent No.: US 9,422,376 B2
(45) Date of Patent: *Aug. 23, 2016

(54) AMINE TREATED MALEIC ANHYDRIDE POLYMERS, COMPOSITIONS AND APPLICATIONS THEREOF

(71) Applicants: PROMERUS, LLC, Brecksville, OH (US); SUMITOMO BAKELITE CO., LTD, Shinagawa-Ku, Tokyo (JP)

(72) Inventors: Pramod Kandanarachchi, Brecksville, OH (US); Larry F. Rhodes, Brecksville, OH (US); Osamu Onishi, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/477,928

(22) Filed: Sep. 5, 2014

(65) Prior Publication Data

US 2015/0079506 A1 Mar. 19, 2015

Related U.S. Application Data

(60) Provisional application No. 61/878,263, filed on Sep. 16, 2013.

(51) Int. Cl.

| | | |
|---|---|---|
| *C08F 8/32* | (2006.01) | |
| *C08F 8/12* | (2006.01) | |
| *C08F 8/44* | (2006.01) | |
| *C08F 8/48* | (2006.01) | |
| *C08F 222/06* | (2006.01) | |
| *C08F 210/14* | (2006.01) | |
| *C08F 230/08* | (2006.01) | |
| *C08F 232/08* | (2006.01) | |
| *C08F 232/04* | (2006.01) | |
| *G03F 7/038* | (2006.01) | |
| *G03F 7/039* | (2006.01) | |
| *G03F 7/004* | (2006.01) | |
| *G03F 7/30* | (2006.01) | |
| *C08F 210/10* | (2006.01) | |
| *C08F 212/08* | (2006.01) | |
| *C08F 222/08* | (2006.01) | |
| *G03F 7/016* | (2006.01) | |
| *G03F 7/075* | (2006.01) | |
| *G03C 1/56* | (2006.01) | |
| *G03C 1/60* | (2006.01) | |
| *G03F 7/40* | (2006.01) | |
| *C09D 135/06* | (2006.01) | |
| *C09D 145/00* | (2006.01) | |

(52) U.S. Cl.
CPC ... *C08F 8/32* (2013.01); *C08F 8/12* (2013.01); *C08F 8/44* (2013.01); *C08F 8/48* (2013.01); *C08F 210/10* (2013.01); *C08F 210/14* (2013.01); *C08F 212/08* (2013.01); *C08F 222/06* (2013.01); *C08F 222/08* (2013.01); *C08F 230/08* (2013.01); *C08F 232/04* (2013.01); *C08F 232/08* (2013.01); *C09D 135/06* (2013.01); *C09D 145/00* (2013.01); *G03C 1/56* (2013.01); *G03C 1/60* (2013.01); *G03F 7/0048* (2013.01); *G03F 7/0163* (2013.01); *G03F 7/038* (2013.01); *G03F 7/039* (2013.01); *G03F 7/0384* (2013.01); *G03F 7/0755* (2013.01); *G03F 7/0757* (2013.01); *G03F 7/30* (2013.01); *G03F 7/40* (2013.01); *C08F 2800/10* (2013.01); *C08F 2810/50* (2013.01)

(58) Field of Classification Search
None
See application file for complete search history.

(56) References Cited

U.S. PATENT DOCUMENTS

| | | | |
|---|---|---|---|
| 3,370,047 A | 2/1968 | Raines | |
| 4,740,561 A * | 4/1988 | Tsujimoto et al. | 525/327.6 |
| 5,212,043 A | 5/1993 | Yamamoto et al. | |
| 5,886,194 A * | 3/1999 | Ulmer et al. | 548/545 |
| 8,748,074 B2 * | 6/2014 | Onishi et al. | 430/192 |
| 2010/0310988 A1 * | 12/2010 | Abe et al. | 430/270.1 |
| 2011/0046274 A1 * | 2/2011 | Plueg | C08F 8/32 524/88 |
| 2012/0129101 A1 * | 5/2012 | Onishi et al. | 430/283.1 |
| 2013/0017488 A1 | 1/2013 | Onishi et al. | |

FOREIGN PATENT DOCUMENTS

FR 2699540 A1 6/1994

OTHER PUBLICATIONS

English abstract for FR 2699540 A1 (1994).*

* cited by examiner

*Primary Examiner* — Sin Lee
(74) *Attorney, Agent, or Firm* — Balaram Gupta

(57) ABSTRACT

Disclosed herein are various amine treated maleic anhydride containing polymers and compositions thereof, which are useful for forming self-imageable films. In some embodiments, such polymers encompass norbornene-type repeating units and maleic anhydride-type repeating units where at least some of such maleic anhydride-type repeating units are either ring-opened or have been transformed into maleimide repeat units. The films formed from such copolymer compositions provide self imageable, low-k, thermally stable layers for use in microelectronic and optoelectronic devices.

19 Claims, 3 Drawing Sheets

AMINE TREATED MALEIC ANHYDRIDE POLYMERS, COMPOSITIONS AND APPLICATIONS THEREOF

CROSS REFERENCE TO RELATED APPLICATIONS

This application claims the benefit of U.S. Provisional Application No. 61/878,263, filed Sep. 16, 2013, which is incorporated herein by reference in its entirety.

TECHNICAL FIELD

The present invention relates to a series of maleic anhydride containing olefinic polymers and the resulting amine treated polymers derived therefrom. More specifically, the present invention relates to a series of maleic anhydride containing copolymers with different olefins, including norbornene-type cycloolefinic monomers, including the polymers derived from the ring-opening of the maleic anhydride repeating unit by reaction with an amine. This invention also relates to methods of making these polymers and applications thereof. In particular, the polymers of this invention are found to be useful in various electronic material applications, including as overcoat layers in liquid crystal displays and in a variety of redistribution layer applications.

BACKGROUND

There has been a growing interest in developing new electronic materials featuring superior chemical, optical and mechanical properties, which are environmentally friendly and can be processed under aqueous conditions. Most notably, there is a growing demand for developing materials which are capable of forming micron-level structures. In particular, micron-level device geometries have become common place in the fabrication of a variety of liquid crystal displays (LCDs), organic light emitting diodes (OLEDs) and other radio frequency (RF) and microwave devices. For example, devices such as radio frequency integrated circuits (RFICs), micro-machine integrated circuits (MMICs), switches, couplers, phase shifters, surface acoustic wave (SAW) filters and SAW duplexers, have recently been fabricated in the micron-levels.

With such smaller geometries comes a requirement for dielectric materials with low dielectric constants to reduce or eliminate any cross-talk between adjacent signal lines or between a signal line and a device feature (e.g. a pixel electrode) due to capacitive coupling. Although many low dielectric (low-K) materials are available for microelectronic devices, for optoelectronic devices such materials must also be broadly transparent in the visible light spectrum, not require high temperature processing (greater than 300° C.) that would be incompatible with other elements of such an optoelectronic device, and be both low-cost and feasible for large scale optoelectronic device fabrication. Also there is a need for developing electronic materials which exhibits low wafer stress.

Thus, it would be desirable to have a material capable of forming a self-imageable layer to avoid the need for depositing a separate imaging layer. Such material should also be easy to apply to a substrate, have a low dielectric constant (3.9 or less) and thermal stability to temperatures in excess of 250° C. Of course, it is also desirable to have such materials available at a lower cost, feature such properties as positive or negative tone photoimaging capability, aqueous base developing capability, low defects after thermal cycling test (TCT), high transparency after heat stress, desired thermo-mechanical properties, such as tensile strength, elongation to break (ETB), coefficient of thermal expansion (CTE), desirable glass transition temperature ($T_g$), low wafer stress, low weight loss and ability to retain pattern integrity at curing temperatures.

It has been reported that acrylic polymers, which are inexpensive, offer good photoimaging properties and are aqueous base developable, see for example, Japanese Patent Application Laid-open No. Hei 5-165214 and the radiation-sensitive resin composition comprising an alicyclic olefin resin disclosed in Japanese Patent Application Laid-open No. 2003-162054. Similarly, polyimides have been reported to provide good thermal stability. However, these materials have certain deficiencies and thus making them not so suitable for the applications contemplated herein. For instance, acrylics are not suitable for applications requiring high thermal stability (i.e., temperatures higher than 200° C.), and many of the polyimides in general are not suitable for either positive tone or negative tone formulations requiring aqueous base developability and generally do not exhibit desirable transparency, thus making them unsuitable in certain optoelectronic applications. Although some polyimides have low dielectric constants but still may not have low enough permittivity to be effective in highly integrated and/or miniaturized devices having increased wiring density and high signal speed. One such known polyimide material is the positive tone type photosensitive resin comprising a polyimide precursor and a diazoquinone-type compound disclosed in Japanese Patent No. 3,262,108.

Recently, it has been reported that certain copolymers containing both norbornene-type repeat units and maleic anhydride-type repeat units are useful in certain microelectronic applications featuring self-image forming layer capability, when image-wise-exposed to actinic radiation, see U.S. Pat. No. 8,715,900 B2. These compositions are however suitable only for positive tone photoimaging and thermal curing with added additives to the polymeric composition. Thus there is still a need for polymeric compositions which can not only self-crosslink but also can be employed both as positive and negative tone compositions.

Thus, at least one of the solutions provided by this invention, among others, is to provide certain polymeric materials which are capable of forming films featuring desirable optoelectronic properties such as high transparency at various wavelengths from 400 nm to 700 nm, which films retain such high transparency properties even after thermal stress. Another non-limiting solution provided by this invention is to provide a variety of polymeric materials as disclosed herein which when formed into films exhibit excellent chemical resistance to commonly used chemicals and solvents in the electronic and optoelectronic material processing.

BRIEF DESCRIPTION OF THE DRAWINGS

Embodiments in accordance with the present invention are described below with reference to the following accompanying figures and/or images. Where drawings are provided, it will be drawings which are simplified portions of a device provided for illustrative purposes only.

DETAILED DESCRIPTION

Figure 1:
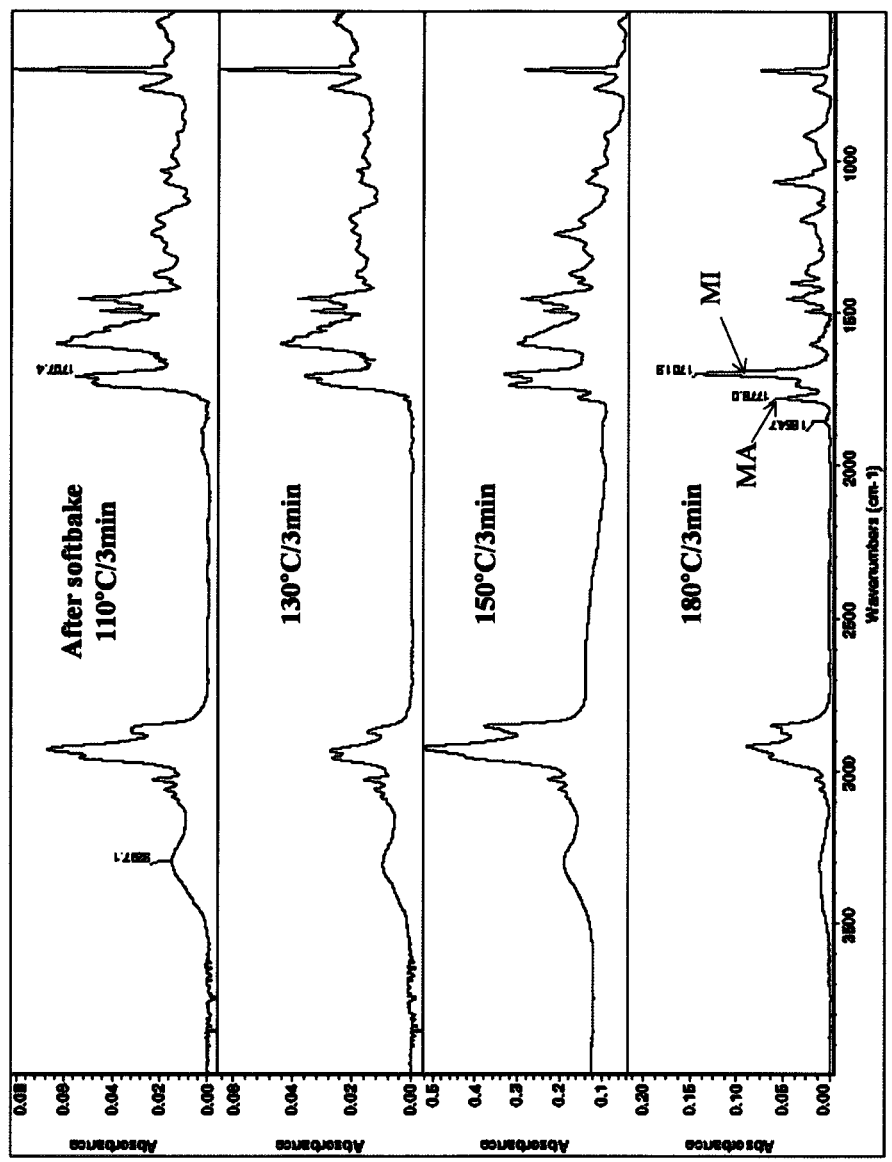
FIG. 1 shows the FT-IR spectra of the reaction products obtained from n-butylamine and SMA2000 (Example 38) on Si-wafers.

Embodiments in accordance with the present invention are directed to various polymers, including but not limited to, copolymers, terpolymers and tetrapolymers that encompass at least one repeating unit derived from a maleic anhydride monomer that is at least partially ring opened and/or converted to a maleimide, amic acid or other related repeat units derived therefrom, as such are defined hereinafter, and to compositions encompassing such polymers. In certain of the other embodiments of this invention the polymers of this invention also contain a certain type of norbornene-type monomer as described herein. Such polymer compositions being capable of forming self-imageable films useful as layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, "hydrocarbyl" refers to a radical of a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "$(C_1-C_{15})$alkyl" includes methyl and ethyl groups, and straight-chained or branched propyl, butyl, pentyl, hexyl, heptyl, and various other homolog groups. Particular alkyl groups are methyl, ethyl, n-propyl, isopropyl and tert-butyl, etc. Derived expressions, such as "$(C_1-C_{15})$alkoxy", "$(C_1-C_{15})$thioalkyl" "$(C_1-C_{15})$alkoxy-$(C_1-C_{15})$alkyl", "hydroxy$(C_1-C_{15})$alkyl", "$(C_1-C_{15})$alkylcarbonyl", "$(C_1-C_{15})$alkoxycarbonyl-$(C_1-C_{15})$alkyl", "$(C_1-C_{15})$alkoxycarbonyl", "amino$(C_1-C_{15})$alkyl", "$(C_1-C_{15})$alkylamino", "$(C_1-C_5)$alkylcarbamoyl$(C_1-C_5)$alkyl", "$(C_1-C_{15})$dialkylcarbamoyl$(C_1-C_{15})$alkyl" "mono- or di-$(C_1-C_{15})$alkylamino$(C_1-C_{15})$alkyl", "amino$(C_1-C_{15})$alkylcarbonyl" "diphenyl$(C_1-C_{15})$alkyl", "phenyl$(C_1-C_{15})$alkyl", "phenylcarboyl$(C_1-C_{15})$alkyl" and "phenoxy$(C_1-C_{15})$alkyl" are to be construed accordingly.

As used herein, the expression "cycloalkyl" includes all of the known cyclic radicals. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "$(C_2-C_6)$alkenyl" includes ethenyl and straight-chained or branched propenyl, butenyl, pentenyl and hexenyl groups. Similarly, the expression "$(C_2-C_6)$alkynyl" includes ethynyl and propynyl, and straight-chained or branched butynyl, pentynyl and hexynyl groups.

As used herein the expression "$(C_1-C_4)$acyl" shall have the same meaning as "$(C_1-C_4)$alkanoyl", which can also be represented structurally as "R—CO—," where R is a $(C_1-C_3)$ alkyl as defined herein. Additionally, "$(C_1-C_3)$alkylcarbonyl" shall mean same as $(C_1-C_4)$acyl. Specifically, "$(C_1-C_4)$acyl" shall mean formyl, acetyl or ethanoyl, propanoyl, n-butanoyl, etc. Derived expressions such as "$(C_1-C_4)$acyloxy" and "$(C_1-C_4)$acyloxyalkyl" are to be construed accordingly.

As used herein, the expression "$(C_1-C_{15})$perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "$(C_1-C_{15})$perfluoroalkoxy", is to be construed accordingly.

As used herein, the expression "$(C_6-C_{10})$aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art. Derived expression, "$(C_6-C_{10})$arylsulfonyl," is to be construed accordingly.

As used herein, the expression "$(C_6-C_{10})$aryl$(C_1-C_4)$alkyl" means that the $(C_6-C_{10})$aryl as defined herein is further attached to $(C_1-C_4)$alkyl as defined herein. Representative examples include benzyl, phenylethyl, 2-phenylpropyl, 1-naphthylmethyl, 2-naphthylmethyl and the like.

As used herein, the expression "heteroaryl" includes all of the known heteroatom containing aromatic radicals, including such heteroatoms as oxygen, sulfur, nitrogen, phosphorus, silicon, and the like. Representative 5-membered heteroaryl radicals include furanyl, thienyl or thiophenyl, pyrrolyl, pyrrolyl-dione, isopyrrolyl, pyrazolyl, imidazolyl, oxazolyl, thiazolyl, isothiazolyl, and the like. Representative 6-membered heteroaryl radicals include pyridinyl, pyridazinyl, pyrimidinyl, pyrazinyl, triazinyl, and the like radicals. Representative examples of bicyclic heteroaryl radicals include, benzofuranyl, benzothiophenyl, indolyl, quinolinyl, isoquinolinyl, cinnolyl, benzimidazolyl, indazolyl, pyridofuranyl, pyridothienyl, and the like radicals.

As used herein, the expression "heterocycle" includes all of the known reduced heteroatom containing cyclic radicals. Representative 5-membered heterocycle radicals include tetrahydrofuranyl, tetrahydrothiophenyl, pyrrolidinyl, 2-thiazolinyl, tetrahydrothiazolyl, tetrahydrooxazolyl, and the like. Representative 6-membered heterocycle radicals include piperidinyl, piperazinyl, morpholinyl, thiomorpholinyl, and the like. Various other heterocycle radicals include, without limitation, aziridinyl, azepanyl, diazepanyl, diazabicyclo[2.2.1] hept-2-yl, and triazocanyl, and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $(C_1-C_6)$alkyl, $(C_2-C_6)$alkenyl, $(C_1-C_6)$perfluoroalkyl, phenyl, hydroxy, —$CO_2H$, an ester, an amide, $(C_1-C_6)$alkoxy, $(C_1-C_6)$thioalkyl, $(C_1-C_6)$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

The statements below, wherein, for example, $R_5$ and $R_6$ are said to be independently selected from a group of substituents, means that $R_5$ and $R_6$ are independently selected, but also that where an $R_5$ variable occurs more than once in a molecule, those occurrences are independently selected (e.g., if $R_1$ and $R_2$ are each contains a group of formula (A), $R_5$ can be hydrogen in $R_1$, and $R_5$ can be methyl in $R_2$). Those skilled in the art will recognize that the size and nature of the substituent(s) can affect the number and nature of other substituents that can be present.

It should be noted that any atom with unsatisfied valences in the text, schemes, examples and tables herein is assumed to have the appropriate number of hydrogen atom(s) to satisfy such valences.

As used herein, the terms "polymer composition," "copolymer composition," "terpolymer composition" or "tetrapolymer composition" are used herein interchangeably and are meant to include at least one synthesized polymer, copolymer terpolymer or tetrapolymer, as well as residues from initiators, solvents or other elements attendant to the synthesis of such polymers, where such residues are understood as not necessarily being covalently incorporated thereto. But some catalysts or initiators may sometimes be covalently bound to a part of the polymeric chain either at the beginning and/or end of the polymeric chain. Such residues and other elements considered as part of the "polymer" or "polymer composition" are typically mixed or co-mingled with the polymer such that they tend to remain therewith when it is transferred between vessels or between solvent or dispersion media. A polymer composition can also include materials added after synthesis of the polymer to provide or modify specific properties of such composition. Such materials include, but are not limited to solvent(s), antioxidant(s), photoinitiator(s), sensitizers and other materials as will be discussed more fully below.

By the term "derived" is meant that the polymeric repeating units are polymerized (formed) from, e.g., polycyclic norbornene-type monomers, in accordance with formula (I) or maleic anhydride monomers of formula (III) wherein the resulting polymers are formed by 2,3 enchainment of norbornene-type monomers with maleic anhydride monomers as shown below:

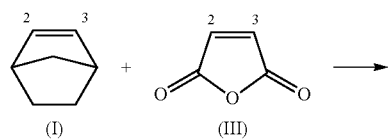

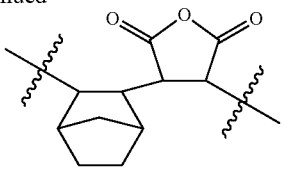

It should be understood that depending upon the monomeric compositions in a given polymer the repeat units may not always be alternating. That is to say, for example, in a copolymer containing especially other than 50:50 molar ratios of norbornene-type monomers with maleic anhydride monomers, the repeat units are not always alternating but with random blocks of monomers with the higher molar content. It should further be noted that, as one of skill in the art readily appreciates, depending upon the type of monomers employed, i.e., norbornene-type monomers of formula (I) or other olefinic monomers of formula (II), each of which may polymerize differently with maleic anhydride, and therefore, the resulting polymer need not be alternating even when only one type of monomer of formula (I) or (II) is employed with maleic anhydride copolymer and even at a molar ratio of 50:50. Thus, it is possible to form polymers containing various ratios of monomers with random or alternating order. In particular, the order of monomers in the polymer chain is not important to this invention and can be random or alternating depending upon the types of monomers employed.

It will be understood that the terms "dielectric" and "insulating" are used interchangeably herein. Thus reference to an insulating material or layer is inclusive of a dielectric material or layer and vice versa.

The term "low K" refers in general to a dielectric constant less than that of thermally formed silicon dioxide (3.9) and when used in reference to a "low-K material" it will be understood to mean a material having a dielectric constant of less than 3.9.

It will be understood that the term "redistribution layer (RDL)" refers to an electrical signal routing insulation material which features desirable and reliable properties. The term RDL may also be used interchangeably to describe buffer coating layers, such as for example, a stress relief or buffer layer between the solder ball and fragile structure, also generally featuring low dielectric constant.

The term "photodefinable" refers to the characteristic of a material or composition of materials, such as a polymer composition in accordance with embodiments of the present invention, to be formed into, in and of itself, a patterned layer or a structure. In alternate language, a "photodefinable layer" does not require the use of another material layer formed thereover, for example a photoresist layer, to form the aforementioned patterned layer or structure. It will be further understood that a polymer composition having such a characteristic be employed in a pattern forming scheme to form a patterned film/layer or structure. It will be noted that such a scheme incorporates an "imagewise exposure" of the photodefinable material or layer. Such imagewise exposure being taken to mean an exposure to actinic radiation of selected portions of the layer, where non-selected portions are protected from such exposure to actinic radiation. Furthermore, "photodefinable," "photoimageable" or "photosensitive" as used herein shall mean the same and are used interchangeably herein.

The term "cure" (or "curing") as used in connection with a composition, e.g., "a cured composition," shall mean that at least a portion of the crosslinkable components which are encompassed by the composition are at least partially crosslinked. In some embodiments of the present invention, the crosslinking is sufficient to render the polymer film insoluble in the developer and in some other embodiments the polymer film is insoluble in commonly used solvents. One skilled in the art will understand that the presence and degree of crosslinking (crosslink density) can be determined by a variety of methods, such as dynamic mechanical thermal analysis (DMTA). This method determines the glass transition temperature and crosslink density of free films of coatings or polymers. These physical properties of a cured material are related to the structure of the crosslinked network. Higher crosslink density values indicate a higher degree of crosslinking in the coating or film.

Monomers

Various monomers that are contemplated to be part of polymer composition embodiments in accordance with the present invention are generally known in the art. In general, the polymers of some of the embodiments of this invention encompass a wide range of "polycyclic" repeating units. As defined herein, the terms "polycyclic olefin" or "polycycloolefin" mean the same and are used interchangeably to represent several of the monomeric compounds used to prepare certain of the polymers of this invention. As a representative example of such a compound or a monomer is "norbornene-type" monomer and is generally referred to herein as addition polymerizable monomer (or the resulting repeating unit), that encompass at least one norbornene moiety such as shown below:

The simplest norbornene-type or polycyclic olefin monomer encompassed by embodiments in accordance with the present invention is the bicyclic monomer, bicyclo[2.2.1]hept-2-ene, commonly referred to as norbornene. However, the term norbornene-type monomer or repeating unit is used herein to mean norbornene itself as well as any substituted norbornene(s), or substituted and unsubstituted higher cyclic derivatives thereof. Representative examples of such monomers include but not limited to bicyclo[2.2.2]oct-2-ene, 1,2,3,4,4a, 5,8,8a-octahydro-1,4:5,8-dimethanonaphthalene, 1,4,4a,5,6, 7,8,8a-octahydro-1,4-epoxy-5,8-methanonaphthalene, and the like. In general, as further described in detail below, the norbornene-types of monomers that are suitable to form the polymers of this invention are represented by formula (I).

In some embodiments of this invention the polymers as disclosed herein also encompass repeat units derived from any of the olefinic monomers as represented by formula (II). Additionally, the polymers of this invention also encompass repeat units derived from maleic anhydride monomers as represented by formula (III).

As mentioned above, the monomeric compounds employed in this invention can be synthesized by any of the procedures known to one skilled in the art. Specifically, several of the starting materials used in the preparation of the monomers used herein are known or are themselves commercially available. The monomers employed herein as well as several of the precursor compounds may also be prepared by methods used to prepare similar compounds as reported in the literature and as further described herein.

Polymers

In accordance with the practice of this invention there is provided a polymer comprising: a first type of repeating unit represented by formula (IA), said first type of repeating unit is derived from a monomer of formula (I):

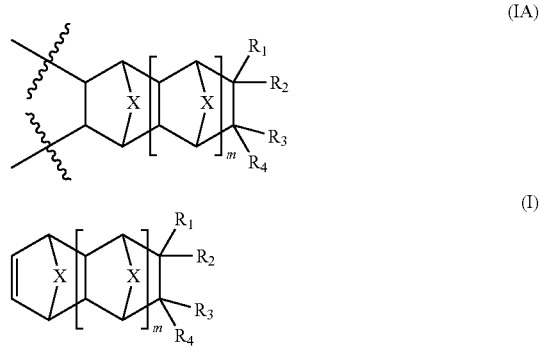

wherein:

m is an integer 0, 1 or 2;

X is $CH_2$, $CH_2$—$CH_2$, O or $NR_a$ where $R_a$ is linear or branched $(C_1$-$C_6)$alkyl;

$R_1$, $R_2$, $R_3$ and $R_4$ independently represents hydrogen, linear or branched $(C_1$-$C_{16})$alkyl, hydroxy$(C_1$-$C_{16})$alkyl, perfluoro $(C_1$-$C_{12})$alkyl, $(C_3$-$C_{12})$cycloalkyl, $(C_6$-$C_{12})$bicycloalkyl, $(C_7$-$C_{14})$tricycloalkyl, $(C_6$-$C_{10})$aryl, $(C_6$-$C_{10})$aryl$(C_1$-$C_3)$ alkyl, perfluoro$(C_6$-$C_{10})$aryl, perfluoro$(C_6$-$C_{10})$aryl$(C_1$-$C_3)$ alkyl, di$(C_1$-$C_6)$alkylmaleimide$(C_1$-$C_8)$alkyl, di$(C_1$-$C_2)$alkylmaleimide$(C_2$-$C_6)$alkoxy$(C_1$-$C_2)$alkyl, hydroxy, $(C_1$-$C_{12})$ alkoxy, $(C_3$-$C_{12})$cycloalkoxy, $(C_6$-$C_{12})$bicycloalkoxy, $(C_7$-$C_{14})$tricycloalkoxy, $(C_6$-$C_{10})$aryloxy$(C_1$-$C_3)$alkyl, $(C_5$-$C_{10})$ heteroaryloxy$(C_1$-$C_3)$alkyl, $(C_6$-$C_{10})$aryloxy, $(C_5$-$C_{10})$ heteroaryloxy, $(C_1$-$C_6)$acyloxy, oxiranyl$(C_0$-$C_8)$alkyl, oxiranyl$(CH_2)_aO(CH_2)_b$—, halogen or a group of formula (A):

—$(CH_2)_a$—$(OCH_2$—$CH_2)_b$—OR            (A)

wherein:

a is an integer 0, 1, 2, 3 or 4;

b is an integer 0, 1, 2, 3 or 4; and

R is linear or branched $(C_1$-$C_6)$alkyl, $(C_5$-$C_8)$cycloalkyl, $(C_6$-$C_{10})$aryl or $(C_7$-$C_{12})$aralkyl;

and/or a second type of repeating unit represented by formula (IIA), said second type of repeating unit is derived from a monomer of formula (II):

-continued

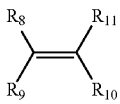
(II)

wherein
$R_8$, $R_9$, $R_{10}$ and $R_{11}$ are the same or different and each independently of one another is selected from hydrogen, linear or branched $(C_1\text{-}C_6)$alkyl, $(C_5\text{-}C_8)$cycloalkyl, $(C_6\text{-}C_{10})$aryl or $(C_7\text{-}C_{12})$aralkyl or a group of formula (B):

$$\text{—SiR}_5R_6R_7 \qquad (B)$$

wherein:
$R_5$, $R_6$, and $R_7$ are the same or different and each independently of one other is selected from linear or branched $(C_1\text{-}C_6)$alkyl, $(C_5\text{-}C_8)$cycloalkyl, $(C_6\text{-}C_{10})$aryl or $(C_7\text{-}C_{12})$aralkyl; or one of $R_8$ or $R_9$ taken together with one of $R_{10}$ or $R_{11}$ and the carbon atoms to which they are attached form a $(C_5\text{-}C_8)$cycloalkyl ring; and a third type of repeating unit represented by formula (IIIA) or (IIIB), said third type of repeating unit (IIIA) or (IIIB) is derived from a monomer of formula (III):

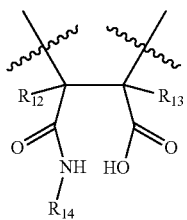
(IIIA)

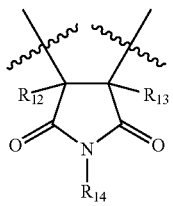
(IIIB)

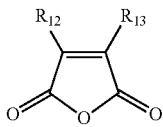
(III)

wherein:
$R_{12}$ and $R_{13}$ are each independently of one another represents hydrogen or linear or branched $(C_1\text{-}C_9)$alkyl or fluorinated or perfluorinated $(C_1\text{-}C_9)$alkyl;
$R_{14}$ is hydrogen, linear or branched $(C_1\text{-}C_{20})$alkyl, $(C_5\text{-}C_8)$cycloalkyl, $(C_6\text{-}C_{10})$aryl or $(C_7\text{-}C_{12})$aralkyl; and
wherein each of aforementioned groups, where valence is permissible, is optionally substituted with one or more groups selected from linear or branched $(C_1\text{-}C_6)$alkyl, $(C_3\text{-}C_7)$cycloalkyl, $(C_1\text{-}C_6)$perfluoroalkyl, $(C_1\text{-}C_6)$alkoxy, $(C_3\text{-}C_7)$cycloalkoxy, $(C_1\text{-}C_6)$perfluoroalkoxy, halogen, hydroxy, linear or branched hydroxy$(C_1\text{-}C_6)$alkyl, $(C_6\text{-}C_{10})$aryl or $(C_7\text{-}C_{12})$aralkyl.

It should be noted that polymer embodiments of this invention provides several advantages over polymers as disclosed in the aforementioned U.S. Pat. No. 8,715,900 B2. One of such advantages, among others, include reduced steps to make photosensitive formulations encompassing the polymers of this invention. For instance, various steps may have to be employed for forming the photosensitive formulations of the previously disclosed alcohol ring-opened maleic anhydride copolymers. Whereas the polymers of this invention are formed by a fewer steps that feature not only improved properties but are also cost effective. In addition, the processes to make polymers of this invention also involve steps that avoids introduction of any undesirable impurities such as alkali metals, acidification or multiple water-wash steps thus providing significant cost savings. It should be noted that these steps can increase trace metal, acid and water levels in the polymer as well as increasing the complexity and potential loss of yield with each step. In addition, the monomers utilized in making the polymers of this invention are generally derived from much cheaper monomers of formulae (I) or (II).

In general, the polymers of this invention can be made by any of the known methods in the art. For example, a non-limiting method of preparing the polymers of this invention involves first polymerizing one or more monomers of formula (I) with desired amounts of maleic anhydride monomer of formula (III), generally, under free radical polymerization conditions. During this step one or more monomers of formula (II) can also be employed. In the alternative a polymer derived from only one or more monomers of formula (II) with desired amounts of maleic anhydride monomer of formula (III) can also be made. The maleic anhydride repeat units of formula (IIIC) can be ring opened either partially or completely by subjecting to suitable reaction conditions to form repeat units of formula (IIIA), (IIIB), (IIID) or (IIIE) as described herein, which are called hereinafter as "ROMI" polymers (i.e., amine ring opened maleimide repeat unit containing polymers). Again, any of the polymerization methods can be employed to form the polymers of this invention. In general, the polymerization can be carried out either in solution using a desirable solvent or in mass, and in both instances, suitably in the presence of a catalyst or an initiator. Any of the known catalyst system which brings about the polymerization of the monomers of formula (III) with monomers of formula (I) or monomers of formula (II) or combination of monomers of formula (I) and (II).

Advantageously, it has now been found that polymers of this invention can be prepared by any of the known free radical polymerization procedures. Typically in a free radical polymerization process, the monomers are polymerized in a solvent at an elevated temperature (about 50° C. to about 150° C.) in the presence of a free radical initiator. Suitable initiators include but are not limited to azo compounds and peroxides. Non-limiting examples of azo compounds include azobisisobutyronitrile (AIBN), (E)-dimethyl 2,2'-(diazene-1,2-diyl)bis(2-methylpropanoate) (AMMP), (E)-2,2'-(diazene-1,2-diyl)bis(2,4-dimethylpentanenitrile (ADMPN), 1,1'-azobis(cyclohexanecarbonitrile) (ABCN), azobisisocapronitrile and azobisisovaleronitrile. Non-limiting examples of peroxides include hydrogen peroxide, tert-butylhydroperoxide, di-(tertiary)-butyl peroxide, benzoyl peroxide, lauryl peroxide, and methyl ethyl ketone peroxide. As noted, any of the other known initiators, including other azo compounds and peroxides can also be used in this polymerization process.

Suitable polymerization solvents for the aforementioned free radical polymerization reactions include hydrocarbon, haloalkane, ester ketone and aromatic solvents. Exemplary hydrocarbon solvents include but are not limited to alkanes and cycloalkanes such as pentane, hexane, heptane and cyclohexane. Exemplary haloalkane solvents include but or not limited to dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, 1-chloropentane, Freon™ 112 halocarbon solvent. Exemplary ester solvents include but not limited to ethyl acetate, propyl acetate, butyl acetate and propylene glycol methyl ether ester (PGMEA), and the like and/or mixtures thereof. Exemplary ketone solvents include but not limited to acetone, 2-butanone (i.e., methyl ethyl ketone, MEK) and 2-heptanone, and the like and/or mixtures thereof. Exemplary aromatic solvents include but are not limited to benzene, toluene, xylene, mesitylene, chlorobenzene, and o-dichlorobenzene. Other organic solvents such as diethyl ether, tetrahydrofuran, lactones, and amides are also useful. Mixtures of one or more of the foregoing solvents can be utilized as a polymerization solvent. In some embodiments the solvents employed include cyclohexane, toluene, mesitylene, dichloromethane and 1,2-dichloroethane.

As noted, the polymer as obtained above is then subjected to suitable reaction conditions to ring open the maleic anhydride repeat units of formula (IIIC) with an amine of formula $R_{14}NH_2$, where $R_{14}$ is as defined herein. Any of the known methods which would bring about such a ring opening can be employed in this method of the invention. Non-limiting examples of such ring opening reactions include reacting the polymer with a desirable amount of an amine or ammonia itself when $R_{14}$ is hydrogen, at suitable reaction temperature for a desired length of time. If ammonia is the intended reactant, any equivalent thereof such as any ammonium salt can also be employed, including ammonium acetate, and the like. Non-limiting examples of amines include ammonia, methylamine, ethylamine, n-propylamine, iso-propylamine, n-butylamine, iso-butylamine, tert-butylamine, pentylamine, n-hexylamine, n-heptylamine, n-octylamine, n-dodecylamine, n-hexadecylamine, n-octadecylamine, and the like. Typically such amination reactions can be carried out at ambient, sub-ambient or super-ambient temperatures for a period of several minutes to several hours so as to result in desired amount of amination of the maleic anhydride unit to form either the amic-acid of formula (IIIA) or imide of formula (IIIB) or amic acid salt of formula (IIIE).

The aforementioned ring opening reactions can be carried out using any of the known methods in the art. Typically, such reactions are carried out in a suitable solvent or a mixture of solvents. Non-limiting examples of solvents include tetrahydrofuran (THF), acetonitrile, dimethylacetamide (DMAc), dimethyl sulfoxide (DMSO), N-methylpyrrolidone (NMP), ethyl acetate, methyl ethyl ketone (MEK), toluene, hexane, water, propylene glycol methyl ether acetate (PGMEA), γ-butyrolactone (GBL) and mixtures in any combination thereof. The reaction can be carried out at suitable temperature including ambient, sub-ambient and super-ambient conditions. Typically, the reaction temperature employed is in the range of about 20 to 120° C. and in certain embodiments the temperature can be in the range of 25 to 90° C. and in some other embodiments it can be in the range of 40 to 70° C. The reaction times can vary depending upon the type of polymers and the amine that is being reacted but can generally range from a period of from about 1 to 24 hours.

It should further be noted that the ring opening of maleic anhydride units of formula (IIIC) to form various species of formulae (IIIA), (IIIB), (IIID) or (IIIE) can also be controlled either during the formation of the polymer or during the use of such polymers in the compositions/formulations of this invention as further described herein. That is to say that the compositions of this invention can be tailored to obtain the desirable dissolution rate (DR) modification step to obtain desirable dissolution rate contrast of the exposed and unexposed regions of the film, this aspect becomes evident from the detailed discussions that follows and from the particular examples as specifically provided herein.

The ROMI polymers so formed in accordance with this invention, depending upon contacting with such aforementioned reagents will cause either complete or partial ring open of the maleic anhydride repeating units to form a repeat unit of formula (IIIA), (IIIB), (IIIE). Thus, such ROMI polymers may have a randomly ordered repeat units of formula (IA), (IIA) and (IIIA), (IIIB), (IIIE). Scheme I illustrates the ring opening pathway of an anhydride repeat units of formula (IIIC) to various other forms depending upon the reaction conditions and the type of polymers employed to form various ROMI polymers of this invention.

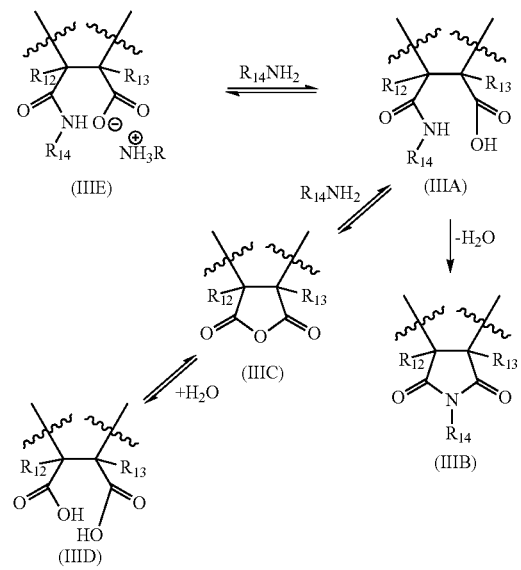

Scheme I

In Scheme I, in formulae (IIIA) through (IIIE) $R_{12}$, $R_{13}$ and $R_{14}$ are as defined herein. In Scheme I, the polymers formed from the polymerization of various monomers of formulae (I) and/or (II) with maleic anhydride of formula (III), i.e., the polymers containing the repeat units of formula (IIIC) are treated with a suitable amine of formula $R_{14}NH_2$, where $R_{14}$ is as defined herein. As noted above, such reactions are generally carried out at ambient temperature or subjecting the appropriate reactants to certain desirable reaction temperature to form polymers having at least some portions of the repeat units of formula (IIIC) converted to repeat units of formula (IIIA). The polymers containing such repeat units of formula (IIIA) are further converted to polymers containing repeat units of formula (IIIB) or (IIIE). In addition, it is also contemplated that under such conditions portions of such repeat units are also converted to repeat units of formula (IIID). All of these transformations can be readily monitored by any of the known techniques in the art, such as for example, infrared spectroscopy. However, any of the other suitable techniques can be used to monitor the rate of formation of various different types of repeat units of formula (IIIA), (IIIB), (IIID) or (IIIE). It should further be noted that depending upon the reactions conditions employed, i.e., temperature and time of the reaction it is possible to control various ratios of the desired repeat units in the final polymer.

Accordingly, in some embodiments, the polymer of this invention encompasses a third type of repeat unit represented by formula (IIIC) derived from the monomer of formula (III):

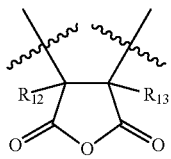

(IIIC)

wherein $R_{12}$ and $R_{13}$ are as defined herein.

In some other embodiments, the polymer of this invention encompasses a third type of repeat unit represented by formula (IIID) derived from the monomer of formula (III):

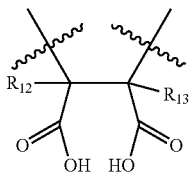

(IIID)

wherein $R_{12}$ and $R_{13}$ are as defined herein.

In yet some other embodiments, the polymer of this invention encompasses a third type of repeat unit represented by formula (IIIE) derived from the monomer of formula (III):

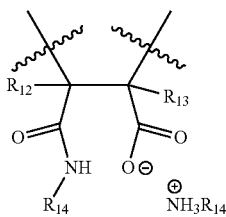

(IIIE)

wherein $R_{12}$, $R_{13}$ and $R_{14}$ are as defined herein.

In another embodiment of this invention the polymer of this invention encompasses one or more distinctive types of repeat units of formula (IA) derived from respective monomers of formula (I), where X=CH$_2$, m=0, $R_1$, $R_2$, $R_3$ and $R_4$ independently represents hydrogen, hexyl, decyl, oxiranyl-CH$_2$OCH$_2$—, di(C$_1$-C$_2$)alkylmaleimide(C$_3$-C$_6$)alkyl, di(C$_1$-C$_2$)alkylmaleimide(C$_2$-C$_6$)alkoxy(C$_1$-C$_2$)alkyl or a group of formula (A):

—(CH$_2$)$_a$—(OCH$_2$—CH$_2$)$_b$—OR (A)

Wherein a is 1 or 2; b is 2 or 3; and R is methyl, ethyl, n-propyl or n-butyl.

Again, as noted above, various olefinic monomers of formula (II) can be employed to prepare the polymers of this invention. Thus, in some embodiments, the polymer of this invention encompasses one or more distinctive types of repeat units derived from respective monomers of formula (II) wherein: $R_8$, $R_9$, $R_{10}$ and $R_{11}$ are the same or different and each independently of one another is selected from hydrogen, methyl, ethyl, n-propyl, n-butyl, iso-butyl, tert-butyl, n-pentyl, iso-pentyl, neo-pentyl, phenyl, trimethylsilyl and triethylsilyl; or $R_8$ and $R_{10}$ are the same or different and each independently of one another is selected from hydrogen, methyl or ethyl; and $R_9$ taken together with $R_{11}$ and the carbon atoms to which they are attached form cyclohexyl, cycloheptyl or cyclooctyl ring. Representative examples of such cyclic olefins include without any limitation cyclopentene, cyclohexene, 1-methylcyclohex-1-ene, 3-methylcyclohex-1-ene, cycloheptene, cyclooctene, 1-ethylcyclohept-1-ene, 1-butylcyclooct-4-ene, and the like.

Various maleic anhydride-type monomers of formula (III), including maleic anhydride itself can be employed to make the polymers of this invention. Accordingly, in some embodiments, the polymer of this invention encompasses one or more distinctive types of repeat units of formula (IIIA), (IIIB), (IIIC), (IIID) and (IIIE) wherein: $R_{12}$ and $R_{13}$ are the same or different and each independently of one another is selected from hydrogen, methyl or ethyl; and $R_{14}$ is (C$_4$-C$_{18}$) alkyl. Exemplary amines that can be used to make the ROMI polymers of this invention include without any limitation n-butylamine, n-heptylamine, n-octylamine, n-dodecylamine, n-hexadecylamine, n-octadecylamine, and the like.

As noted, it is not necessary that only one type of monomer of formula (I) is employed to make a polymer containing a repeat unit of formula (IA). In fact, one or more monomers of formula (I) can be employed. Thus in some embodiments the polymer of this invention encompasses one or more first type of repeating units of formula (IA) derived from the respective monomers of formula (I). Accordingly, in some embodiments there is only one repeat unit of formula (IA), in some other embodiments there are at least two distinctive repeat units of formula (IA) and in some other embodiments there are three or more distinctive types of repeat units of formula (IA). In each case such repeat units are derived from the corresponding monomers of formula (I).

It should be further noted similarly that more than one type of monomer of formula (II) can be employed to make a polymer containing corresponding repeat units of formula (IIA). Thus, one or more monomers of formula (II) can be employed. Accordingly, in some embodiments, the polymer of this invention encompasses one or more second type of repeating units of formula (IIA) derived from the respective monomers of formula (II). Accordingly, in some embodiments there is only one repeat unit of formula (IIA), in some other embodiments there are at least two distinctive repeat units of formula (IIA) and in some other embodiments there are three or more distinctive repeat units of formula (IIA). In each case such repeat units are derived from the corresponding monomers of formula (II).

Furthermore, as noted above, various ratios of different monomers can be employed to make the polymers of this invention. As already noted above, depending upon the nature of the monomers and their respective amounts employed, the resulting polymer may feature alternating monomeric repeat units or they can be randomly ordered. Accordingly, in some embodiments, the polymer of this invention encompasses 0 to 75 mole percent of first type of repeating units, 0 to 90 mole percent of second type of repeating units and 10 to 60 mole percent of third type of repeating units.

That is to say, in some embodiments, the polymer of this invention may contain only one or more repeating units of formula (IA) in combination with one or more repeat units of formula (IIIA), (IIIB), (IIIC), (IIID) or (IIIE). In such embodiments, the molar amount of repeat units of formula (IA) may be from 10 mole percent to 80 mole percent and the combined mole percent of repeat units of formula (IIIA) to (IIIE) may be from 20 to 90 mole percent, however, any other suitable mole percent of each of the repeat units that result in a polymer of this invention is also part of this invention. In some embodiments the mole percent of repeat units of formula (IA) and the combined mole percent of repeat units of formula (IIIA) through (IIIE) are each 50 mole percent. In some of these embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared (IR) or nuclear magnetic resonance (NMR) spectroscopic techniques, among other techniques.

In some other embodiments, the polymer of this invention may contain only one or more repeating units of formula (IIA) in combination with one or more repeat units of formula (IIIA), (IIIB), (IIIC), (IIID) or (IIIE). In such embodiments, the molar amount of repeat units of formula (IIA) may be from 20 mole percent to 80 mole percent and the combined mole percent of repeat units of formula (IIIA) to (IIIE) may be from 20 to 80 mole percent, however, any other suitable mole percent of each of the repeat units that result in a polymer of this invention is also part of this invention. In some of these embodiments the mole percent of repeat units of formula (IIA) and the combined mole percent of repeat units of formula (IIIA) through (IIIE) are each 50 mole percent. In some embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared spectroscopic techniques.

Finally, in some embodiments, the polymer of this invention contains both repeating units of formula (IA) and (IIA) in combination with one or more repeat units of formula (IIIA), (IIIB), (IIIC), (IIID) or (IIIE). In such embodiments, the molar amount of repeat units of formula (IA) may be from 5 mole percent to 40 mole percent, the molar amount of repeat units of formula (IIA) may be from 5 mole percent to 40 mole percent, and the combined mole percent of repeat units of formula (IIIA) to (IIIE) may be from 20 to 90 mole percent, however, any other suitable mole percent of each of the repeat units that result in a polymer of this invention is also part of this invention. In some embodiments the combined mole percent of repeat units of formula (IA) and (IIA), and the combined mole percent of repeat units of formula (IIIA) through (IIIE) are each 50 mole percent. In some embodiments the individual mole percent of repeat units of formula (IIIE) can be from 25 to 30 mole percent based on the total mole percent of (IIIA) through (IIIE). The mole percent of repeat unit of formula (IIID) can range from 5 mole percent to 10 mole percent and in some other embodiments it is less than 5 mole percent. Similarly, the mole percent of repeat unit of formula (IIIE) can range from 5 mole percent to 10 mole percent and in some other embodiments it is less than 5 mole percent. As noted again the mole percent of each of the repeat units of formula (IIIA) through (IIIE) can be determined by any of the known methods in the art, for example, by infrared spectroscopic techniques.

Any of the monomers of formula (I) can be employed to form the polymers of this invention. Non-limiting exemplary monomers that can be used to form the first type of repeating units in the polymers of this invention can be enumerated as follows:

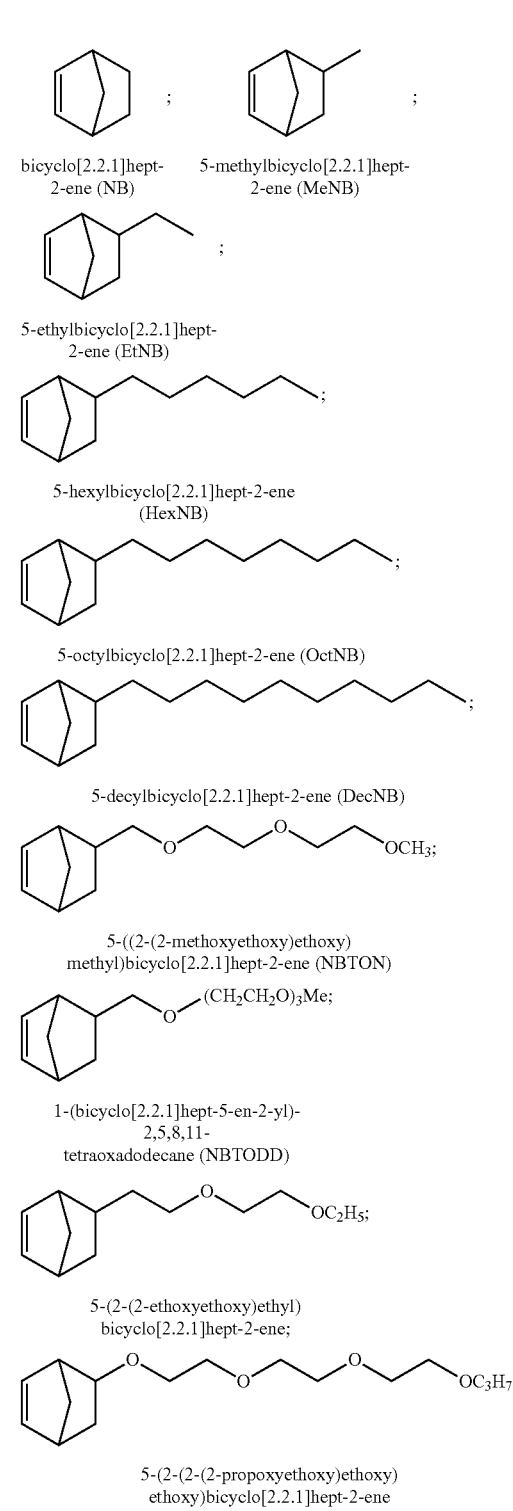

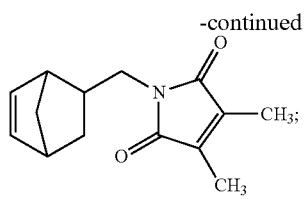

1-(bicyclo[2.2.1]hept-5-en-2-ylmethyl)-3,4-dimethyl-1H-pyrrole-2,5-dione (MeDMMINB)

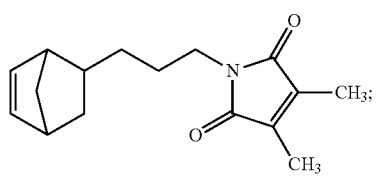

1-(3-(bicyclo[2.2.1]hept-5-en-2-yl)propyl)-3,4-dimethyl-1H-pyrrole-2,5-dione (PrDMMINB)

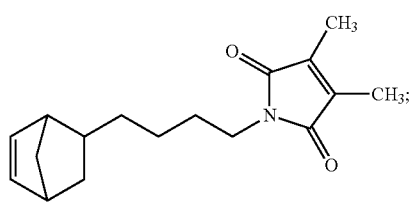

1-(4-(bicyclo[2.2.1]hept-5-en-2-yl)butyl)-3,4-dimethyl-1H-pyrrole-2,5-dione (BuDMMINB)

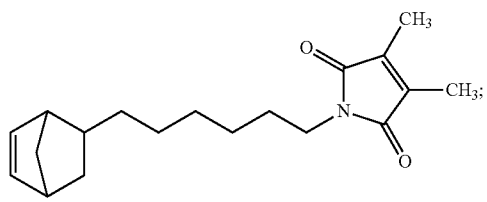

1-(6-(bicyclo[2.2.1]hept-5-en-2-yl)hexyl)-3,4-dimethyl-1H-pyrrole-2,5-dione (HexDMMINB)

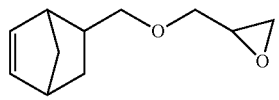

2-((bicyclo[2.2.1]hept-5-en-2-ylmethoxy)methyl)oxirane (MGENB);

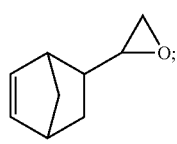

2-(bicyclo[2.2.1]hept-5-en-2-yl)oxirane

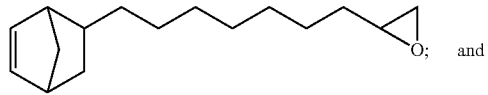

2-(7-(bicyclo[2.2.1]hept-5-en-2-yl)heptyl)oxirane

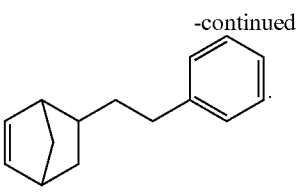

5-phenethylbicyclo[2.2.1]hept-2-ene (PENB)

Any of the monomers of formula (II) can be employed to form the polymers of this invention. Non-limiting exemplary monomers that can be used to form the second type of repeating units in the polymers of this invention can be enumerated as follows:
2-methylprop-1-ene;
2-methylpent-1-ene;
2,4,4-trimethylpent-1-ene;
2,4,4-trimethylpent-2-ene;
trimethyl(vinyl)silane; and styrene.

Turning now to the third type of repeating unit to form the polymer of this invention it is contemplated that any maleic anhydride derivative of formula (III) can be used as a monomer, including maleic anhydride itself. Exemplary monomers of such type include but not limited to the following:

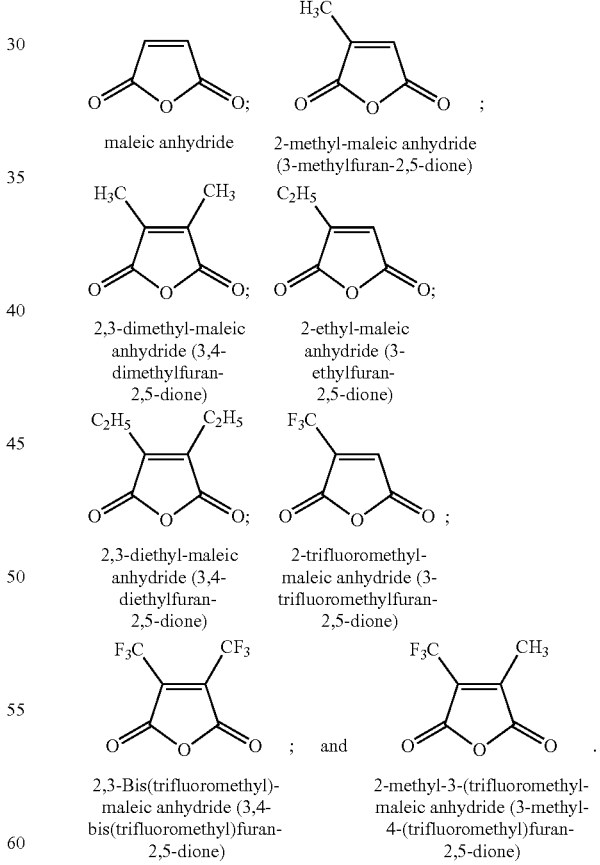

maleic anhydride 2-methyl-maleic anhydride (3-methylfuran-2,5-dione)

2,3-dimethyl-maleic anhydride (3,4-dimethylfuran-2,5-dione)

2-ethyl-maleic anhydride (3-ethylfuran-2,5-dione)

2,3-diethyl-maleic anhydride (3,4-diethylfuran-2,5-dione)

2-trifluoromethyl-maleic anhydride (3-trifluoromethylfuran-2,5-dione)

2,3-Bis(trifluoromethyl)-maleic anhydride (3,4-bis(trifluoromethyl)furan-2,5-dione)

2-methyl-3-(trifluoromethyl)-maleic anhydride (3-methyl-4-(trifluoromethyl)furan-2,5-dione)

Thus in accordance with another aspect of the embodiment of this invention, the combined amounts of the third type of repeat unit of formula (IIIA) through (IIIE), all of which are derived from the maleic anhydride type monomer of formula (III) is in the order of from about 1 mole percent to about 100 mole percent; in some other embodiments it is from about 20 mole percent to about 80 mole percent; in some other embodiments it is from about 40 mole percent to about 60 mole percent; and in some other embodiments it is from about 45 mole percent to about 55 mole percent. Further, as noted above, the specific amounts of repeat units of formula (IIIA) through (IIIE) depends upon various factors and depends upon the reaction conditions under which the polymer is subjected to as summarized in Scheme 1.

Advantageously, it has now been found that certain molar ratios of the repeat units of formulae (IIIA) thru (IIIE) may influence the properties of the compositions made therefrom for forming the photopatterned film layers of this invention as further described in detail below. Accordingly, in some embodiments the polymer of this invention contains at least about 1 mole percent of the repeat units of formula (IIIA) based on the total mole percent of the repeat units derived from monomer of formula (III), i.e., total mole percent of (IIIA) through (IIIE), in some other embodiments the mole percent of repeat units of formula (IIIA) is at least about 3% and in some other embodiments it is about at least 5%. In some other embodiments the mole percent of repeat units of formula (IIIA) can be in the range from about 1 to 60% or higher, 5 to 50%, 10 to 40%.

Similarly, in some other embodiments the polymer of this invention contains at least about 1 mole percent of the repeat units of formula (IIIB) based on the total mole percent of the repeat units derived from monomer of formula (III), i.e., total mole percent of (IIIA) through (IIIE), in some other embodiments the mole percent of repeat units of formula (IIIB) is at least about 2% and in some other embodiments it is about at least 5%. In some other embodiments the mole percent of repeat units of formula (IIIB) can be in the range from about 1 to 30% or higher, 2 to 25%, 5 to 20%.

In some other embodiments the polymer of this invention contains at least about 1 mole percent of the repeat units of formula (IIIC) based on the total mole percent of the repeat units derived from monomer of formula (III), i.e., total mole percent of (IIIA) through (IIIE), in some other embodiments the mole percent of repeat units of formula (IIIC) is at least about 2% and in some other embodiments it is about at least 5%. In some other embodiments the mole percent of repeat units of formula (IIIB) can be in the range from about 1 to 30% or higher, 2 to 25%, 5 to 20%.

Finally, in some other embodiments any desirable amounts of the repeat units of formula (IIID) and (IIIE) can be present which can generally range from about 0% to 20% each, again based on the total mole percent of (IIIA) through (IIIE).

The ROMI polymers formed according to this invention generally exhibit a weight average molecular weight ($M_w$) of at least about 2,000. In another embodiment, the polymer of this invention has a $M_w$ of at least about 6,000. In yet another embodiment, the polymer of this invention has a $M_w$ of at least about 10,000. In some other embodiments, the polymer of this invention has a $M_w$ of at least about 25,000. The weight average molecular weight ($M_w$) of the polymers can be determined by any of the known techniques, such as for example, by gel permeation chromatography (GPC) using polystyrene standards.

Polymer Compositions/Applications

In another aspect of this invention there is also provided a photoimageable composition comprising:

a polymer containing:
a first type of repeating unit represented by formula (IA), said first type of repeating unit is derived from a monomer of formula (I):

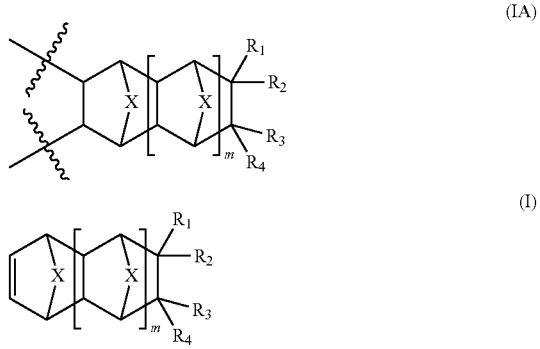

wherein:
m is an integer 0, 1 or 2;
X is $CH_2$, $CH_2-CH_2$, O or $NR_a$ where $R_a$ is linear or branched $(C_1-C_6)$alkyl;
$R_1$, $R_2$, $R_3$ and $R_4$ independently represents hydrogen, linear or branched $(C_1-C_{16})$alkyl, hydroxy$(C_1-C_{16})$alkyl, perfluoro $(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$ alkyl, perfluoro$(C_6-C_{10})$aryl, perfluoro$(C_6-C_{10})$aryl$(C_1-C_3)$ alkyl, di$(C_1-C_2)$alkylmaleimide$(C_3-C_6)$alkyl, di$(C_1-C_2)$alkylmaleimide$(C_2-C_6)$alkoxy$(C_1-C_2)$alkyl, hydroxy, $(C_1-C_{12})$ alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl, $(C_5-C_{10})$ heteroaryloxy$(C_1-C_3)$alkyl, $(C_6-C_{10})$aryloxy, $(C_5-C_{10})$ heteroaryloxy, $(C_1-C_6)$acyloxy, oxiranyl$(C_0-C_8)$alkyl, oxiranyl$(CH_2)_aO(CH_2)_b$—, halogen or a group of formula (A):

$$-(CH_2)_a-(OCH_2-CH_2)_b-OR \qquad (A)$$

wherein:
a is an integer 0, 1, 2, 3 or 4;
b is an integer 0, 1, 2, 3 or 4; and
R is linear or branched $(C_1-C_6)$alkyl, $(C_5-C_8)$cycloalkyl, $(C_6-C_{10})$aryl or $(C_7-C_{12})$aralkyl;
and/or
a second type of repeating unit represented by formula (IIA), said second type of repeating unit is derived from a monomer of formula (II):

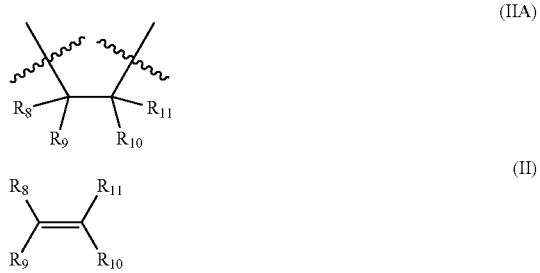

wherein
$R_5$, $R_9$, $R_{10}$ and $R_{11}$ are the same or different and each independently of one another is selected from hydrogen, linear or branched (C$_1$-C$_6$)alkyl, (C$_5$-C$_8$)cycloalkyl, (C$_6$-C$_{10}$)aryl or (C$_7$-C$_{12}$)aralkyl or a group of formula (B):

—SiR$_5$R$_6$R$_7$     (B)

wherein:

R$_5$, R$_6$, and R$_7$ are the same or different and each independently of one other is selected from linear or branched (C$_1$-C$_6$)alkyl, (C$_5$-C$_8$)cycloalkyl, (C$_6$-C$_{10}$)aryl or (C$_7$-C$_{12}$)aralkyl; or one of R$_8$ or R$_9$ taken together with one of R$_{10}$ or R$_{11}$ and the carbon atoms to which they are attached form a (C$_5$-C$_8$)cycloalkyl ring; and a third type of repeating unit represented by formula (IIIA) or (IIIB), said third type of repeating unit (IIIA) or (IIIB) is derived from a monomer of formula (III):

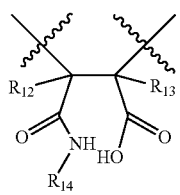     (IIIA)

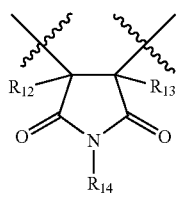     (IIIB)

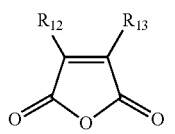     (III)

wherein:

R$_{12}$ and R$_{13}$ are each independently of one another represents hydrogen or linear or branched (C$_1$-C$_9$)alkyl or fluorinated or perfluorinated (C$_1$-C$_9$)alkyl;

R$_{14}$ is hydrogen, linear or branched (C$_1$-C$_{20}$)alkyl, (C$_5$-C$_8$)cycloalkyl, (C$_6$-C$_{10}$)aryl or (C$_7$-C$_{12}$)aralkyl; and wherein each of aforementioned groups, where valence is permissible, is optionally substituted with one or more groups selected from linear or branched (C$_1$-C$_6$)alkyl, (C$_3$-C$_7$)cycloalkyl, (C$_1$-C$_6$)perfluoroalkyl, (C$_1$-C$_6$)alkoxy, (C$_3$-C$_7$)cycloalkoxy, (C$_1$-C$_6$)perfluoroalkoxy, halogen, hydroxy, linear or branched hydroxy(C$_1$-C$_6$)alkyl, (C$_6$-C$_{10}$)aryl or (C$_7$-C$_{12}$)aralkyl;

a photoactive compound containing a diazo functional moiety; and a carrier solvent.

All of the polymers as described herein can be used in the photoimageable or photosensitive compositions of this invention. In some embodiments in accordance with the present invention the photosensitive polymer compositions contain co-, ter- or tetra-polymers encompassing one or more norbornene-type repeating units of formula (IA), one or more other repeat units of formula (IIA) derived from various olefinic monomers as described herein, and one or more repeating units of formula (IIIA), (IIIB), (IIIC), (IIID) or (IIIE) derived from maleic anhydride-type monomers as described hereinabove and hereafter. Such polymer compositions may further contain a photo active compound (PAC), optionally an epoxy resin and a solvent. Further, such compositions are capable of forming films useful as self-imageable layers in the manufacture of microelectronic and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as low-K dielectric layers, including interlevel dielectrics, in liquid crystal displays or in microelectronic devices. Further, the embodiments as described fully herein can routinely provide films of 3 microns (µm) thickness or greater and images demonstrating aspect ratios in excess of 1:2 for isolated line/trench resolution in such films. Thus the films, layers, and structures formed from the polymer embodiments of the present invention are further useful for, among other things mentioned above, redistribution layers, stress buffer layers, leveling or planarization layers, alpha-particle barriers for both microelectronic and optoelectronic devices and the assemblies formed thereof, as well as adhesive bonding to form chip-stacks and to fixably attach transparent covers over image sensing arrays. It will be noted that such examples are only a few of the many uses for such a self-imageable film, and such examples do not serve to limit the scope of such films or the polymers and polymer compositions that are used to form them.

Advantageously, it has now been found that such polymer compositions containing one or more norbornene-type repeat units of formula (IA) and/or one or more of olefinic repeat units of formula (IIA) and one or more of maleic anhydride derived repeat units of formula (IIIA) through (IIIE) provide several desirable properties. For instance, the maleimide-type pendent group containing repeat units of formula (IA), if present, may offer unique advantage of being both positive tone as well as negative tone image-wise photo-patterning of the films of this invention. In a negative tone photo-patterning the polymer composition may not need any of the other cross-linkers, such as multi-functional epoxy cross-linkers and/or photoactive compounds. That is to say, the "negative tone" photo imaging can be carried out exploiting the photo-curing ability of the "maleimide" functionality.

It should be noted that when the composition of this invention is intended to be a "negative tone" formulation, the polymer may additionally contain epoxy, hydroxy and/or such similar functional groups as pendent groups which are available for cross-linking with other ingredients in the formulation. For example, any of the monomers of formula (I) having such functional groups as DMMI, oxirane, hydroxy, and the like are useful in forming the negative tone formulations of this invention. Typically, such negative tone formulations also contain photoacid generators (PAGs) that would bring about the cross-linking of the polymer composition when exposed to suitable radiation thus rendering exposed regions of the polymer film insoluble in the developing solvent.

Any of the PAGs known to one skilled in the art which would bring about the above noted result can be employed in this invention. Broadly speaking, the PAG that can be employed in this invention is a nucleophilic halogenide (e.g., diphenyliodonium salt, diphenylfluoronium salt) and complex metal halide anions (e.g., triphenylsulfonium salts). Exemplary PAGs without any limitation include, tetrakis (pentafluorophenyl)borate-4-methylphenyl[4-(1-methylethyl)phenyl iodonium (DPI-TPFPB), tris(4-tert-butyl)phenyl)sulfonium tetrakis-(pentafluorophenyl)borate (TTBPS-TPFPB), tris(4-tert-butyl)phenyl)sulfonium hexafluorophosphate (TTBPS-HFP), triphenylsulfonium triflate (TPS-Tf); triazine (TAZ-101); triphenylsulfonium hexafluoroantimonate (TPS-103); RHODOSIL™ Photoinitiator 2074 (FABA); triphenylsulfonium bis(perfluoromethanesulfonyl)imide (TPS-N1); di-(p-t-butyl)phenyliodonium bis(perfluoromethanesulfonyl)imide (DTBPI-N1); tris(perfluoromethanesulfonyl)methide (TPS-C1); di-(p-t-butylphenyl)iodonium tris(perfluoromethanesulfonyl)methide (DTBPI-C1); diphenyliodonium hexafluorophosphate, diphenyliodonium hexafluorostibate, bis(4-(tert-butyl)phenyl)iodonium hexafluorophosphate, bis(4-(tert-butyl)phenyl)iodonium hexafluorostibate (DTBPI-Tf), diphenyliodonium trifluoromethanesulfonate, diphenyliodonium 1,1,2,2,3,3,4,4,4-nonafluorobutane-1-sulfonate; bis(4-(tert-butyl)phenyl)iodonium trifluoromethanesulfonate; bis(4-(tert-butyl)phenyl)iodonium 1,1,2,2,3,3,4,4,4-nonafluorobutane-1-sulfonate; and combinations thereof.

Advantageously, as noted above, the compositions of this invention are also useful as "positive tone" photo-imaging by formulating differently with a suitable "photoactive compound" (PAC). By doing so, the photo curing effect of maleimide functionality, if present, is muted. That is to say, when maleimide type functional groups are present in the polymer, such as DMMI pendent groups, then PACs which are active at the wavelengths of radiation where DMMI functions are ineffective can be employed. Further, this can also be achieved by employing different sources of actinic radiation whereby only the PACs are active at those exposed wavelengths and/or at different exposure doses.

It has also been found that the polymer compositions of this invention provide several advantages in addition to being cost effective. Non-limiting examples of such additional advantages include for instance the compositions of this invention provide desirable dissolution rates (DR) when exposed to suitable radiation and developed thereafter. As used herein "DR" means the rate of film thickness loss when immersed or exposed to a suitable developer. Thus, for example, a dissolution rate of 100 nm/sec means that a film thickness of 100 nm is dissolved in a developer in one second. The developers can either be solvent based or aqueous based. Advantageously, it has now been found that the compositions of this invention can be developed using a variety of aqueous developers, such as for example, tetramethylammonium hydroxide (TMAH), among other aqueous developers. Generally, the compositions of this invention also feature desirable dark field loss (DFL) properties. As used herein, DFL means that the loss of film thickness of the unexposed regions of the film after "image-wise" exposure to a suitable radiation and development. It has now been found that the compositions of this invention feature very low DFL. In some embodiments, the compositions of this invention exhibit DFL of from about 2 percent to about 20 percent. In some other embodiments, the DFL is less than about 5 percent. That means that the loss of film thickness of the unexposed film regions is less than 5 percent. In addition, it has also been found that higher resolution of the images can be obtained from the compositions of this invention. In some embodiments, the resolution of images is as low as 5 µm and in some other embodiments the resolution of the images is about 10 µm. Among other advantageous properties it has also been observed that the compositions of this invention are readily curable after exposure to suitable radiation and developer. As a result, the resulting thermally cured film features certain desirable properties, for example, lower dielectric constant, among others.

Advantageously, it has also been found that the polymers of this invention exhibit excellent dissolution rate contrast (DR contrast) when used suitably in combination with the PAC. That is, the dissolution rate of the exposed regions are significantly different from that of the unexposed regions, thus providing high DR contrast, depending upon the type of polymer employed. The high DR contrast is desirable to obtain images of high resolution among various other advantages. Accordingly, in some embodiments of this invention there is provided a composition to obtain high dissolution rate contrast. In some other embodiments there is also provided a method of making compositions that are useful in forming images having low DFL.

It has also been found that the type of amine used to ring open the maleic anhydride repeat units tend to exhibit different DR properties. In general, it has now been found that the longer the alkyl chain employed, the resulting polymer exhibits low DR and thus good DR contrast. Accordingly, in some embodiments the $R_{14}$ maybe an alkyl group having higher than 8 carbon atoms, for example, linear or branched ($C_8$-$C_{20}$)alkyl. In some other embodiments the $R_{14}$ maybe an alkyl group having higher than 12 carbon atoms, for example, linear or branched ($C_{12}$-$C_{20}$)alkyl. In yet some other embodiments the $R_{14}$ maybe an alkyl group having higher than 16 carbon atoms, for example, linear or branched ($C_{16}$-$C_{20}$) alkyl.

Accordingly, in some embodiments the polymers of this invention exhibit a DR of at least 25 nm/sec when used in compositions of this invention as described herein. In some other embodiments the polymers encompassed in the compositions of this invention exhibit a DR in the range of from about 25 nm/sec to 300 nm/sec. As noted herein the desirable DR of a polymer encompassed in a composition depends upon the type of polymer employed and its dissolution properties. That is to say, when a polymer containing hydrophobic monomers are employed the DR of the composition formed therefrom can exhibit lower DR, such as for example, a DR of about 50 nm/sec. Whereas a composition formed from a polymer having hydrophilic functional group may exhibit a high DR of about 200 nm/sec. Therefore, all such polymers and compositions formed therefrom are within the scope of this invention.

In addition, it has also been observed that the films formed from the compositions of this invention also exhibit different properties when exposed to solvents. For example, generally it has been observed that the swelling of the film can be controlled by increasing the number of carbon atoms on the alkyl chain of the film. That is, higher the alkyl chain lower the swelling of the film.

Further, it has also been found that proper utilization of one or more monomers of formula (I), one or more monomers of formula (II) and one or more monomers of formula (III), and upon suitable ring opening and/or transformation of the maleic anhydride repeat units, it is now possible to form a polymer which can be formulated to form films having desirable properties. For instance, it has now been found that proper tailoring of the ratios of monomers utilized and the respective chemical structures of formulae (I), (II) or (III) it is possible to tailor a polymer having very low dielectric constant. In addition, various other additives, such as PACs or cross-linkers, can either be eliminated and/or reduced thus offering not only simplified formulations but also significant property advantages as well as cost savings. Most notable advantages being the compositions of this invention can be formulated into positive tone compositions which can be photo-cured with or without a cross-linker or a photo-sensitizer. Similarly, the compositions of this invention can be thermally cured with or without an epoxy cross-linker, thus offering lower dielectric constant photo and/or thermally cured films.

Non-limiting examples of suitable photoactive compounds (PACs) that can be employed in these photosensitive compositions encompass a photoactive group, such as, a diazo functional moiety, including but not limited to 1,2-naphthoquinonediazide-5-sulfonyl moiety of formula (IV), a 1,2-naphthoquinonediazide-4-sulfonyl moiety of the formula (V) or a 1,2-quinonediazide-4-sulfonyl moiety of the formula (VI):

(IV)
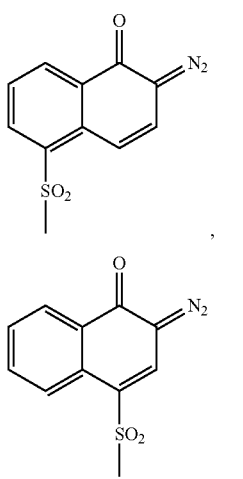
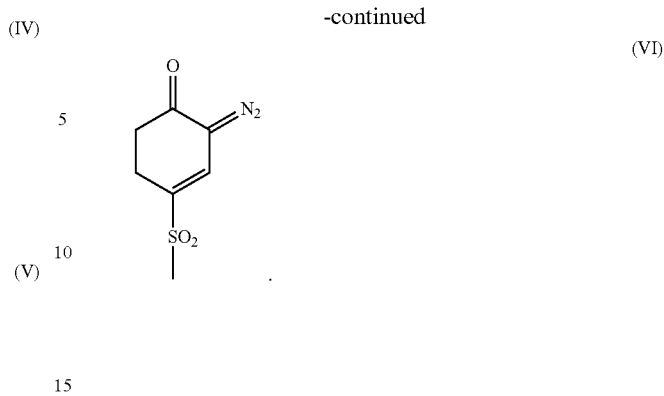
,
and
It should further be noted that any of the PACs that encompass above noted diazo functional moiety can be used in this invention. Exemplary PACs include without any limitation the following:
(VIIa)
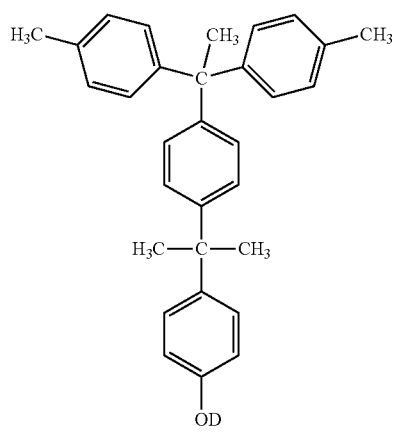
(VIIb)
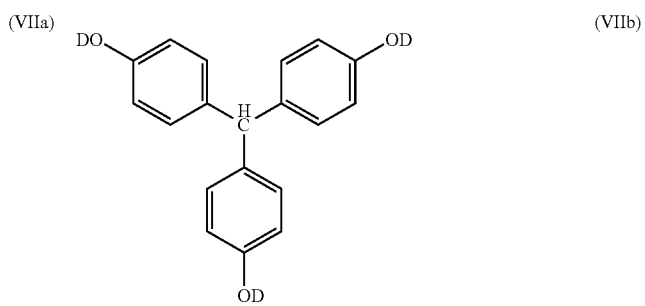
(VIIc)
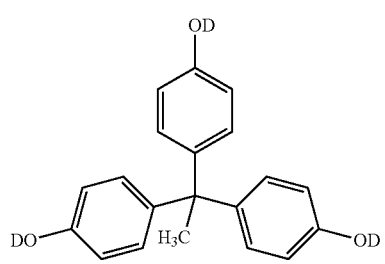
(VIId)
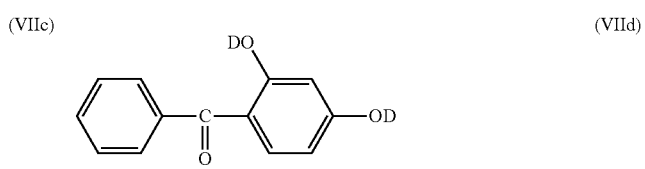
(VIIe)
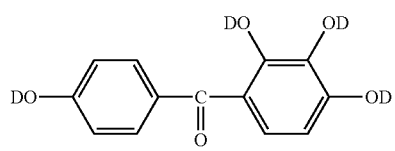
(VIIf)
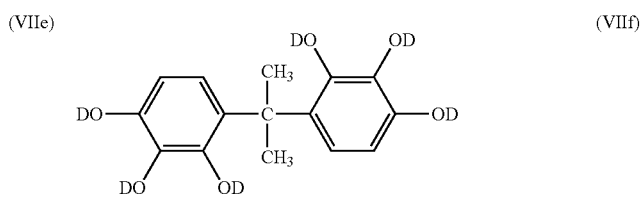
(VIIg)
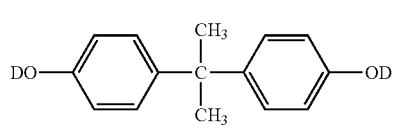
(VIIh)
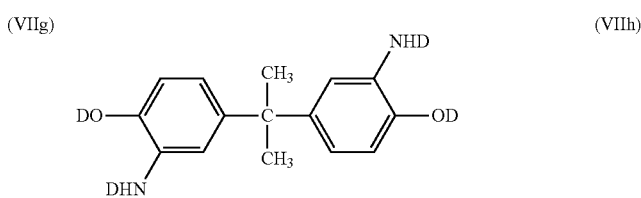

-continued
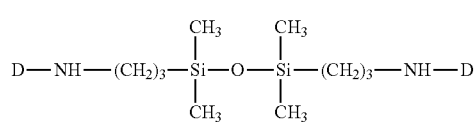
(VIIi)
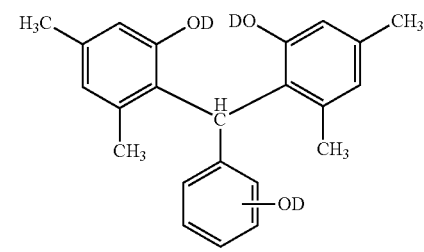
(VIIj)
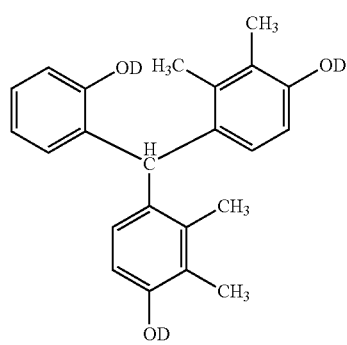
(VIIk)
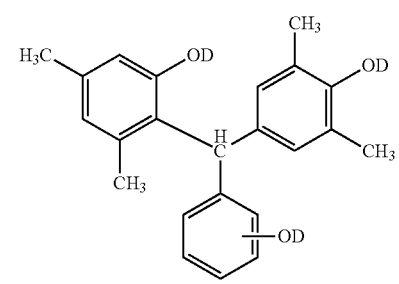
(VIIl)
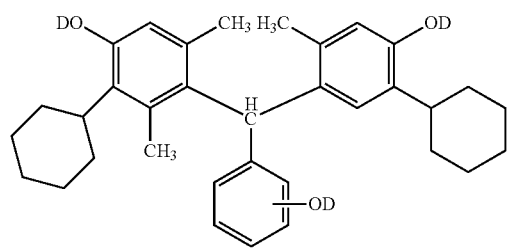
(VIIm)
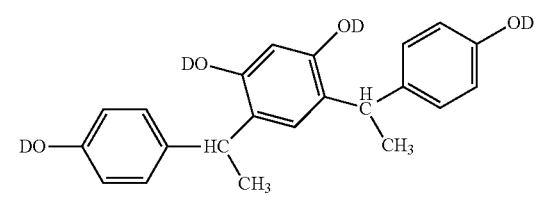
(VIIp)
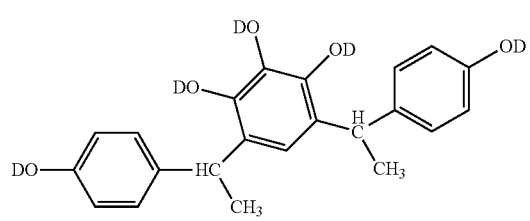
(VIIq)
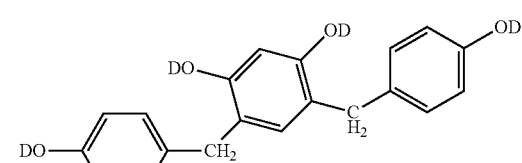
(VIIr)
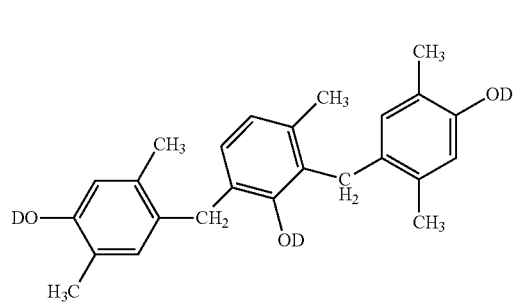
(VIIs)
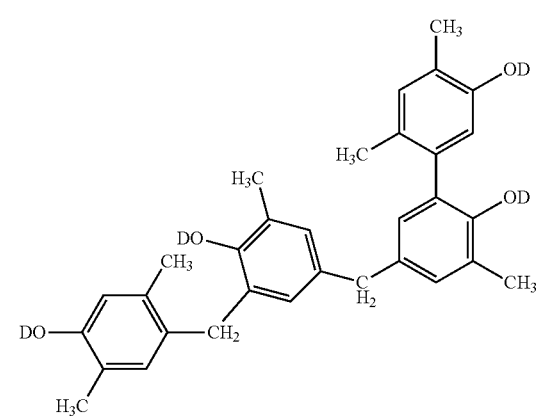
(VIIt)

-continued
(VIIu)
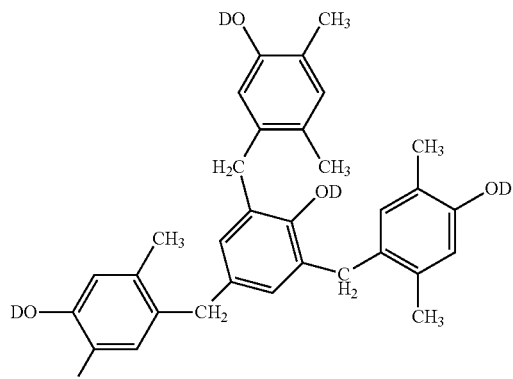
(VIIv)
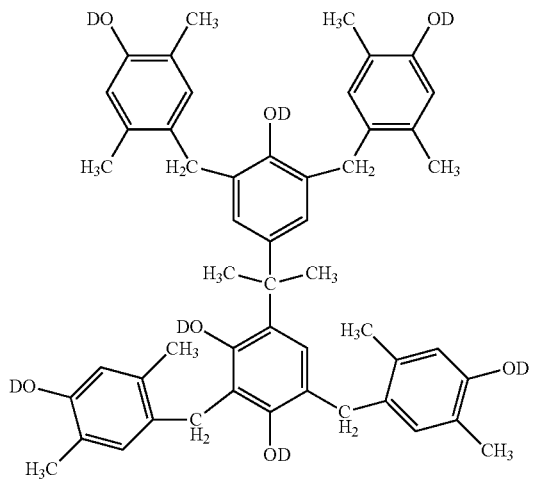
(VIIw)
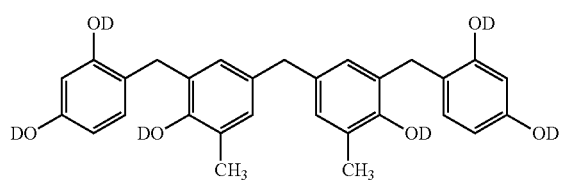
(VIIx)
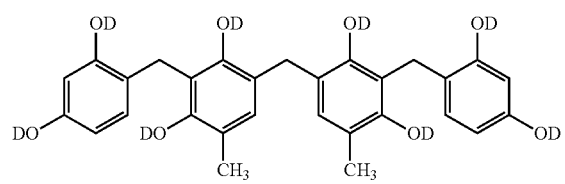
(VIIy)
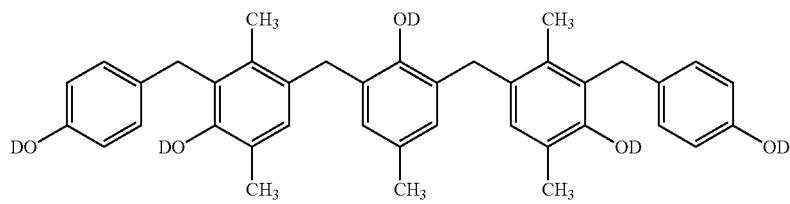
(VIIz)
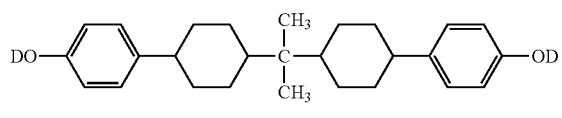
(VIIaa)
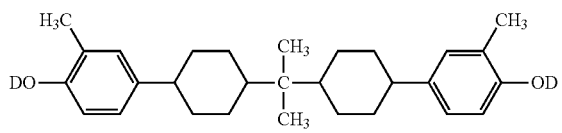
(VIIab)
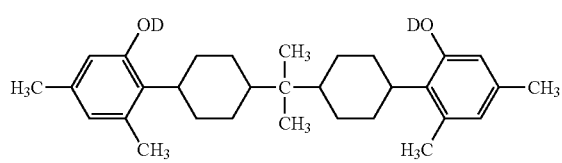
(VIIac)
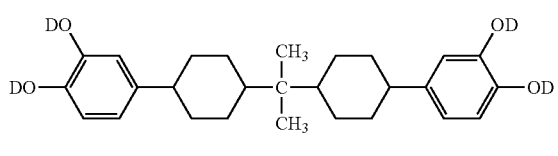
(VIIad)
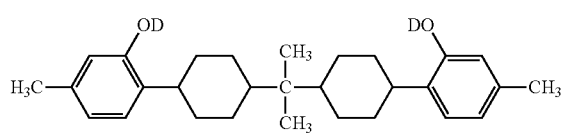
(VIIae)
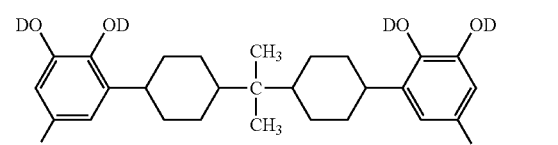

-continued

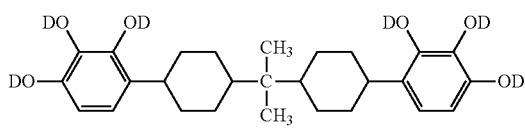
(VIIaf)

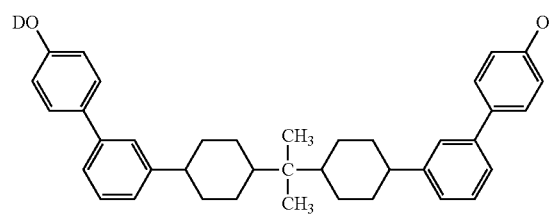
(VIIag)

Where at least one D is a diazo functional moiety of formula (IV), (V) or (VI) and the remainder Ds are hydrogen. That is to say at least one of D is a diazo functional moiety of formula (IV), (V) or (VI). However, it should be noted that certain of the PACs, including some commercially available PACs, contain only some portions of Ds replaced with hydrogen. That is, even if the PAC contains only one D, only some portions of D in such a PAC is replaced with a diazo functional moiety, such as for example only 50 percent of D is a diazo functional moiety. Similarly, if the PAC contains more than one D it is not necessary that whole portions of one or more D has to be replaced with a diazo functional group. For example, as further described below, certain of the commercially available PACs contain partial substitution of one or more of these diazo functional moieties. Various additional useful photoactive compounds are exemplified in U.S. Pat. No. 7,524,594 B2 columns 14-20, pertinent portions of which are incorporated herein by reference Generally the diazo functional groups of formulae (IV), (V) and/or (VI) are incorporated into the photosensitive composition as an esterification product of the respective sulfonyl chloride (or other reactive moiety) and a phenolic compound, such as one or more of the exemplary compounds enumerated herein collectively as structural formulae (VIIa) to (VIIag). Also exemplified herein are the sulfonamide analogs which are formed by the reaction of respective sulfonyl chlorides with an amine such as phenyl amine and/or various other amines, see for example structural formulae (VIIh) and (VIIi). Thus, any one, or any mixture of two or more of such esterification products (or amide products) are combined with the resin in forming the photosensitive resin compositions of the present invention. In the formulae (VII), D may represent any of the structures (IV), (V) or (VI). Such photoactive compounds (PACs) are known to undergo photo-rearrangement when subjected to actinic (or electromagnetic) radiation of suitable wavelength, such as for example 254, 365, 405, or 436 nm. Depending upon the nature of the PAC employed the wavelength of the radiation can be modified by employing suitable light source. Accordingly, when a portion of a film or a layer of the photosensitive composition is exposed to appropriate electromagnetic or actinic radiation, these diazo products undergo rearrangement to ultimately generate a carboxylic acid which enhances the solubility of such exposed portion in an aqueous alkali solution as compared to any unexposed portions of such film. Generally such photosensitive materials are incorporated into the composition in an amount from 1 to 50 parts per hundred parts by mass (pphr) of the polymer or resin as described herein. In some other embodiments such amount can range from 5 to 30 pphr. In yet other embodiments such amount can range from 10 to 20 pphr. It should further be noted that the specific ratio of the photosensitive material to resin employed is a function of the dissolution rate of exposed portions as compared to unexposed portions and the amount of radiation required to achieve a desired dissolution rate differential. That is, it is now possible to tailor a photosensitive composition based upon the type of polymer and the type of PAC employed, which results in optimal dissolution rate at a given dose of radiation and the frequency of such radiation employed, thereby achieving surprisingly high resolution photopatterns on a film exhibiting excellent chemical, mechanical, electrical and optoelectronic properties.

Several of the PACs enumerated as herein are commercially available. For example, PAC-5570 of formula (VIIc) (St. Jean Photochemicals Inc., Quebec, Canada), SCL6 of formula (VIId) (Secant Chemicals Inc., Winchendon, Mass., USA), Tris-P 3M6C-2-201 of formula (VIIo) (also referred to herein as TrisP), collectively TS-200, TS-250 and TS-300 of formula (VIIa), and 4NT-300 of formula (VIIe) (all from Toyo Gosei Co. Ltd., Chiba, Japan). It should be noted that for PACs of the types TS-200, TS-250 and TS-300, the degree of substitution of Ds also varies based on the product used. For instance, TS-200 is substituted with 67% of D, TS-250 is substituted with 83% of D, and TS-300 with 100% of D, the unsubstituted portion being hydrogen.

In some embodiments of this invention the following PACs are used:

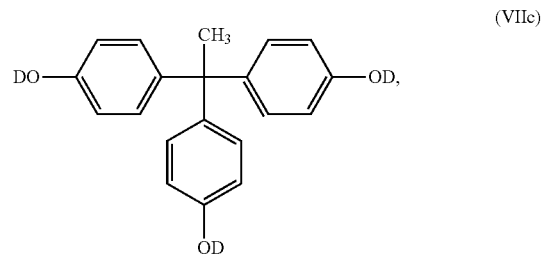
(VIIc)

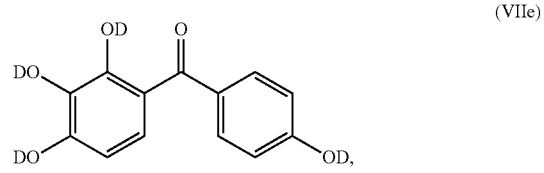
(VIIe)

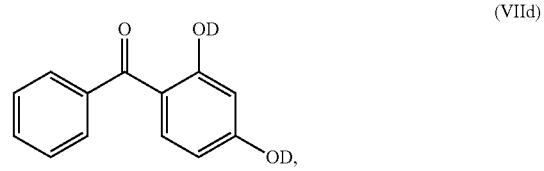
(VIId)

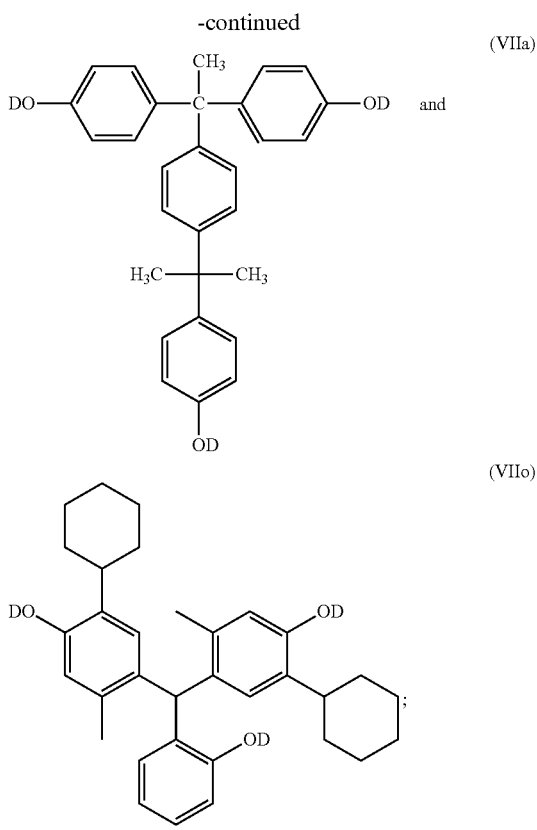

Wherein, as noted above, at least one D or a portion thereof is a diazo functional moiety of formula (IV), (V) or (VI) and the remainder Ds are hydrogen. In some of these embodiments at least some of the D is a diazo functional moiety of formula (IV) or (V) and the remainder Ds are hydrogen.

In another embodiment the PAC used is a compound of the formula (VIIp):

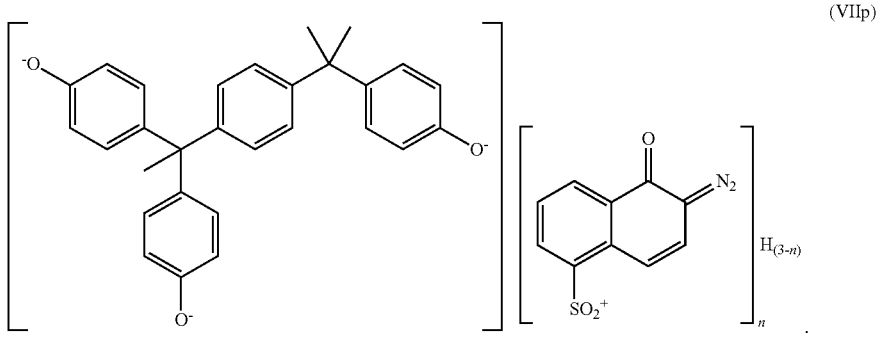

Where n can be 0, 1, 2 or 3. In some embodiments, the PAC used is a compound of the formula (VIIp) designated as PA-28, where n is 2.8.

It should further be noted that polymers as described herein may also be suitable for forming "negative tone" compositions. Accordingly, the amount of photo active compounds, such as PACs as described herein, incorporated into the polymer compositions depends upon the type of polymer used and to the type of exposure contemplated, i.e., "positive tone" or "negative tone" compositions. As already discussed above the amount of PAGs can vary and generally for "negative tone"

compositions it can range from about 0.1 to 20 parts by weight of the polymer and typically from about 0.5 to about 10 parts by weight, and in some embodiments from about 1 to 5 parts by weight, although other advantageous amounts of such materials are also appropriate and within the scope of the present invention. Generally, lesser amount of PAG is used in a "negative tone" composition, and can be optional, i.e., depending upon the type of polymer used there may not be a need to use any additional PAG in such compositions. However, for "positive tone" compositions the PAC is always used, as noted above, and the amount can range from about 1 to 50 pphr of the polymer and typically from about 5 to about 30 pphr. As used herein, "positive tone" compositions means that after "image-wise" exposure, the development process removes only the exposed portions of the film thus leaving a positive image of the masking layer in the film. For the "negative tone" compositions, such development process removes only unexposed portions of the film thus leaving a negative image of the masking layer in the film.

In another embodiment, the photosensitive compositions of this invention encompasses a polymer having a first type of repeating unit which is derived from a monomer without any limitation selected from the group consisting of:
bicyclo[2.2.1]hept-2-ene (NB);
5-methylbicyclo[2.2.1]hept-2-ene (MeNB);
5-ethylbicyclo[2.2.1]hept-2-ene (EtNB);
5-hexylbicyclo[2.2.1]hept-2-ene (HexNB);
5-octylbicyclo[2.2.1]hept-2-ene (OctNB);
5-decylbicyclo[2.2.1]hept-2-ene (DecNB);
5-((2-(2-methoxyethoxy)ethoxy)methyl)bicyclo[2.2.1]hept-2-ene (NBTON);
1-(bicyclo[2.2.1]hept-5-en-2-yl)-2,5,8,11-tetraoxadodecane (NBTODD);
1-(4-(bicyclo[2.2.1]hept-5-en-2-yl)butyl)-3,4-dimethyl-1H-pyrrole-2,5-dione (BuDMMINB);
2-((bicyclo[2.2.1]hept-5-en-2-ylmethoxy)methyl)oxirane (MGENB); and
5-phenethylbicyclo[2.2.1]hept-2-ene (PENB).

It should however be noted that any of the other known norbornene-type monomers can also be used in preparing the polymers of this invention which can be used in making the compositions of this invention.

In another embodiment, the composition of this invention encompasses a polymer having a second type of repeating unit which is derived from a monomer without any limitation selected from the group consisting of: 2-methylprop-1-ene; 2-methylpent-1-ene; 2,4,4-trimethylpent-1-ene; 2,4,4-trimethylpent-2-ene; trimethyl(vinyl)silane; and styrene.

In some embodiments the polymer used in the preparation of the composition of this invention is a copolymer of styrene and maleic anhydride which is then subjected to ring opening/transformation as described herein with a suitable amine such as n-butylamine, n-octylamine, n-dodecylamine, n-hexadecylamine or n-octadecylamine, and the like. In this embodiment the polymer can have any molar ratios of styrene and maleic anhydride. Typically, such styrene/maleic anhydride of various molar ratios are commercially available. For example, styrene:maleic anhydride molar ratios of 50:50, 67:33, and 75:25, and the like are commercially available.

The compositions of this invention can be prepared using any of the known carrier solvents, all such solvents are within the scope of this invention. Non-limiting exemplary one or more of such carrier solvents can be selected from the group consisting of: cyclohexanone, cyclopentanone, diethylene glycol dimethyl ether, propylene glycol monomethyl ether acetate (PGMEA), N-methyl-2-pyrrolidone (NMP), gamma-butyrolactone (GBL), N,N-dimethylacetamide, N,N-dimethylformamide, anisole, acetone, methyl 3-methoxypropionate and tetrahydrofuran (THF). Again, as noted above, as one of ordinary skill in the art readily appreciates, mixtures in any combination of two or more of these solvents can also be employed.

In one of the embodiments, the composition of this invention encompasses a carrier solvent which is selected from the group consisting of: propylene glycol monomethyl ether acetate (PGMEA), N-methyl-2-pyrrolidone (NMP), gamma-butyrolactone (GBL) and mixtures in any combination thereof.

The compositions of this invention further comprise one or more optional components including without any limitation cross-linking agents, and the like. Examples of such other optional components may include without any limitation one or more compounds/various additives such as surfactants, silane coupling agents, leveling agents, antioxidants, flame retardants, plasticizers, curing accelerators, sensitizer components, solvents, catalyst scavengers, adhesion promoters, stabilizers, reactive diluents and dissolution promoters.

Any of the cross-linking agents which brings about the cross-linking of the compositions of this invention after exposure of the film and developing can be used in this invention and are within the scope of this invention. For example, various epoxy compounds are useful as cross-linking agents. Exemplary epoxies and other cross-linking additives, include, but are not limited to, bisphenol A epoxy resin (LX-01, Daiso Chemical Co., Osaka, Japan), 2,2'-((((1-(4-(2-(4-(oxiran-2-ylmethoxy)phenyl)propan-2-yl)phenyl)ethane-1,1-diyl)bis(4,1-phenylene))bis(oxy))bis(methylene))bis (oxirane) (Techmore VG3101L, Mitsui Chemical Inc.), trimethylolpropane triglycidylether (TMPTGE-CVC Specialty Chemicals, Inc.), and 1,1,3,3,5,5-hexamethyl-1,5-bis(3-(oxiran-2-ylmethoxy)propyl)trisiloxane (DMS-E09, Gelest, Inc.)

In some embodiments the composition of this invention comprises one or more cross-linking agents which can be selected without any limitation from the group consisting of

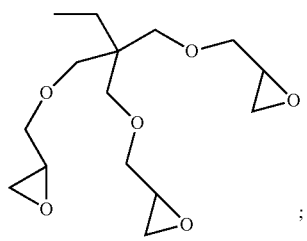

2,2'-(((2-ethyl-2-((oxiran-2-ylmethoxy)methyl)propane-1,3-diyl)bis(oxy))-bis(methylene))bis(oxirane) (TMPTGE)

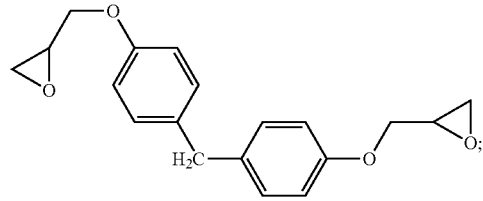

bis(4-(oxiran-2-ylmethoxy)phenyl)methane (EPON™ 862)

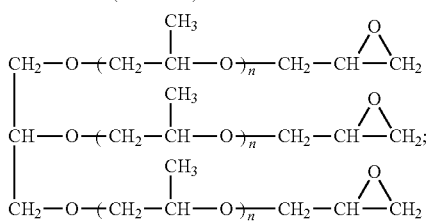

polyglycidyl ether of an aliphatic triol (HELOXY™ 84 or GE-36), where n is believed to be about 8

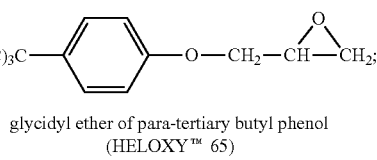

glycidyl ether of para-tertiary butyl phenol (HELOXY™ 65)

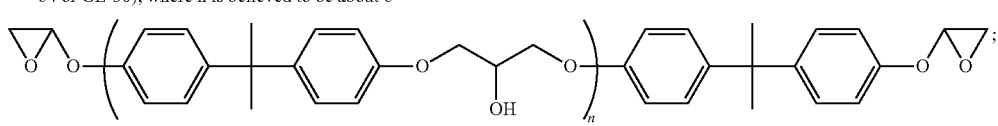

LX-01, where n is believed to range from 10 to 100 or higher

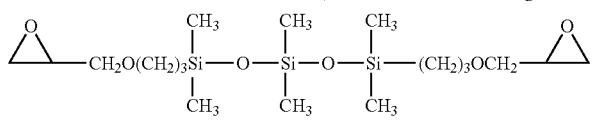

DMS-E09

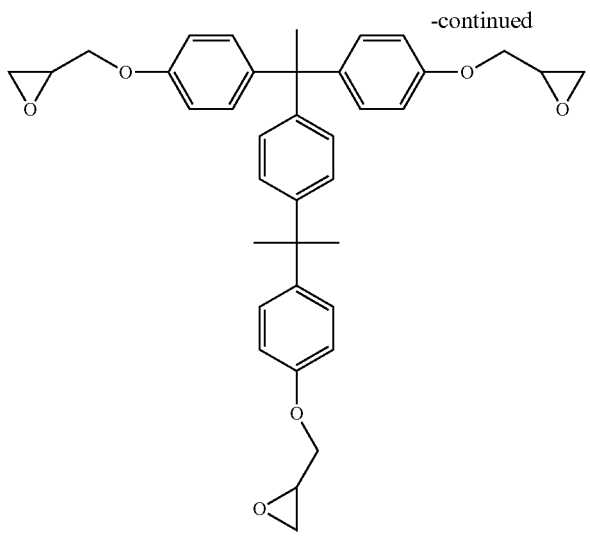

TECHMORE™ VG3101L

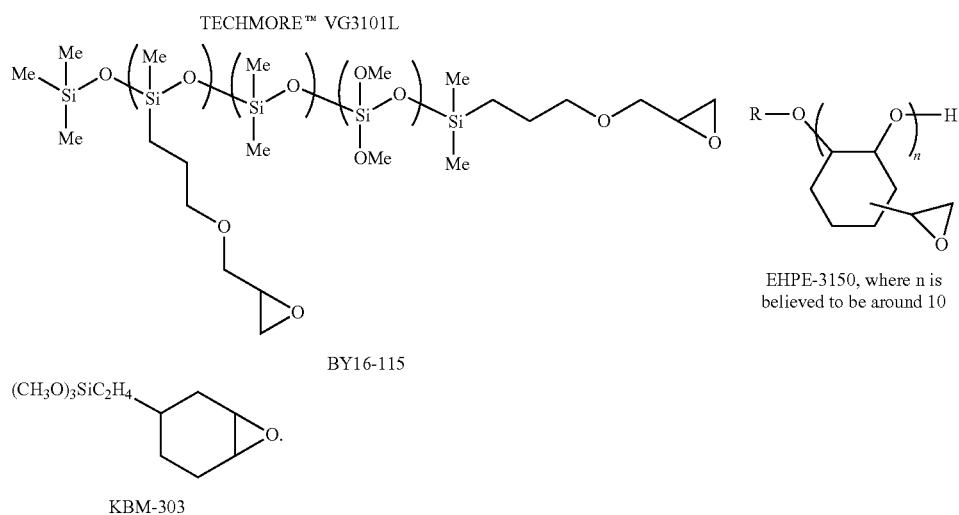

BY16-115

KBM-303

EHPE-3150, where n is believed to be around 10

Other cross-linking agents that can be employed in the compositions also include without any limitation the following: polyethylene glycol diglycidyl ether (PEGDGE); and polypropylene glycol diglycidyl ether (PPGDGE). Still other exemplary epoxy resins or cross-linking additives include, among others Araldite MTO163 and Araldite CY179 (manufactured by Ciba Geigy); and EHPE-3150, Epolite GT300 and (manufactured by Daicel Chemical). It should further be noted that any of the cross-linking agents as described herein can be used alone or as mixtures of one or more cross-linking agents in any combination thereof.

The amount of epoxy compound may also vary as noted for PACs, and in certain instances the epoxy used can be optional especially in the case of a "negative tone" compositions, as noted above. The amount can vary generally from about 0 to 50 parts by weight of the polymer and typically from about 2 to about 30 parts by weight, although other advantageous amounts of such materials are also appropriate and within the scope of the present invention.

Where appropriate, any suitable sensitizer component can be included in the polymer compositions of the present invention. Such suitable sensitizer components include, but are not limited to, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone (commercially sold under the name CPTX from Lambson), phenothiazine, OMNIPOL™ TX (from IGM Resins) and mixtures thereof.

In some embodiments, the composition of this invention encompasses one or more cross-linking agents selected from the group consisting of: 2,2'-(((2-ethyl-2-((oxiran-2-ylmethoxy)methyl)propane-1,3-diyl)bis(oxy))-bis(methylene))bis(oxirane) (TMPTGE); bis(4-(oxiran-2-ylmethoxy)phenyl)methane (EPON 862); or polyglycidyl ether of an aliphatic triol (HELOXY 84 or GE-36). Again, as noted above, mixtures of these cross-linking agents in any combination thereof can also be used.

The polymer compositions in accordance with the present invention may further contain optional components as may be useful for the purpose of improving properties of both the composition and the resulting layer, for example the sensitivity of the composition to a desired wavelength of exposure radiation. Such additives include, but are not limited to, bisphenol A and 5-norbornene-2,3-dicarboxylic acid as a dissolution promoter, a silicone surfactant such as TSF4452

(Toshiba Silicone Co., Ltd), a silane coupling agent such as γ-aminopropyl triethoxysilane, a leveling agent, such as γ-(methacryloyloxy propyl)trimethoxysilane, antioxidants such as IRGANOX™ 1035 and 1076 (Ciba Specialty Chemicals), a fire retardant such as a trialkyl phosphate or other organic phosphoric compound, a plasticizer such as, poly (propylene glycol) and a crosslinking agent such as a multifunctional epoxy compound, or a bifunctional, sulfur containing organosilane, bis(triethoxysilylpropyl)disulfide, commonly available commercially as Si 75®.

In some embodiments of this invention the photosensitive composition encompass one or more polymers selected without any limitation from the group consisting of:

a copolymer containing repeating units derived from bicyclo[2.2.1]hept-2-ene (NB) and maleic anhydride ring opened with n-octyl amine, n-dodecylamine, n-hexadecylamine or n-octadecylamine; and a copolymer containing repeat units derived from styrene and maleic anhydride ring opened with n-octyl amine, n-dodecylamine, n-hexadecylamine or n-octadecylamine.

In some embodiments of this invention, the semiconductor device encompassing a redistribution layer (RDL) structure further incorporates a photosensitive composition according to this invention.

In addition, in some embodiments of this invention as described above, a film is formed by the photosensitive composition according to this invention. As further described above, such films generally exhibit excellent chemical, mechanical, elastic properties having a wide variety of utility in electronic, optoelectronic, microelectromechanical applications featuring excellent dielectric properties.

Accordingly, in some embodiments of this invention, there is provided a microelectronic or optoelectronic device encompassing one or more of a redistribution layer (RDL) structure, a chip-stack structure, a CMOS image sensor dam structure, where said structures further incorporates a photosensitive composition according to this invention.

Further, in some embodiments of this invention, there is provided a method of forming a film for the fabrication of a microelectronic or optoelectronic device comprising:

coating a suitable substrate with a composition according to the invention to form a film;

patterning the film with a mask by exposing to a suitable radiation;

developing the film after exposure to form a photo-pattern; and curing the film by heating to a suitable temperature.

The coating of the desired substrate to form a film with photosensitive composition of this invention can be performed by any of the coating procedures as described herein and/or known to one skilled in the art, such as by spin coating. Other suitable coating methods include without any limitation spraying, doctor blading, meniscus coating, ink jet coating and slot coating. Suitable substrate includes any appropriate substrate as is, or may be used for electrical, electronic or optoelectronic devices, for example, a semiconductor substrate, a ceramic substrate, a glass substrate.

Next, the coated substrate is first softbaked before the curing, i.e., heated to facilitate the removal of residual casting solvent, for example to a temperature from 60° C. to 150° C. for from about 1 to 30 minutes, although other appropriate temperatures and times can be used. In some embodiments the substrate is first softbaked before the curing at a temperature of from about 70° C. to about 130° C. for 2 minutes to 10 minutes. After the heating, the film is generally imagewise exposed to an appropriate wavelength of actinic radiation, wavelength is generally selected based on the choice of the photoactive compound and/or photosensitizer incorporated into the polymer composition as described herein. However, generally such appropriate wavelength is that produced by a mercury vapor lamp which is from 200 to 600 nm depending upon the type of mercury vapor lamp employed. It will be understood that the phrase "imagewise exposure" means exposing through a masking element to provide for a resulting pattern of exposed and unexposed portion of the film.

After an imagewise exposure of the film formed from photosensitive composition or formulation embodiments in accordance with the present invention, a development process is employed. For the positive tone polymer formulations of the present invention, such development process removes only exposed portions of the film thus leaving a positive image of the masking layer in the film. For the negative tone polymer formulations of the present invention, such development process removes only unexposed portions of the film thus leaving a negative image of the masking layer in the film. For some embodiments, a post exposure bake can be employed prior to the aforementioned development process similar to the hardbake step described above.

Suitable developers, particularly for positive tone formulations, can include aqueous solutions of inorganic alkalis such as sodium hydroxide, potassium hydroxide, sodium carbonate, ammonia, and aqueous solutions of organic alkalis such as 0.26N tetramethylammonium hydroxide (TMAH), ethylamine, triethylamine and triethanolamine. Where an organic alkali is used, generally an organic solvent essentially fully miscible with water is used to provide adequate solubility for the organic alkali. Aqueous solutions of TMAH are well known developer solutions in the semiconductor industry. Suitable developers can also include organic solvents such as PGMEA, 2-heptanone, cyclohexanone, toluene, xylene, ethyl benzene, mesitylene and butyl acetate, among others, or mixtures of these solvents in any combination thereof.

Thus some formulation embodiments of the present invention provide self-imageable films that after imagewise exposure, a resulting image is developed using an aqueous base solution, while for other such embodiments a resulting image is developed using an organic solvent. Regardless of which type of developer is employed, after the image is developed, the substrate is rinsed to remove excess developer solution, typical rinse agents are water or appropriate alcohols and mixtures thereof.

After the aforementioned rinsing, the substrate is dried and the imaged film finally cured. That is to say, the image is fixed. Where the remaining layer has not been exposed during the imagewise exposure, image fixing is generally accomplished by causing a reaction within the remaining portions of the film. Such reaction is generally a cross-linking reaction that can be initiated by heating and/or non-imagewise or blanket exposure of the remaining material. Such exposure and heating can be in separate steps or combined as is found appropriate for the specific use of the imaged film. The blanket exposure is generally performed using the same energy source as employed in the imagewise exposure although any appropriate energy source can be employed. The heating is generally carried out at a desirable temperature, for example, from above 110° C. for a time of from several minutes to one or more hours. Where the remaining layer has been exposed during the imagewise exposure, image fixing is generally accomplished by a heating step to be tailored to complete any reaction initiated by the exposure. However an additional blanket exposure and heating, as discussed above, can also be employed. It should be realized, however, that the choice of a final cure process is also a function of the type of device being formed; thus a final fixing of the image may not be a final cure where the remaining layer is to be used as an adhesive layer or structure.

Accordingly, in some embodiments the resulting imagewise film or layer is cured by heating the patterned and developed substrate at a temperature of from about 120° C. to about 250° C. for about 20 minutes to about 240 minutes. In some other embodiments such curing is carried out at a temperature of from about 130° C. to about 200° C. for about 30 minutes to about 180 minutes. In yet some other embodiments such curing is carried out at a temperature of from about 150° C. to about 180° C. for about 60 minutes to about 120 minutes. Finally, in some other embodiments of this invention, the curing is performed at a temperature of from about 130° C. to about 200° C. at an incremental heating ramp of about 5° C./minute and for about 1 to 3 hours.

The devices are produced by using embodiments of the alkali soluble photosensitive resin composition of the present invention to form layers which are characterized as having high heat resistance, an appropriate water absorption rate, high transparency, and low permittivity. In addition, such layers generally have an advantageous coefficient of elasticity after curing.

As previously mentioned, exemplary applications for embodiments of the photosensitive compositions in accordance with the present invention include redistribution layer, die attach adhesive, wafer bonding adhesive, insulation films (interlayer dielectric layers), protecting films (passivation layers), mechanical buffer films (stress buffer layers) or flattening films for a variety of semiconductor devices, printed wiring boards. Specific applications of such embodiments encompass a die-attach adhesive to form a single or multilayer semiconductor device, dielectric film which is formed on a semiconductor device; a buffer coat film which is formed on the passivation film; an interlayer insulation film which is formed over a circuit formed on a semiconductor device.

Accordingly, some embodiments in accordance with the present invention therefore provide a positive tone photosensitive polymer composition which exhibits enhanced characteristics with respect to one or more of mechanical properties (such as low-stress, retained elongation to break after aging) and at least equivalent chemical resistance, as compared to alternate materials. In addition such embodiments provide generally excellent electrical insulation, adhesion to the substrate, and the like. Thus semiconductor devices, device packages, and display devices are provided that incorporate embodiments in accordance with the present invention.

Advantageously, it has now been found that the photosensitive compositions of this invention are useful to form adhesive layers for bonding the semiconductor chips to each other, such as in chip-stack applications. For example, a redistribution layer used for such a purpose is composed of a cured product of the photosensitive adhesive composition of the present invention. Surprisingly, it has now been found that although the adhesive layer is a single-layer structure, it not only exhibits sufficient adhesiveness to the substrate but also is free of significant stress resulting due to the curing step. Accordingly, it is now possible to avoid undesirably thick layer of film encompassing the chip as a laminate. It has been further observed that the laminates formed in accordance with the present invention are reliable in that the relaxation of stress concentration between layers caused by thermal expansion difference or the like can be obtained. As a result, the semiconductor device having low height and high reliability can be obtained. That is, devices with low aspect ratio and low thickness can be obtained. Such semiconductor device becomes particularly advantageous to electronic equipment, which has very small internal volume and is in use while carrying as a mobile device, for example. Even more advantageously, by practice of this invention it is now possible to form a variety of electronic devices featuring hitherto unachievable level of miniaturization, thinning and lightweight, and the function of the semiconductor device is not easily damaged even if such devices are subject to rugged operations such as swinging or dropping.

Accordingly, in some of the embodiments of this invention there is also provided a cured product obtained by curing the photosensitive composition as described herein. In another embodiment there is also provided an optoelectronic or microelectronic device comprising the cured product of this invention as described herein.

Advantageously it has also been found that the composition of this invention features low dielectric constant, generally less than 3.9, as described herein. Accordingly, in some of the embodiments the cured product obtained from the composition of this invention exhibits a dielectric constant of 3.6 or less at 1 MHz. In some other embodiments the cured product obtained from the composition of this invention exhibits a dielectric constant of 3.2 or less at 1 MHz. In yet some other embodiments the cured product obtained from the composition of this invention exhibits a dielectric constant of 3.0 or less at 1 MHz.

Furthermore, it has also been observed that the cured product encompassing the compositions of this invention exhibits excellent transparent properties at various wavelengths of light. That is, the cured products of this invention are transparent to lights of various wavelengths thus absorbing very little or no light energy. It should be noted that the curing step is generally carried out after blanket (flood) exposure of the entire coated film. That is, the entire film is exposed to a suitable radiation, such as for example, exposure to radiation at 365 nm without any mask in order to completely bleach any PAC present in the composition. The PAC bleaching step generally increases the transparency of the film. Accordingly, in some embodiments the cured product encompassing the compositions of this invention is having a transparency at 400 nm of more than 85% after curing at 250° C. for 30 minutes. In some other embodiments the cured product encompassing the compositions of this invention is having a transparency at 400 nm of more than 90% after curing at 250° C. for 30 minutes. In yet some other embodiments the cured product encompassing the compositions of this invention is having a transparency at 400 nm of more than 95% after curing at 250° C. for 30 minutes.

This invention is further illustrated by the following examples which are provided for illustration purposes and in no way limit the scope of the present invention.

EXAMPLES

General

The following definitions have been used in the Examples that follow unless otherwise indicated:
NB: bicyclo[2.2.1]hept-2-ene; BuDMMINB: 1-(4-(bicyclo[2.2.1]hept-5-en-2-yl)butyl)-3,4-dimethyl-1H-pyrrole-2,5-dione; NBTON: 5-((2-(2-methoxyethoxy)ethoxy)methyl)bicyclo-[2.2.1]hept-2-ene; DecNB: 5-decyl-bicyclo[2.2.1]hept-2-ene; MGENB: 2-((bicyclo[2.2.1]hept-5-en-2-ylmethoxy)methyl)oxirane; IBU: 2-methylprop-1-ene; 2M1P: 2-methylpent-1-ene; d-IBU: diisobutylene; V-TMS: trimethyl(vinyl)silane; MA: maleic anhydride; AIBN: azobisisobutyronitrile; THF: tetrahydrofuran; MEK: methyl ethyl ketone; MAK: methyl n-amyl ketone or 2-heptanone; NMP:

N-methyl-2-pyrrolidone; DMSO: dimethylsulfoxide; MEA: mono-ethanolamine; DMSO-d6: perdeuterated dimethyl sulfoxide; TMPTGE: trimethylolpropane triglycidylether; MA: maleic anhydride repeat unit; MI: maleimide repeat unit; COMA: co-, ter-, tetra-polymers of maleic anhydride and other olefins as described herein; ROMA: ring opened co-, ter-, tetra-polymers of maleic anhydride and other olefins as described herein; ROMI: amine ring-opened maleimide containing co-, ter-, tetra-polymers of maleic anhydride and other olefins as described herein; TS: total solid; HPLC: high performance liquid chromatography; GPC: gel permeation chromatography; $M_w$: weight average molecular weight; $M_n$: number average molecular weight; PDI: polydispersity index ($M_w/M_n$); FT-IR: Fourier transform-infrared; NMR: nuclear magnetic resonance; TGA: thermogravimetric analysis.

Several of the precursor copolymers of olefins with maleic anhydride described herein are commercially available and used as such from the commercial sources to make the ROMI polymers of this invention. For instance, SMA1000 (Styrene/MA, 50/50, $M_w$=4,900, $M_n$=2,800), SMA2000 (Styrene/MA, 66/33, $M_w$=7,100, $M_n$=3,550), SMA3000 (Styrene/MA, 75/25, $M_w$=9,500, $M_n$=4,700), SMA3024 (Styrene/MA, 75/25, $M_w$=23,300, $M_n$=11,400), CVX50208 (Styrene/MA, 66/33 ring opened with 1-$C_4H_9NH_2$, $M_w$=8,500, $M_n$=3,800) were purchased from Cray valley USA. Isobam-600 (IBU/MA, 50/50, $M_w$=5,500-6,500) was purchased from Kuraray Co. Ltd. V-TMS, d-IBU and 2M1P were purchased from Sigma Aldrich.

The following Example 1 through Example 19 illustrate the preparation of various precursor MA containing polymers of this invention. As noted therein, the monomer ratios indicated are the feed molar ratios to make the respective polymer unless otherwise indicated.

Example 1

NB/MA (50/50) Copolymer

Maleic anhydride (MA, 98.1 g, 1000 mmol), norbornene (NB, 94.2 g, 1000 mmol) and AIBN (3.3 g, 20 mmol) was dissolved in toluene (78.5 g) and THF (31.2 g) and charged to an appropriately sized reaction vessel. The solution was sparged with nitrogen for 10 min to remove oxygen and then heated with stirring to 60° C. The mixture was allowed to stir at 60° C. for 3 hrs, after which the solution became milky suspension. To this reaction mixture, THF (64.4 g) was added and heated to 60° C. for 5 hrs. At which time, additional quantities of AIBN (3.28 g, 20 mmol) and THF (39.5 g) were added and heating was continued for an additional period of 8 hrs. The reaction mixture was then diluted with THF (358 g) and added to excess heptane. The solids obtained after filtration were dried in a vacuum oven at 50-55° C. for about 12 hrs to obtain 174.4 g of the title polymer (GPC (THF) $M_w$=12,750, $M_n$=4,900, yield=91%).

Three different batches of NB/MA copolymer was also prepared in accordance with the following procedures as set forth in Example 1A through Example 1C.

Examples 1A

NB/MA (50/50) Copolymer

Maleic anhydride (MA, 98.1 g, 1 mol), norbornene (NB, 94.2 g, 1 mol) and dimethyl 2,2'-azobis(2-methylpropionate) (9.2 g, 40 mmol) was dissolved in toluene (62 g) and MEK (120 g) and charged to an appropriately sized reaction vessel. The solution was sparged with nitrogen for 10 min to remove oxygen and then heated with stirring to 60° C. The mixture was allowed to stir at 60° C. for 16 hrs. The reaction mixture was diluted with MEK (250 g) and added to excess methanol. The solid obtained after filtration was dried in a vacuum oven at 50-55° C. for about 12 hrs to obtain 170 g of solid (GPC (THF) $M_w$=12,900, $M_n$=6,700, yield=90%).

Examples 1B

NB/MA (50/50) Copolymer

Maleic anhydride (MA, 98.1 g, 1 mol), norbornene (NB, 94.2 g, 1 mol) and dimethyl 2,2'-azobis(2-methylpropionate) (23 g, 100 mmol) was dissolved in toluene (40 g) and MEK (360 g) and charged to an appropriately sized reaction vessel. The solution was sparged with nitrogen for 10 min to remove oxygen and then heated with stirring to 70° C. The mixture was allowed to stir at 70° C. for 16 hrs. The reaction mixture was diluted with MEK (250 g) and added to excess methanol. The solid obtained after filtration was dried in a vacuum oven at 50-55° C. for about 12 hrs to obtain 150 g of solid (GPC (THF) $M_w$=5,400, $M_n$=2,870, yield=78%).

Examples 1C

NB/MA (50/50) Copolymer

Maleic anhydride (MA, 98.1 g, 1 mol), norbornene (NB, 94.2 g, 1 mol) and dimethyl 2,2'-azobis(2-methylpropionate) (9.2 g, 40 mmol) was dissolved in toluene (37 g) and MEK (340 g) and charged to an appropriately sized reaction vessel. The solution was sparged with nitrogen for 10 min to remove oxygen and then heated with stirring to 70° C. The mixture was allowed to stir at 70° C. for 16 hrs. The reaction mixture was diluted with MEK (250 g) and added to excess methanol. The solid obtained after filtration was dried in a vacuum oven at 50-55° C. for about 12 hrs to obtain 163 g of solid (GPC (THF) $M_w$=6,800, $M_n$=3,760, yield=85%).

Example 2

2M1P/MA (50/50) Copolymer

Maleic Anhydride (MA, 24.5 g, 250 mmol), 2-methyl-1-pentene (2M1P, 21 g, 250 mmol) and AIBN (4.1 g, 25 mmol) was dissolved in ethyl acetate (26.2 g) and charged to an appropriately sized reaction vessel. The solution was sparged with nitrogen for 30 min to remove oxygen and then heated with stirring to 70° C. The mixture was allowed to stir at 70° C. for about 5 min, after which a solid was formed. The reaction mixture was allowed to cool to room temperature and the solid product was dissolved in THF (150 mL) and added to excess hexanes and the solids obtained after filtration were dried in a vacuum oven at 70° C. for 15 hrs to obtain 22 g of the title product (GPC (THF) $M_w$=44,400, $M_n$=9,750, isolated yield=48%).

Example 3

2M1P/DecNB/MA (35/15/50) Terpolymer

Maleic Anhydride (MA, 24.5 g, 250 mmol), 2-methyl-1-pentene (2M1P, 14.7 g, 175 mmol), DecNB (17.6 g, 75 mmol) and AIBN (4.1 g, 25 mmol) was dissolved in ethyl acetate (33.7 g) and charged to an appropriately sized reaction vessel. The solution was sparged with nitrogen for 30 min to remove oxygen and then heated with stirring to 70° C. The mixture was allowed to stir at 80° C. for 2 hrs. The reaction mixture was allowed to cool to room temperature and added to excess hexanes. The solid obtained was dissolved in THF (150 g) and added to excess hexanes and after filtration was dried in a vacuum oven at 80° C. for 15 hrs to obtain 26 g of solid (GPC (THF) $M_w$=52,750, $M_n$=17,950, isolated yield=46%).

Example 4

2M1P/NBTON/MA (35/15/50) Terpolymer

Maleic Anhydride (MA, 24.5 g, 250 mmol), 2-methyl-1-pentene (2M1P, 14.7 g, 175 mmol), NBTON (17 g, 75 mmol) and AIBN (4.1 g, 25 mmol) was dissolved in ethyl acetate (33.3 g) and charged to an appropriately sized reaction vessel. The solution was sparged with nitrogen for 30 min to remove oxygen and then heated with stirring to 80° C. The mixture was allowed to stir at 80° C. for 40 min. The reaction mixture was allowed to cool to room temperature, diluted with THF (50 mL) and added to excess hexanes. The solid obtained was dissolved in THF (150 g) and added to excess hexanes and after filtration was dried in a vacuum oven at 70° C. for 15 hrs to obtain 36 g of solid (GPC (THF) $M_w$=24,400, $M_n$=7,650, isolated yield=64%).

Example 5

V-TMS/MA (50/50) Copolymer

Maleic Anhydride (MA, 9.81 g, 100 mmol), trimethyl(vinyl)silane (V-TMS, 10 g, 100 mmol), and AIBN (1.64 g, 10 mmol) was dissolved in toluene (9 g) and charged to an appropriately sized reaction vessel. The solution was sparged with nitrogen for 30 min to remove oxygen and then heated with stirring to 65° C. The mixture was allowed to stir at 65° C. for 15 hrs. The reaction mixture was allowed to cool to room temperature, diluted with THF (15 g) and added to excess hexanes. The solid obtained was dried in a vacuum oven at 60° C. for 15 hrs to obtain 14 g of solid (GPC (THF) $M_w$=4,100, $M_n$=2,500, isolated yield=71%). The FT-IR spectrum obtained for the polymer in THF solution showed peaks corresponding to cyclic anhydride at 1781 and 1851 cm$^{-1}$. $^1$H-NMR spectrum of the polymer run in DMSO-d6 showed the presence of trimethylsilyl peak at 0.06 ppm indicating the incorporation of V-TMS monomer into the polymer.

Example 6

V-TMS/MA (50/50) Copolymer

Maleic Anhydride (MA, 24.5 g, 250 mmol), trimethyl(vinyl)silane (V-TMS, 25 g, 250 mmol), and AIBN (4.1 g, 25.0 mmol) was dissolved in ethyl acetate (22.6 g) and charged to an appropriately sized reaction vessel. The solution was sparged with nitrogen for 30 min to remove oxygen and then heated with stirring to 70° C. The mixture was allowed to stir at 70° C. for 30 hrs (GPC (THF) $M_w$=3,550, $M_n$=2,100). The reaction mixture was allowed to cool to room temperature, diluted with THF (25 mL) and added to excess hexanes. The solid obtained was dried in a vacuum oven at 70-80° C. for 15 hrs to obtain 44 g of solid (isolated yield=89%).

Example 7

V-TMS/DecNB/MA (25/25/50) Terpolymer

Maleic Anhydride (MA, 9.8 g, 100 mmol), trimethyl(vinyl)silane (V-TMS, 5 g, 100 mmol), DecNB (11.7 g, 50 mmol) and AIBN (1.64 g, 10 mmol) was dissolved in toluene (12 g) and charged to an appropriately sized reaction vessel. The solution was sparged with nitrogen for 30 min to remove oxygen and then heated with stirring to 65° C. The mixture was allowed to stir at 65° C. for 15 hrs. The reaction mixture was allowed to cool to room temperature, diluted with THF (10 g) and added to excess methanol. The solid obtained was dried in a vacuum oven at 60° C. for 15 hrs to obtain 9 g of solid (GPC (THF) $M_w$=8,800, $M_n$=4,850, isolated yield=34%). The FT-IR spectrum obtained for the polymer in THF solution showed peaks corresponding to cyclic anhydride at 1781 and 1855 cm$^{-1}$. $^1$H-NMR spectrum of the polymer run in DMSO-d6 showed the presence of trimethylsilyl peak at 0.06 ppm indicating the incorporation of V-TMS monomer into the polymer.

Example 8

V-TMS/NBTON/MA (25/25/50) Terpolymer

Maleic Anhydride (MA, 9.8 g, 100 mmol), trimethyl(vinyl)silane (V-TMS, 5 g, 100 mmol), NBTON (11.3 g, 50 mmol) and AIBN (1.64 g, 10 mmol) was dissolved in toluene (12.4 g) and charged to an appropriately sized reaction vessel. The solution was sparged with nitrogen for 30 min to remove oxygen and then heated with stirring to 65° C. The mixture was allowed to stir at 65° C. for 15 hrs. The reaction mixture was allowed to cool to room temperature, diluted with THF (10 g) and added to excess hexanes. The solid obtained was dried in a vacuum oven at 60° C. for 15 hrs to obtain 21 g of solid (GPC (THF)=8,800 $M_n$=4,850, isolated yield=79%). The FT-IR spectrum obtained for the polymer in THF solution showed peaks corresponding to cyclic anhydride at 1777 and 1850 cm$^{-1}$. $^1$H-NMR spectrum of the polymer run in DMSO-d6 showed the presence of trimethylsilyl peak at 0.06 ppm indicating the incorporation of V-TMS monomer into the polymer.

Example 9

V-TMS/NBTON/MA (40/10/50) Terpolymer

Maleic Anhydride (MA, 24.5 g, 250 mmol), trimethyl(vinyl)silane (V-TMS, 20 g, 200 mmol), NBTON (11.3 g, 50 mmol) and AIBN (4.1 g, 25 mmol) was dissolved in ethyl acetate (26 g) and charged to an appropriately sized reaction vessel. The solution was sparged with nitrogen for 30 min to remove oxygen and then heated with stirring to 70° C. The mixture was allowed to stir at 70° C. for 30 hrs (GPC (THF) $M_w$=5,350, $M_n$=2,500). The reaction mixture was allowed to cool to room temperature, diluted with THF (25 mL) and added to excess hexanes. The solid obtained was dried in a vacuum oven at 70-80° C. for 15 hrs to obtain 52 g of solid (isolated yield=93%).

Example 10

DecNB/NBTON/BuDMMINB/MA (20/20/10/50) Tetrapolymer

Maleic Anhydride (MA, 14.7 g, 150 mmol), DecNB (14 g, 60 mmol), NBTON (13.6 g, 60 mmol), BuDMMINB (8.19 g, 30 mmol) and AIBN (1.64 g, 10 mmol) was dissolved in ethyl acetate (25.6 g) and charged to an appropriately sized reaction vessel. The solution was sparged with nitrogen for 30 min to remove oxygen and then heated with stirring to 65° C. The mixture was allowed to stir at 65° C. for 15 hrs. The reaction mixture was allowed to cool to room temperature, diluted with THF (10 g) and added to excess hexanes. The solid obtained was dried in a vacuum oven at room temperature for 15 hrs to obtain 25 g of the title tetrapolymer (GPC (THF) $M_w$=11,050, $M_n$=6,000, isolated yield=50%). The FT-IR spectrum obtained for the polymer in THF solution showed peaks corresponding to cyclic anhydride (MA) at 1775 and 1850 cm$^{-1}$ and maleimide (MI) peak at 1705 cm$^{-1}$, indicating the incorporation of MA and BuDMMINB monomers along with DecNB and NBTON as further confirmed by the respective characteristic peaks in the $^1$H-NMR spectra.

Example 11

DecNB/NBTON/MGENB/MA (20/20/10/50) Tetrapolymer

Maleic Anhydride (MA, 14.7 g, 150 mmol), DecNB (14 g, 60 mmol), NBTON (13.6 g, 60 mmol), MGENB (5.4 g, 30 mmol) and AIBN (1.64 g, 10 mmol) was dissolved in ethyl acetate (24.1 g) and charged to an appropriately sized reaction vessel. The solution was sparged with nitrogen for 30 min to remove oxygen and then heated with stirring to 65° C. The mixture was allowed to stir at 65° C. for 15 hrs. The reaction mixture was allowed to cool to room temperature, diluted with THF (10 g) and added to excess hexanes. The solid obtained was dried in a vacuum oven at room temperature for 15 hrs to obtain 29 g of solid (GPC (THF) $M_w$=10,650, $M_n$=5,650, isolated yield=61%). The FT-IR spectrum obtained for the polymer in THF solution showed peaks corresponding to cyclic anhydride (MA) at 1775 and 1851 cm$^{-1}$.

Example 12 d-IBU/NBTON/MA (35/15/50) Terpolymer

Maleic Anhydride (MA, 24.7 g, 925 mmol), diisobutylene (d-IBU, 19.6 g, 175 mmol), NBTON (17 g, 75 mmol) and AIBN (4.1 g, 25 mmol) was dissolved in ethyl acetate (50 g) and charged to an appropriately sized reaction vessel. The solution was sparged with nitrogen for 30 min to remove oxygen and then heated with stirring to 80° C. The mixture was allowed to stir at 80° C. for 5.5 hrs. The reaction mixture was allowed to cool to room temperature, diluted with THF (50 g) and added to excess hexanes. The solid obtained was dried in a vacuum oven at 70° C. for 24 hrs to obtain 50 g of solid (GPC (THF) $M_w$=9,850, $M_n$=3,600, isolated yield=82%). The FT-IR spectrum obtained for the polymer in THF solution showed peaks corresponding to cyclic anhydride (MA) at 1775 and 1850 cm$^{-1}$. $^{13}$C-NMR analysis of the final polymer in DMSO had d-IBU/NBTON/MA composition of 22/19/59.

Example 13 d-IBU/NBTON/MA (30/20/50) Terpolymer

Maleic Anhydride (MA, 29.4 g, 300 mmol), diisobutylene (d-IBU, 20.2 g, 180 mmol), NBTON (27.1 g, 120 mmol) and AIBN (4.92 g, 30 mmol) was dissolved in ethyl acetate (36.4 g) and charged to an appropriately sized reaction vessel. The solution was sparged with nitrogen for 30 min to remove oxygen and then heated with stirring to 70° C. The mixture was allowed to stir at 70° C. for 15 hrs. The reaction mixture was allowed to cool to room temperature, diluted with THF (30 g) and added to excess hexanes. The solid obtained was dried in a vacuum oven at 70° C. for 15 hrs to obtain 56 g of solid (GPC (THF) $M_w$=9,900 $M_n$=3,300, isolated yield=73%). The FT-IR spectrum obtained for the polymer in THF solution showed peaks corresponding to cyclic anhydride (MA) at 1776 and 1850 cm$^{-1}$. $^{13}$C-NMR analysis of the final polymer in DMSO-d6 had d-IBU/NBTON/MA composition of 18/26/56.

Example 14 d-IBU/NBTON/MA (40/10/50) Terpolymer

Maleic Anhydride (MA, 29.4 g, 300 mmol), diisobutylene (d-IBU, 26.9 g, 240 mmol), NBTON (13.6 g, 60 mmol) and AIBN (3.28 g, 20 mmol) was dissolved in ethyl acetate (32.7 g) and charged to an appropriately sized reaction vessel. The solution was sparged with nitrogen for 30 min to remove oxygen and then heated with stirring to 85° C. The mixture was allowed to stir at 85° C. for 15 hrs. The reaction mixture was allowed to cool to room temperature, diluted with THF (60 g) and added to excess hexanes. The solid obtained was dried in a vacuum oven at 70° C. for 15 hrs to obtain 43 g of solid (GPC (THF) $M_w$=14,700, $M_n$=5,700, isolated yield=62%). The FT-IR spectrum obtained for the polymer in THF solution showed peaks corresponding to cyclic anhydride (MA) at 1776 and 1850 cm$^{-1}$. $^{13}$C-NMR analysis of the final polymer in DMSO-d6 had d-IBU/NBTON/MA composition of 27/14/58.

Example 15

2,3,3-Trimethyl-1-pentene/NBTON/MA (30/20/50) Terpolymer

Maleic Anhydride (MA, 39.2 g, 400 mmol), 2,3,3-trimethyl-1-pentene (26.7 g, 240 mmol), NBTON (36.2 g, 160 mmol) and AIBN (4.37 g, 26.7 mmol) was dissolved in ethyl acetate (63.8 g) and charged to an appropriately sized reaction vessel. The solution was sparged with nitrogen for 30 min to remove oxygen and then heated with stirring to 80-85° C. The mixture was allowed to stir at 80-85° C. for 4 hrs. The reaction mixture was allowed to cool to room temperature, diluted with THF (50 g) and added to excess hexanes. The solid obtained was dried in a vacuum oven at 70° C. for 15 hrs to obtain 83 g of solid (GPC (THF) $M_w$=12,550, $M_n$=4,750, isolated yield=81%). The FT-IR spectrum obtained for the polymer in THF solution showed peaks corresponding to cyclic anhydride (MA) at 1776 and 1850 cm$^{-1}$. $^{13}$C-NMR analysis of the final polymer in DMSO-d6 had d-IBU/NBTON/MA composition of 26/19/55.

Example 16

2,3,3-Trimethyl-1-pentene/NBTON/MA (35/15/50) Terpolymer

Maleic Anhydride (MA, 73.5 g, 750 mmol), 2,3,3-trimethyl-1-pentene (58.8 g, 525 mmol), NBTON (50.9 g, 225 mmol) and AIBN (8.2 g, 50 mmol) was dissolved in ethyl acetate (114 g) and charged to an appropriately sized reaction vessel. The solution was sparged with nitrogen for 30 min to remove oxygen and then heated with stirring to 90° C. The mixture was allowed to stir at 90° C. for 4 hrs. The reaction mixture was allowed to cool to room temperature, diluted with THF (100 g) and added to excess hexanes. The solid obtained was dried in a vacuum oven at 80° C. for 24 hrs to obtain 170 g of solid (GPC (THF) $M_w$=12,500, $M_n$=4,850, isolated yield=93%). The FT-IR spectrum obtained for the polymer in THF solution showed peaks corresponding to cyclic anhydride (MA) at 1778 and 1849 cm$^{-1}$. $^{13}$C-NMR analysis of the final polymer in DMSO-d6 had d-IBU/NB-TON/MA composition of 29/16/55.

Example 17

DecNB/MGENB/MA (40/10/50) Terpolymer

Maleic Anhydride (MA, 4.9 g, 50 mmol), DecNB (9.36 g, 40 mmol), MGENB (1.8 g, 10 mmol), AIBN (0.55 g, 3.33 mmol) and toluene (8.1 g) was charged to an appropriately sized reaction vessel. The solution was sparged with nitrogen for 30 min to remove oxygen and then heated with stirring to 70° C. The mixture was allowed to stir at 70° C. for 15-20 hrs (GPC (THF) $M_w$=13,600, $M_n$=7,000).

Example 18

NBTON/MGENB/MA (40/10/50) Terpolymer

Maleic Anhydride (MA, 4.9 g, 50 mmol), DecNB (9.05 g, 40 mmol), NBTON (1.8 g, 10 mmol), AIBN (0.55 g, 3.33 mmol) and toluene (7.9 g) was charged to an appropriately sized reaction vessel. The solution was sparged with nitrogen for 30 min to remove oxygen and then heated with stirring to 70° C. The mixture was allowed to stir at 70° C. for 15-20 hrs. (GPC (THF) $M_w$=12140, $M_n$=4800).

Example 19

PENB/MA (50/50) Copolymer

Maleic Anhydride (MA, 24.5 g, 250 mmol), PENB (49.5 g, 250 mmol) and AIBN (2.73 g, 16.7 mmol) was dissolved in toluene (46.6 g) and charged to an appropriately sized reaction vessel. The solution was sparged with nitrogen for 30 min to remove oxygen and then heated with stirring to 80° C. The mixture was allowed to stir at 80° C. for 15 hrs. The reaction mixture was allowed to cool to room temperature, diluted with THF (75 g) and half of the reaction mixture (about 100 g) added to excess hexanes. The solid obtained was dried in a vacuum oven at 70° C. for 24 hrs to obtain 33 g of solid (GPC (THF) $M_w$=6,800, $M_n$=3,500, isolated yield=89%. The FT-IR spectrum obtained for the polymer in THF solution showed peaks corresponding to cyclic anhydride (MA) at 1776 and 1855 cm$^{-1}$.

Examples of MA Ring Opening with Alkyl Amines

The following Examples 20 through 30 illustrate the preparation of various ROMI polymers of this invention formed by the reaction of n-octylamine with commercially available copolymer of styrene and maleic anhydride, SMA2000 (Styrene/MA, 66/33, Mw=7,100, Mn=3,550).

Example 20-30

Styrene/MA copolymer (SMA2000) was dissolved in PGMEA to obtain 20% (w/w) solution. Appropriate aliquots of this solution (5-10 g) were then added to glass vials and corresponding amounts of n-octylamine (1-$C_8H_{17}NH_2$) as summarized in Table 1 were added, closed and heated to desirable temperatures and times as listed in Table 1. The amounts of maleic anhydride repeat units in the solutions were calculated based on the weight of the Styrene/MA copolymer present in the solution and the reported composition (Styrene/MA=66/33) by Cray Valley. HPLC was used to determine the relative polarity of the product mixture. Dissolution rates of thin films spun on Si-wafers in 2.38% (w/w) TMAH were measured for these solutions. Portions of these amine treated solutions were added to excess hexanes and the solids obtained were washed with hexanes. The amine treated solid polymers were dried in a vacuum oven at room temperature for 2 days or 40° C. for 15 hrs. The polymer solution samples were then analyzed by $^1$H-NMR and $^{13}$C-NMR in DMSO-d6 as the solvent. The samples were also characterized by FT-IR.

The FT-IR and $^{13}$C-NMR analyses were performed on the isolated polymer samples which were obtained by precipitating a sample of the polymer solution by adding to excess n-heptane and drying the solids at 60° C. for 24 hrs in a vacuum oven. FT-IR spectrum showed the presence of repeat units of formulae (IIIA) (3100-3400 cm$^{-1}$, 1730 cm$^{-1}$ and 1600 cm$^{-1}$), (IIIB) (1700 cm$^{-1}$) and (IIIC) (1774 and 1853 cm$^{-1}$). $^{13}$C-NMR spectra of the polymers were used to determine the molar ratios of the repeat units of formulae (IIIA) and (IIIB) based on the peaks at 13-15 ppm representing —$CH_3$ group of the products from 1-$C_8H_{17}NH_2$ based on which the percentage of repeat units of formula (IIIC) was estimated. The molar ratios of the repeat units of formulae (IIIA), (IIIB) and (IIIC) in the polymer as calculated by $^{13}$C-NMR are summarized in Table 1.

TABLE 1 n-Octylamine Reacted SMA2000

| Ex # | Polymer (g) | 1-$C_8H_{17}NH_2$ (g, mol) | 1-$C_8H_{17}NH_2$/ MA | Temp. (° C.) | Time (hrs) | (IIIA)/(IIIB)/(IIIC) Molar Ratio by $^{13}$C-NMR | DR (nm/s) |
|---|---|---|---|---|---|---|---|
| 20 | 2 | 0.42, 0.003 | 0.5 | 23 | 15 | 44/0/56 | <1 |
| 21 | 2 | 0.42, 0.003 | 0.5 | 60 | 15 | 40/0/60 | <1 |
| 22 | 2 | 0.42, 0.003 | 0.5 | 90 | 15 | 34/6/60 | <1 |
| 23 | 2 | 0.84, 0.007 | 1 | 23 | 15 | 94/0/6 | 1060 |
| 24 | 2 | 0.84, 0.007 | 1 | 60 | 15 | 100/0/0 | 4490 |
| 25 | 2 | 0.84, 0.007 | 1 | 90 | 15 | 80/14/6 | 60 |
| 26 | 1 | 0.42, 0.003 | 1 | 60 | 4 | | 1050 |
| 27 | 1 | 0.42, 0.003 | 1 | 90 | 4 | | 200 |
| 28 | 1 | 0.42, 0.003 | 1 | 130 | 4 | 78/19/3 | 15 |
| 29 | 1 | 0.42, 0.003 | 1 | 160 | 4 | 58/42/0 | 0 |
| 30 | 1 | 0.42, 0.0033 | 1 | 130 | 15 | | 0 |

DR = Dissolution rate;
nm/s = nanometer/second

The following Examples 31-34 and Examples 35-37 illustrate respectively the preparation of various ROMI polymers of this invention formed by the reaction of n-butylamine and other amines with commercially available copolymer of styrene and maleic anhydride, SMA2000 (Styrene/MA, 66/33, Mw=7,100, Mn=3,550).

Examples 31-33

Styrene/MA copolymer (SMA2000) was dissolved in PGMEA to obtain 30% (w/w) solution in suitable glass containers and desirable amounts of 1-$C_4H_9NH_2$ were added, as summarized in Table 2. The glass containers were then closed and heated to suitable temperatures and times to affect the amination reaction as summarized in Table 2. The amounts of maleic anhydride repeat units in the polymer were calculated based on the weight of the Styrene/MA copolymer present in the solution and the reported composition (Styrene/MA=66/33) by Cray Valley. The molecular weights of the resulting polymer products were determined by GPC. Dissolution rates of thin films spun on Si-wafers in 2.38% (w/w) TMAH were measured for these solutions. Small portions of these amine treated solutions were added to excess hexanes and the solids obtained were washed with hexanes. The amine treated solid polymers were dried in a vacuum oven at room temperature for 2 days or 40-60° C. for 15 hrs. $^1$H-NMR and $^{13}$C-NMR of these polymers dissolved in DMSO-d6 were measured. FT-IR of the polymers also measured in KBr pellets. The molar ratios of the repeat units of formulae (IIIA), (IIIB) and (IIIC) were also calculated by the $^{13}$C-NMR as described in Examples 20-30 above and are summarized in Table 2 for the polymers obtained in Examples 31 and 33 and such measurements could not be made for Example 32.

TABLE 2 n-Butylamine Reacted SMA2000

| Ex # | Polymer (g) | 1-$C_4H_9NH_2$ (g, mol) | % MA treated | Temp. (° C.) | Time (hrs) | (IIIA)/(IIIB)/(IIIC) Molar Ratio by $^{13}$C-NMR | DR (nm/s) |
|---|---|---|---|---|---|---|---|
| 31 | 45 | 10.9, 0.15 | 100 | 90-100 | 11 | 76/18/6 | 70 |
| 32 | 50 | 11.9, 0.16 | 100 | 100 | 6 | — | 300 |
| 33 | 50 | 12.0, 0.16 | 100 | 100 | 10 | 66/20/14 | 48 |

Example 34

Styrene/MA copolymer (SMA2000) was dissolved in PGMEA to obtain 25% (w/w) solution and 240 g of this solution was transferred to a suitable size reactor equipped with mechanical stirring and heating. The polymer solution was flushed three times with nitrogen and heated to 50° C. in a nitrogen atmosphere (10 psig). n-Butylamine (14.8 g, 0.2 mol) was mixed with PGMEA (14.8 g), transferred to a glass syringe and was added to the above polymer solution at 0.7 mL/min rate using a syringe pump while stirring and maintaining the temperature at 50° C. Once the addition of the amine solution to the polymer solution was complete the temperature of the reaction mixture was increased to 100° C. and kept at that temperature for 8 hrs while stirring and then allowed to cool to ambient temperature. The amine treated polymer was characterized by GPC ($M_w$=7,700, $M_n$=3,850, PDI=1.99), viscosity (248 cps), acid number (102 mg KOH/g) and residual water content (3430 ppm).

FT-IR and $^{13}$C-NMR analyses were performed on a polymer sample from Example 34 after precipitating a sample of the polymer solution by adding to excess n-heptane and drying the solids at 60° C. for 24 hrs in a vacuum oven. The FT-IR spectrum showed the presence of repeat units of formulae (IIIA) (3100-3400 cm$^{-1}$, 1730 cm$^{-1}$ and 1600 cm$^{-1}$), (IIIB) (1700 cm$^{-1}$) and (IIIC) (1774 and 1853 cm$^{-1}$). $^{13}$C-NMR spectra of the polymers were used to determine the molar ratios of the repeat units of formulae (IIIA) and (IIIB) based on the peaks at 13-15 ppm representing —$CH_3$ group of the products from 1-$C_4H_9NH_2$ based on which the percentage of repeat units of formula (IIIC) was estimated. The composition of the polymer calculated by $^{13}$C-NMR was styrene/IIIA/IIIB/IIIC=68/26/6/0. Two identical reactions carried out gave compositions of 65/26/8/1 and 74/17/9/0.

Example 35-37

Styrene/MA copolymer (SMA2000) was dissolved in PGMEA to obtain 25% (w/w) solution in suitable glass containers and desirable amounts of 1-$C_4H_9NH_2$, 1-$C_6H_{13}NH_2$, or 1-$C_8H_{17}NH_2$, were added, as summarized in Table 3, the glass containers were then closed and heated for 3 hrs at 70° C. The amounts of maleic anhydride repeat units in the solutions were calculated based on the weight of the Styrene/MA copolymer present in the solution and the reported composition (Styrene/MA=66/33) by Cray Valley. Dissolution rates of thin films spun on Si-wafers in 2.38% (w/w) TMAH were measured for these solutions.

TABLE 3

Various Amine Reacted SMA2000

| Ex # | Polymer (g) | MA (mol) | Amine | Amine (g, mol) | DR (nm/s) |
|---|---|---|---|---|---|
| 35 | 20 | 0.2 | 1-$C_4H_9NH_2$ | 1.2, 0.02 | 870 |
| 36 | 20 | 0.2 | 1-$C_6H_{13}NH_2$ | 1.62, 0.02 | 810 |
| 37 | 20 | 0.2 | 1-$C_8H_{17}NH_2$ | 2.06, 0.02 | 590 |

It is quite apparent from Examples 20-37 and the results as summarized in Tables 1-3 the dissolution rates of amine treated SMA2000 vary with the amine loading, reaction temperature, reaction time as well as the alkyl chain length of the amine. Increasing the $RNH_2$/MA ratio from 0.5 to 1 (Examples 20-22 vs. Examples 23-26) increases the DR. Increasing reaction temperature, especially above 90° C. decreases DR (examples 28-30) and increasing reaction time also decreases DR (Example 28 vs. Example 30). Examples 35 through 37 also demonstrate that higher alkyl amines decrease the DR.

A few of the amine reacted polymer samples from the above Examples were also analyzed by HPLC and compared with the HPLC of the SMA2000. All of the samples were dissolved in PGMEA. The HPLCs obtained for the polymer samples from Examples 26, 28 and 29 revealed that the retention times increased as the reaction temperature was changed from Example 26 (60° C.), 28 (130° C.) and 29 (160° C.) in consistent with an increase in hydrophobicity of the reaction product as the reaction temperature was increased. SMA2000 had the lowest retention time and the polymer sample from Example 29 had the longest retention time.

Several of the polymer samples from Examples 20-37 were also analyzed by FT-IR spectra. Specifically, the FT-IR spectra obtained for polymer products of Examples 20-37, which were obtained at various temperatures ranging from 23-160° C. indicate the presence of a mixture of species. In general, the peaks due to maleic anhydride carbonyl absorption decreased (1774 and 1853 $cm^{-1}$), i.e., the repeat units of formula (IIIC). The data demonstrates that the amic-acid (repeat units of formula (IIIA)) and its amine-salt (repeat units of formula (IIIE)) are formed upon the amine addition (broad bands at 1730 $cm^{-1}$ and 1600 $cm^{-1}$). When the temperature was elevated, (ca.>130-160° C.) these species transformed primarily into repeat units of formula (IIIB), i.e., MI units, as evidenced by a sharp band at 1700 $cm^{-1}$. This change is accompanied by a drop in intensity of —OH band of —COOH and —NH— band of —CONH— at 3100-3400 $cm^{-1}$ region at 160° C. reaction temperature. This is further manifested by the fact that the FT-IR analyses showed an increase in the maleimide (MI) peak at about 1700 $cm^{-1}$ as the reaction temperature was increased indicating a ring closure of the amic-acid structure containing more hydrophilic carboxylic acid functionality to form less hydrophilic maleimide structure. An estimation of the relative concentration of repeat units of formula (IIIB) in some of the Examples 20-37 was also performed using the FT-IR spectra. The peak heights of maleimide (MI) at 1700 $cm^{-1}$ and peak at about 3028 $cm^{-1}$ (aromatic C—H) were measured. The ratio of peak heights of maleimide (1700 $cm^{-1}$) to that of 3028 $cm^{-1}$ are indicative of the relative formation of repeat units of formula (IIIB) in these polymer examples. It is apparent from the data presented in Table 4 that as the reaction temperature and time increases the amount of repeat units of formula (IIIB) in the polymer is also increased.

TABLE 4

| Polymer Ex # | Peak heights ratio (IIIB)/3028 $cm^{-1}$ |
| --- | --- |
| 26 | 1.25 |
| 27 | 1.95 |
| 28 | 2.36 |
| 29 | 7.64 |
| 30 | 6.53 |
| 31 | 1.76 |
| 32 | 1.27 |
| 33 | 1.67 |

Example 38

FT-IR Studies of Products of SMA and n-Butylamine

The polymer solution obtained from Example 32 was used to spin coat a film on Si-wafer and softbaked at 100° C. for 3 minutes. The wafer was cleaved to four pieces and each of the three pieces was baked in an oven under nitrogen atmosphere to: (b) 130° C./30 min, (c) 150° C./30 min (d) 180° C./30 min; and one piece was used as a control with no bake, designated as sample (a). The FT-IR spectra of all four coated films were measured and are shown in FIG. 1. The composition of the product mixture changed with bake temperature forming primarily maleimide by the loss of water (MI, 1700 $cm^{-1}$), as evident from the FT-IR spectra shown in FIG. 1. However, at 150° C./30 min and 180° C./30 min bake condition maleic anhydride (MA, at about 1775 and 1850 $cm^{-1}$) was also formed possibly by the loss of 1-$C_4H_9NH_2$, see FIG. 1.

Example 39

$^{13}$C-NMR Characterization of Products of SMA2000/n-Octylamine

The amine reacted polymer samples from Examples 20-30 were further analyzed by the $^{13}$C-NMR spectroscopy. The analyses revealed that there is a significant change of the structure of carbonyl carbon (C=O) of the maleic anhydride repeat unit. The starting material (Styrene/MA, SMA2000) has a broad peak in 170-174 ppm region for maleic anhydride moiety in the polymer. There is no noticeable change in this signal for Examples 22 and 23, the amination in these two Examples were respectively run at 23° C. and 60° C. (171-176 ppm). An additional carbonyl peak at 176-180 ppm appears for Example 24 (the amination reaction was carried out at 90° C.). This peak grows in intensity for Example 27 (the amination reaction was carried out at 130° C.) and Example 29 (the amination reaction was carried out at 160° C.) as the peak intensities decreases for the peaks observed at 171-176 ppm indicating the formation of maleimide repeat units of formula (IIIB) while the repeat units of formulae (IIIA) and (IIIE), the amic-acid and the amic-acid alkyl-amine salts are transformed to the maleimide repeat units (IIIB).

The HPLC, FT-IR and $^{13}$C-NMR data are supported by the decrease in aqueous base developer dissolution rates as the reaction temperature is increased above 90° C. Based on the totality of HPLC, FT-IR, $^{13}$C-NMR and DR evidence together with general understanding of such chemical transformations, the amine-treated maleic anhydride containing polymers deem to encompass a mixture of repeat units as depicted in Scheme 1 described hereinabove.

Examples 40-43

Amine Treatments of SMA3000

Styrene/MA copolymer (SMA3000) was dissolved to obtain 25-35% (w/w) solutions in PGMEA or NMP in suitable glass containers, appropriate amounts of 1-$C_8H_{17}NH_2$ or 1-$C_4H_9NH_2$ were added as summarized in Table 5, the containers were then closed and heated to temperatures and times as summarized in Table 5. The amounts of maleic anhydride repeat units in the polymer samples were calculated based on the weight of the Styrene/MA copolymer present in the solution and the reported composition (Styrene/MA=75/25) by Cray Valley. The molecular weights were determined by GPC. Dissolution rates of thin films spun on Si-wafers in 2.38% (w/w) TMAH were measured for these solutions. Small portions of these amine treated solutions were added to excess hexanes and the solids obtained were washed with hexanes. The amine treated solid polymers were dried in a vacuum oven at room temperature for 2 days or 40° C. for 15 hrs. $^1$H-NMR and $^{13}$C-NMR of these polymers dissolved in DMSO-d6 were measured. FT-IR of the polymers also measured in THF solution.

TABLE 5

Amine treatments of SMA3000

| Ex. # | Polymer (g) | Solvent | Amine | MA (mol) | Amine (g, mol) | Temp. (° C.) | Time (Hrs) | DR (nm/s) |
|---|---|---|---|---|---|---|---|---|
| 40 | 25 | NMP | 1-$C_8H_{17}NH_2$ | 0.06 | 7.87, 0.06 | 60 | 15 | 14 |
| 41 | 30 | PGMEA | 1-$C_8H_{17}NH_2$ | 0.07 | 9.42, 0.07 | 60-90 | 24 | 7 |
| 42 | 36.6 | PGMEA | 1-$C_8H_{17}NH_2$ | 0.09 | 11.5, 0.09 | 60-70 | 39 | <1 |
| 43 | 20 | PGMEA | 1-$C_4H_9NH_2$ | 0.05 | 3.65, 0.05 | 90 | 15 | — |

Examples 44-47

Amine Treatments of SMA3024

Styrene/MA copolymer (SMA3024) was dissolved to obtain 20-35% (w/w) solutions in PGMEA or GBL in suitable glass containers and suitable amounts of 1-$C_8H_{17}NH_2$ or 1-$C_4H_9NH_2$ were added, the container closed and heated to temperatures and times as summarized in Table 6.

TABLE 6

Amine treatments of SMA3024

| Ex. # | Polymer (g) | Solvent | Amine | MA (mol) | Amine (g, mol) | Temp. (° C.) | Time (hrs) | DR (nm/s) |
|---|---|---|---|---|---|---|---|---|
| 44 | 25 | PGMEA | 1-$C_8H_{17}NH_2$ | 0.06 | 7.87, 0.06 | 75-90 | 20 | — |
| 45 | 30 | GBL | 1-$C_4H_9NH_2$ | 0.07 | 7.20, 0.07 | 80 | 3 | — |
| 46 | 21 | PGMEA | 1-$C_4H_9NH_2$ | 0.05 | 3.65, 0.05 | 90 | 15 | 6 |
| 47 | 50 | GBL | 1-$C_4H_9NH_2$ | 0.12 | 8.90, 0.12 | 80 | 6 | 8 |

The amounts of maleic anhydride repeat units in the polymer samples were calculated based on the weight of the Styrene/MA copolymer present in the solution and the reported composition (Styrene/MA=75/25) by Cray Valley. GPC was used to determine the molecular weights. Dissolution rates of thin films spun on Si-wafers in 2.38% (w/w) TMAH were measured for these solutions. Small portions of these amine treated solutions were added to excess hexanes and the solids obtained were washed with hexanes. The amine treated solid polymers were dried in a vacuum oven at room temperature for 50° C. for 15 hrs. $^1$H-NMR and $^{13}$C-NMR of these polymers dissolved in DMSO-d6 were measured. FT-IR of the polymers also measured in THF solution.

Example 48

Styrene/MA copolymer (SMA3024) was dissolved in THF to obtain 31% (w/w) solution and 200 g of this solution was transferred to a suitable reactor equipped with mechanical stirring and heating. The polymer solution was flushed three times with a stream of nitrogen and heated to 50° C. in a nitrogen atmosphere (10 psig). n-Butylamine (12.4 g, 0.17 mol) and THF (12.4 g) were mixed together transferred to a glass syringe and the mixture was added to the above polymer solution at 0.5 mL/min rate using a syringe pump while maintaining the reactor at 50° C. and stirring. Once the addition of the amine solution was complete the temperature of the reaction mixture was increased to 65° C. and kept at that temperature for 5 hrs while stirring and allowed to cool to ambient temperature. The reaction mixture was added to 2 L of hexanes while stirring to precipitate the solid polymer. The liquid layer decanted and the solid polymer was stirred in 1 L of additional hexanes. The polymer was filtered and dried at 60° C. for 24 hrs in a vacuum oven to obtain 63 g of dry powder (91% isolated yield). The amine treated polymer solution was characterized by GPC ($M_w$=23,500, $M_n$=12, 000, PDI=1.96), viscosity (781 cps), acid number (140 mg KOH/g) and residual water content (2124 ppm).

The polymer sample was also analyzed by FT-IR and $^{13}$C-NMR as described in Examples 20-30. The FT-IR showed the presence of repeat units of formulae (IIIA), (IIIB) and (IIIC). The molar ratios of the monomeric repeat units in the polymer was also calculated by $^{13}$C-NMR as described for Examples 20-30: styrene/(IIIA)/(IIIB)/(IIIC)=72/28/0/0. Two additional polymer samples were prepared substantially following the procedures as described in Example 48. The molar ratios of the monomeric repeat units in these two polymer as calculated by $^{13}$C-NMR were: styrene/(IIIA)/(IIIB)/(IIIC), 73/26/0/1 and 81/18/0/1 respectively.

Examples 49-77

Amine Treatments of Various Polymers

The NB/MA polymer from Example 1 was dissolved in NMP to obtain a 25% (w/w) solution. The 2M1P/MA polymer from Example 2 was dissolved in PGMEA to obtain 25% (w/w) solution. 2M1P/DecNB/MA polymer from Example 3 was dissolved in PGMEA to obtain 25% solution. 2M1P/NBTON/MA polymer from Example 4 was dissolved in PGMEA to obtain 25% solution. V-TMS/MA polymer from Example 6, V-TMS/DecNB/MA polymer from Example 7 and V-TMS/NBTON/MA polymer from Example 9 were dissolved in PGMEA to obtain 25% (w/w) solutions. DecNB/NBTON/BuDMMINB/MA polymer from Example 10 was dissolved in PGMEA and NMP (9:1) to obtain 24% (w/w) solution. DecNB/NBTON/MGENB/MA polymer from Example 11 was dissolved in PGMEA and NMP (9:1) to obtain 24% (w/w) solution. These polymer solutions were treated with 1-$C_8H_{17}NH_2$ according to the amounts and conditions as summarized in Table 7.

TABLE 7

Amine treatments of various MA containing polymers

| Ex. # | Poly. Ex. | Polymer | MA (mol) | 1-C$_8$H$_{17}$NH$_2$ (g, mol) | Temp. (°C.) | Time (hrs) | DR (nm/s) |
|---|---|---|---|---|---|---|---|
| 49 | 1 | NB/MA | 0.013 | 0 | RT | 24 | 0 |
| 50 | 1 | NB/MA | 0.013 | 0.17, 0.001 | RT | 24 | 50 |
| 51 | 1 | NB/MA | 0.013 | 0.34, 0.003 | RT | 24 | — |
| 52 | 1 | NB/MA | 0.013 | 0.50, 0.004 | RT | 24 | 20 |
| 53 | 1 | NB/MA | 0.013 | 0.67, 0.005 | RT | 24 | 13 |
| 54 | 1 | NB/MA | 0.013 | 0.84, 0.007 | RT | 24 | 90 |
| 55 | 1 | NB/MA | 0.013 | 1.00, 0.008 | RT | 24 | — |
| 56 | 1 | NB/MA | 0.013 | 1.17, 0.009 | RT | 24 | 460 |
| 57 | 2 | 2M1P/MA | 0.011 | 0.71, 0.006 | 65-80 | 33 | 40 |
| 58 | 2 | 2M1P/MA | 0.011 | 0.99, 0.008 | 65-80 | 33 | 2070 |
| 59 | 2 | 2M1P/MA | 0.011 | 1.42, 0.011 | 65-80 | 33 | 4170 |
| 60 | 3 | 2M1P/DecNB/MA | 0.010 | 0.65, 0.005 | 65-80 | 33 | 0 |
| 61 | 3 | 2M1P/DecNB/MA | 0.010 | 0.90, 0.007 | 65-80 | 33 | 40 |
| 62 | 3 | 2M1P/DecNB/MA | 0.010 | 1.29, 0.010 | 65-80 | 33 | 270 |
| 63 | 4 | 2M1P/NBTON/MA | 0.011 | 0.43, 0.003 | 65-80 | 33 | 320 |
| 64 | 4 | 2M1P/NBTON/MA | 0.011 | 0.57, 0.004 | 65-80 | 33 | 320 |
| 65 | 4 | 2M1P/NBTON/MA | 0.008 | 0.43, 0.003 | 50 | 15 | 2460 |
| 66 | 6 | V-TMS/MA | 0.013 | 0.67, 0.005 | 70 | 15 | 0 |
| 67 | 6 | V-TMS/MA | 0.013 | 0.75, 0.006 | 70 | 15 | 430 |
| 68 | 6 | V-TMS/MA | 0.013 | 0.84, 0.007 | 70 | 15 | 877 |
| 69 | 6 | V-TMS/MA | 0.013 | 1.00, 0.008 | 70 | 15 | 1800 |
| 70 | 7 | V-TMS/DecNB/MA | 0.011 | 0.37, 0.003 | 70 | 15 | 0 |
| 71 | 9 | V-TMS/NBTON/MA | 0.011 | 0.35, 0.002 | 70 | 15 | 180 |
| 72 | 9 | V-TMS/NBTON/MA | 0.011 | 0.43, 0.003 | 70 | 15 | 140 |
| 73 | 9 | V-TMS/NBTON/MA | 0.011 | 0.50, 0.004 | 70 | 15 | 260 |
| 74 | 9 | V-TMS/NBTON/MA | 0.011 | 0.57, 0.004 | 70 | 15 | 2560 |
| 75 | 9 | V-TMS/NBTON/MA | 0.011 | 0.85, 0.007 | 70 | 15 | 3590 |
| 76 | 10 | DecNB/NBTON/BuDMMINB/MA | 0.011 | 0.37, 0.003 | 70 | 15 | 0 |
| 77 | 11 | DecNB/NBTON/MGENB/MA | 0.011 | 0.37, 0.003 | 70 | 15 | <1 |

The amounts of maleic anhydride repeat units in the polymer samples were calculated based on the weight of the polymers present in the solution and the feed ratios used in the synthesis of these polymers. In some examples small amounts of NMP was added during amine treatments to facilitate solubility.

Examples 78-101

Amine treatments of d-IBU or 2,3,3-Trimethyl-1-pentene(TP)/NBTON/MA Polymers

The d-IBU/NBTON/MA polymers from Examples 12-14 were dissolved in PGMEA to obtain 30% (w/w) solutions (Examples 78-90). The TP/NBTON/MA polymers from Examples 15-16 were dissolved in GBL to obtain 30% (w/w) solution (Examples 91-101).

TABLE 8

Amine treatments of d-IBU or TP/NBTON/MA Terpolymer

| Ex. # | Poly. Ex. | Polymer | MA (mol) | 1-C$_8$H$_{17}$NH$_2$ (g, mol) | Temp. (°C.) | Time (hrs) | DR (nm/s) |
|---|---|---|---|---|---|---|---|
| 78 | 12 | d-IBU/NBTON/MA | 0.061 | 4.72, 0.037 | 60 | 15 | 750 |
| 79 | 12 | d-IBU/NBTON/MA | 0.012 | 0.46, 0.004 | 70 | 24 | 0 |
| 80 | 12 | d-IBU/NBTON/MA | 0.012 | 0.62, 0.005 | 70 | 24 | 80 |
| 81 | 12 | d-IBU/NBTON/MA | 0.012 | 0.77, 0.006 | 70 | 24 | 400 |
| 82 | 12 | d-IBU/NBTON/MA | 0.012 | 0.93, 0.007 | 70 | 24 | 690 |
| 83 | 12 | d-IBU/NBTON/MA | 0.003 | 2.27, 0.018 | 75 | 24 | 620 |
| 84 | 12 | d-IBU/NBTON/MA | 0.006 | 0.47, 0.004 | 50 | 15 | 1330 |
| 85 | 13 | d-IBU/NBTON/MA | 0.059 | 1.52, 0.012 | 60 | 15 | 0 |
| 86 | 13 | d-IBU/NBTON/MA | 0.058 | 2.24, 0.017 | 70 | 3 | 35 |
| 87 | 13 | d-IBU/NBTON/MA | 0.058 | 3.74, 0.029 | 60 | 15 | 2330 |
| 88 | 14 | d-IBU/NBTON/MA | 0.086 | 2.20, 0.017 | 70 | 18 | 220 |
| 89 | 14 | d-IBU/NBTON/MA | 0.064 | 3.30, 0.026 | 80 | 4 | 50 |
| 90 | 14 | d-IBU/NBTON/MA | 0.064 | 3.30, 0.026 | 90 | 4 | — |
| 91 | 15 | TP/NBTON/MA | 0.059 | 2.28, 0.018 | 75 | 15 | 190 |

TABLE 8-continued

Amine treatments of d-IBU or TP/NBTON/MA Terpolymer

| Ex. # | Poly. Ex. | Polymer | MA (mol) | 1-C$_8$H$_{17}$NH$_2$ (g, mol) | Temp. (° C.) | Time (hrs) | DR (nm/s) |
|---|---|---|---|---|---|---|---|
| 92 | 15 | TP/NBTON/MA | 0.059 | 2.28, 0.018 | 75 | 15 | 140 |
| 93 | 15 | TP/NBTON/MA | 0.035 | 1.35, 0.011 | 75 | 15 | — |
| 94 | 15 | TP/NBTON/MA | 0.059 | 7.61, 0.059 | 90 | 3 | — |
| 95 | 15 | TP/NBTON/MA | 0.004 | 0.52, 0.004 | 23 | 15 | — |
| 96 | 15 | TP/NBTON/MA | 0.004 | 0.52, 0.004 | 60 | 15 | — |
| 97 | 15 | TP/NBTON/MA | 0.004 | 0.52, 0.004 | 90 | 15 | — |
| 98 | 15 | TP/NBTON/MA | 0.004 | 0.52, 0.004 | 130 | 15 | — |
| 99 | 15 | TP/NBTON/MA | 0.004 | 0.52, 0.004 | 160 | 15 | — |
| 100 | 16 | TP/NBTON/MA | 0.200 | 10.3, 0.080 | 90 | 6 | 53 |
| 101 | 16 | TP/NBTON/MA | 0.160 | 20.6, 0.160 | 90 | 18 | 306 |

These polymer solutions were treated with 1-C$_8$H$_{17}$NH$_2$ according to the amounts and conditions as summarized in Table 8. The amount of maleic anhydride repeat units in the polymer samples were calculated based on the weight of the polymers present in the solution and the feed ratios used in the synthesis of these polymers. Small samples of selected polymers were precipitated into excess hexanes and dried at 40-60° C. in a vacuum oven for 15-24 hrs for FT-IR and $^{13}$C-NMR characterizations. The FT-IR and $^{13}$C-NMR analyses clearly showed that varied ratios of the repeat units of formulae (IIIA), (IIIB) and (IIIC) were formed depending upon the conditions employed as described herein, i.e., the temperature and time of the reaction had a significant effect on the formation of especially the repeat units of formula (IIIB) which had a clear impact on the DR of the polymer as summarized in Table 8.

Example 102

FT-IR Studies of Products of d-IBU/NBTON/MA and n-Octylamine

Figure 2:
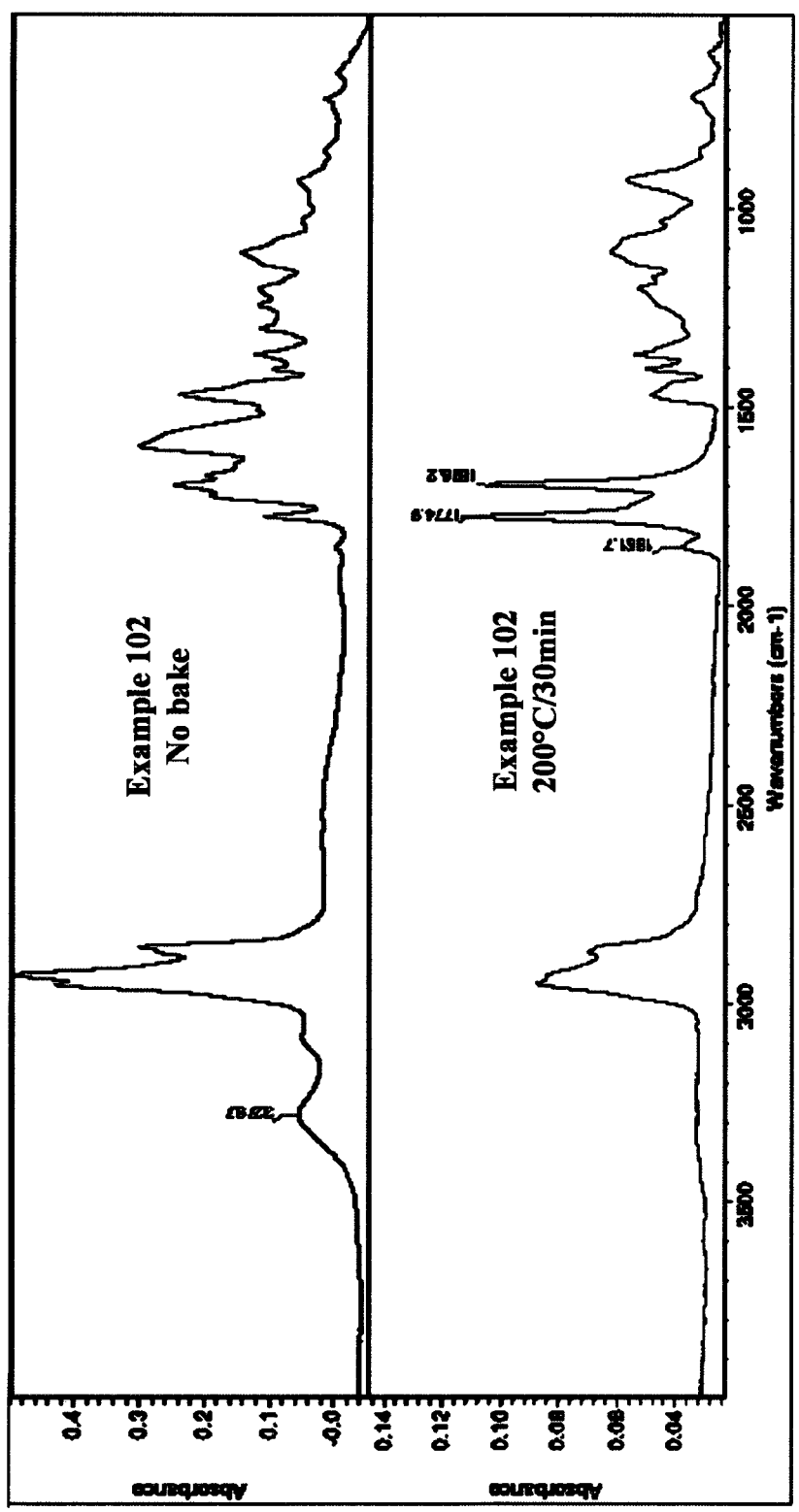
FIG. 2 shows the FT-IR spectra of the reaction products obtained from n-octylamine and d-IBU/NBTON/MA terpolymer on Si-wafers.

The polymer solution obtained from Example 97 was used to spin coat a film on Si-wafer and post exposure baked. The wafer was cleaved to two pieces and one piece was (a) not baked and used as such for the FT-IR studies as a control, and (b) the other piece was baked in an oven under nitrogen atmosphere at 200° C./30 min. The FT-IR spectra of coated films were measured and shown in FIG. 2. The composition of the product mixture changed during thermal treatment evidencing the formation of maleimide repeat unit (MI, 1700 cm$^{-1}$) and maleic anhydride repeat unit (MA, at about 1775 and 1850 cm$^{-1}$).

Example 103-107

Amine Treatments of Isobam-600

Six different batches of Isobam-600 were dissolved in NMP to make 20-30% (w/w) solution. To these solutions specified amounts of 1-C$_7$H$_{15}$NH$_2$ was added as summarized in Table 9 and stirred at 23° C. for 15 hrs The amounts of maleic anhydride repeat units in the polymer samples were calculated based on the weight of the polymers present in the solution and the compositions reported by Kuraray for Isobam-600 (IBU/MA=50/50). Films were spin coated on Si-wafer from these solutions and their dissolution rates in 2.38% TMAH was determined. For comparative purposes a comparative Example is also provided in Table 9, designated as Comp. Ex., which clearly shows that when amine is not added to the polymer, resulting solution exhibits a DR of zero that means that it is not suitable for imaging.

TABLE 9

Amine treatments of Isobam-600

| Ex. # | Polymer (g) | NMP (g) | MA (mol) | 1-C$_7$H$_{15}$NH$_2$ (g, mol) | DR (nm/s) |
|---|---|---|---|---|---|
| Comp. Ex. | 3 | 12 | 0.02 | Not used | 0 |
| 103 | 20 | 50 | 0.13 | 3.50, 0.03 | 2 |
| 104 | 3 | 12 | 0.02 | 0.92, 0.01 | 15 |
| 105 | 20 | 50 | 0.13 | 7.00, 0.06 | 400 |
| 106 | 3 | 12 | 0.02 | 1.38, 0.01 | 1290 |
| 107 | 3 | 12 | 0.02 | 1.84, 0.02 | 1700 |

Examples 108-116

Amine Treatment of NB/MA Copolymer with Alkyl Amines

Various copolymers of NB/MA as described in Example 1 and Example 1A through 1C can be used in this Example 108 to form various amine treated polymers of this invention.

The NB/MA copolymer (5 g) was dissolved in MEK to obtain 20 wt. % solution and corresponding amounts of amine as listed in Table 10 were added to the reaction vessel and stirred at room temperature for 2-3 hrs. After the specified reaction times, excess formic acid was added and washed with water three times. Portions of these amine treated solutions were added to excess hexanes and the solids obtained were washed with hexanes. The amine treated solid polymers were dried in a vacuum oven at room temperature for overnight. Dissolution rates of thin films spun on Si-wafers in 2.38% (w/w) TMAH were measured for these solutions. Various amine treated polymers prepared in this fashion and the molecular weights obtained therefor are summarized in Table 10.

TABLE 10

Amine treatments of NB/MA Copolymers

| ROMI Ex. No. | Polymer Ex. No. | Amine | Amine (g, mol) | M$_w$ | M$_n$ |
|---|---|---|---|---|---|
| 108 | IA | 1-C$_4$H$_9$ | 3.9, 0.053 | 10780 | 6170 |
| 109 | IA | 1-C$_8$H$_{17}$ | 6.8, 0.053 | 13350 | 7030 |
| 110 | IA | 1-C$_{12}$H$_{25}$ | 10.6, 0.057 | 18000 | 10360 |
| 111 | IB | 1-C$_{12}$H$_{25}$ | 10.6, 0.057 | 7650 | 4550 |
| 112 | IC | 1-C$_{12}$H$_{25}$ | 10.6, 0.057 | 9500 | 5250 |
| 113 | IA | 1-C$_{16}$H$_{33}$ | 13.8, 0.057 | 21050 | 12170 |

TABLE 10-continued

Amine treatments of NB/MA Copolymers

| ROMI Ex. No. | Polymer Ex. No. | Amine | Amine (g, mol) | $M_w$ | $M_n$ |
|---|---|---|---|---|---|
| 114 | IB | 1-$C_{16}H_{33}$ | 13.8, 0.057 | 9390 | 5370 |
| 115 | IC | 1-$C_{16}H_{33}$ | 13.8, 0.057 | 11380 | 6940 |
| 116 | IA | 1-$C_{18}H_{37}$ | 15.3, 0.057 | 22660 | 13430 |

Example 117

Polymer Composition/Formulations of ROMI Polymers

Hereinafter Referred to as "FP"

Selected ROMI polymers obtained from Examples 20 to 116 were formulated into various polymer compositions/formulations of this invention using one of the following protocols:

(A) Polymers dissolved in PGMEA to form 25 to 35 wt. % solution, and used as such. These compositions contained no other additives.

(B) Polymers dissolved in NMP to form 25 to 35 wt. % solution, and used as such. These compositions contained no other additives.

(C) Polymers dissolved in GBL to form 25 to 35 wt. % solution, and used as such. These compositions contained no other additives.

(D) Polymers dissolved in PGMEA or NMP to form 25 to 35 wt. % solutions and TrisP 3M6C-2-201 (20 wt. % of the polymer, i.e., 20 parts per hundred parts of polymer, 20 pphr) added.

(E) Polymers dissolved in PGMEA to form 25 to 35 wt. % solutions and TrisP 3M6C-2-201 (25 wt. % of the polymer, i.e., 25 parts per hundred parts of polymer, 25 pphr) added.

(F) Polymers dissolved in NMP to form 25 to 35 wt. % solutions and TrisP 3M6C-2-201 (25 wt. % of the polymer, i.e., 25 parts per hundred parts of polymer, 25 pphr) added.

(G) Polymers dissolved in PGMEA to form 25 to 35 wt. % solutions and TrisP 3M6C-2-201 (27.5 wt. % of the polymer, i.e., 27.5 parts per hundred parts of polymer, 27.5 pphr) added.

(H) Polymers dissolved in PGMEA to form 25 to 35 wt. % solutions and TrisP 3M6C-2-201 (30 wt. % of the polymer, i.e., 30 parts per hundred parts of polymer, 30 pphr) added.

(I) Polymers dissolved in NMP to form 25 to 35 wt. % solutions and TrisP 3M6C-2-201 (30 wt. % of the polymer, i.e., 30 parts per hundred parts of polymer, 30 pphr) added.

(J) Polymers dissolved in PGMEA to form 25 to 35 wt. % solutions and TrisP 3M6C-2-201 (25 wt. % of the polymer, i.e., 25 parts per hundred parts of polymer, 25 pphr) and Si-75 (3 wt. % of the polymer, i.e., 3 parts per hundred parts of polymer, 3 pphr) added.

(K) Polymers dissolved in GBL to form 25 to 35 wt. % solutions and TrisP 3M6C-2-201 (25 wt. % of the polymer, i.e., 25 parts per hundred parts of polymer, 25 pphr) and Si-75 (3 wt. % of the polymer, i.e., 3 parts per hundred parts of polymer, 3 pphr) added.

Additionally, various amounts of cross linkers (TMPTGE, PEGDGE, PPGDGE, EPON-862, Heloxy-65, Heloxy-84 or GE-36 and BY16-115) were also added to the formulations.

Example 118

Spin Coating Procedures

The polymer compositions made in accordance with one of the protocols set forth in Example 108 were spin coated on to a suitable substrate using one of the following spin protocols (hereinafter referred to as "SP"):

(A) A formulation of Example 117 was spun onto a suitable substrate such as a silicon wafer at 200-700 rpm for 30-40 seconds;

(B) A formulation of Example 117 was spun onto a suitable substrate such as a silicon wafer first at 500 rpm for 10 seconds and then at 600-2200 rpm for 30 seconds.

Example 119

Post Apply Bake (PAB) Protocols

The spin coated samples from Example 118 were post apply baked (hereinafter referred to as "PAB") using any one of the following procedures:
(A) 90° C./5 min; (B) 100° C./3 min; (C) 100° C./5 min; (D) 110° C./3 min; (E) 110° C./5 min; (F) 115° C./3 min; (G) 115° C./5 min; (H) 120° C./3 min; (I) 120° C./5 min; (I) 130° C./3 min; (J) 105° C./3 min.

Example 120

Cure Protocols

The spin coated film samples formed in accordance with the procedures set forth in one of Examples 109 were baked, if needed, on a hot plate in air or in an oven under nitrogen atmosphere to remove residual solvents from the films or to obtain thermally cured films or to apply thermal stress to the films. Any one of the following cure protocols was used: (A) 130° C./30 min; (B) 150° C./30 min; (C) 150° C./60 min; (D) 180° C./30 min; (E) 180° C./60 min; and (F) 180° C./120 min; (G) 200° C./30 min; (H) 200° C./60 min; (I) 200° C./120 min; (J) 220° C./60 min.

Example 121

Aqueous Base Development

The spin coated substrates as obtained in Examples 109 were imagewise exposed to a suitable actinic radiation either using a patterned mask or without a mask and then developed as follows. The exposed spun coated substrate was immersed in developer (2.38 wt. % TMAH) for various times (immersion development). The unexposed area film thickness loss or dark field loss (DFL) of the films that were formulated for positive tone (PT) image development was determined by measuring the film thicknesses before and after development in an unexposed region of the film and reported as percent loss of the film thickness in areas of the film that was not exposed to the radiation.

Example 122

Photo Imaging Studies

Selected polymers from Examples 20 through Example 116 were formulated into polymer compositions using one of the procedures set forth in Example 117. The formulations so formed were spun onto 4 inch thermal oxide silicon wafer using one of the procedures as set forth in Example 118 and post apply baked (PAB) in accordance with one of the procedures set forth in Example 119 to obtain a polymer film of about 10 microns. After exposure through a mask, the wafer was developed in accordance with the procedures set forth in Example 121 using 2.38 wt. % TMAH developer. The exposure dose (EXD) is reported in $mJ/cm^2$, where such is reflective of both the energy of a broad band Hg-vapor light source used to expose (at 365 nm using a band pass filter) the sample and the time of that exposure. In general, all of the samples exhibited good film properties.

Example 123

Photo Imaging Studies

Example 122 was substantially repeated in this Example 123 except that the polymer of Example 48 was used. The polymer (50.3 g) of Example 48 was dissolved in GBL (97.3 g) and was further mixed with 27.5 wt. % TrisP, 3 wt. % Si-75, 5 wt. % AO-80 antioxidant and 5 wt. % Nauguard-445. To this mixture was then added various amounts of cross linkers as listed in Table 11, the numbers listed therein are pphr, i.e., parts per hundred parts of resin (i.e., polymer of Example 48). All of the samples were spun onto 4 inch thermal oxide silicon wafer using the procedures as set forth in Example 118(B). The samples were then exposed to suitable exposure dose (EXD) and developed in 2.38 wt. % TMAH in accordance with the procedures set forth in Example 121. The samples were then analyzed for film thickness (FT), percent dark field loss (DFL) and resolution of the images. The photo imaging results are summarized in Table 11.

TABLE 11

| TMPTGE (%) | GE-36 (%) | BY16-115 (%) | Ex. 119 (PAB) | FT (μm) | EXD (mJ/cm²) | DFL (%) | Develop (sec) | Resolution |
|---|---|---|---|---|---|---|---|---|
| 35 | | | B | 10 | 650 | 0.5 | 60 | 7 μm trench |
| | 5 | 60 | J | 10.8 | 350 | 18 | 7 | 2 μm trench |
| | 20 | 50 | J | 10.4 | 350 | 16 | 12 | 2 μm trench |

Example 124

Pattern Retention after Thermal Cure

Figure 3:
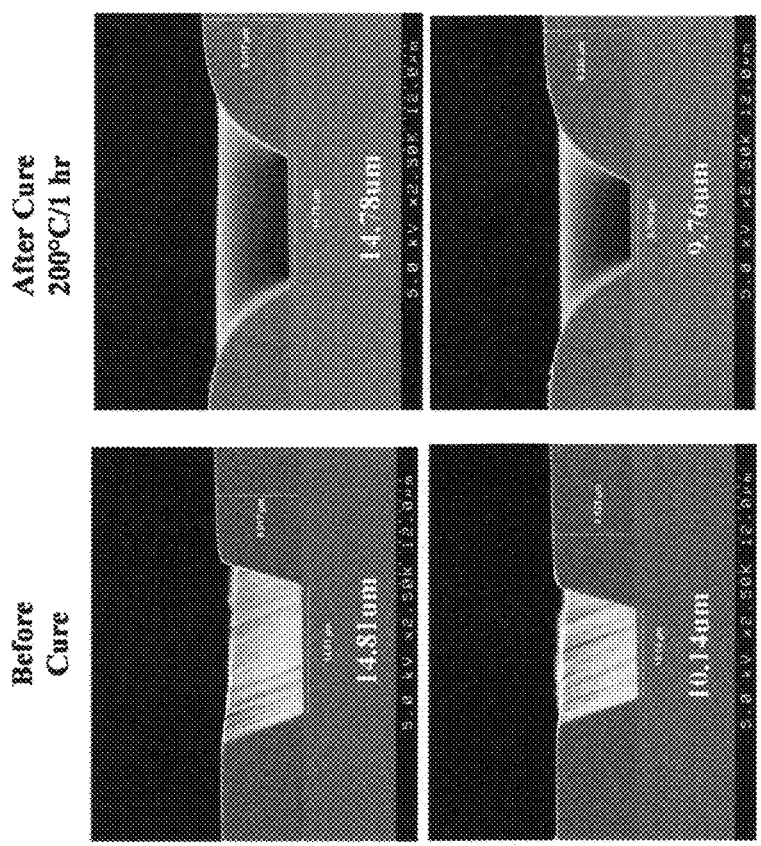
FIG. 3 shows cross sectioned SEM photographs of imaged trenches and contact holes before and after cure in accordance with one of the embodiments of this invention.

Selected imaged films on silicon wafers from Example 122 were subjected to one or more cure protocols as described in Example 120. The image quality or pattern integrity before and after cure process was gauged as good or bad based on the top-down enhanced photographs taken using a microscope or SEM images of cross-sections of the features. FIG. 3 shows the cross sectioned SEM profiles of such an experiment. The polymer formed in accordance with Example 31 was formulated using the formulation protocol in accordance with Example 117 (FP, J) and using 35 wt. % TMPTGE as a cross-linking agent. A film (FT=10.11 μm) was spun on thermal oxide silicon wafer in accordance with Example 109 (SP, B) and post apply baked in accordance with Example 119 at 115° C. for 3 minutes (PAB protocol, F). After exposure through a mask at 500 $mJ/cm^2$, the wafer was developed in accordance with the procedures set forth in Example 121 using 2.38 wt. % TMAH developer (90 sec) to obtain a pattern. The dark field loss (DFL) after development was 8%. Cross sectioned SEM photographs of imaged trenches and contact holes were taken and the imaged wafer was subjected to cure protocol 'H' as set forth in Example 120 and cross sectioned SEM photographs were taken. As can be seen from FIG. 3, the trench width of 14.81 μm can be achieved. The feature lost only about 0.2% of this dimension after cure while the trench width of 10.14 μm feature lost only about 4% of this dimension indicating good pattern integrity retention.

Example 125

Transparency Measurements (% T)

Selected polymers from Examples 20 through Example 116 were formulated into polymer compositions using one of the procedures set forth in Example 117 (FP, A). The formulations so formed were spun onto 4 inch glass substrates using one of the procedures as set forth in Example 118 (SP, A or B) and post apply baked (PAB) in accordance with one of the procedures set forth in Example 119 (PAB, I) to obtain a polymer film of about 3 microns, then exposed at 1 $J/cm^2$ (at 365 nm) using a broad band Hg vapor light source (g, h and i bands, flood exposure at 365 nm using a band pass filter). After exposure, the glass substrate coated with the film was subjected to cure protocol T as set forth in Example 120 on a hot plate in air, and the transparency (% T) of the film at 400 nm wavelength was measured by using Cary 100 UV-Visible Spectrophotometer. The measured film thickness and the observed pre- and post-cured transparency of the films are summarized in Table 12. The transparency (% T) reported in Table 12 are normalized to 3 μm film thickness.

TABLE 12

| Polymer Ex # | Ex. 118 (SP) | FT (μm) | % T (PAB) | % T (Cure 'J') |
|---|---|---|---|---|
| 35 | B | 3.90 | 99 | 98 |
| 36 | B | 3.62 | 99 | 98 |
| 37 | B | 3.80 | 100 | 98 |
| 65 | A | 4.21 | 99 | 97 |
| 84 | B | 3.66 | 100 | 96 |

Examples 126-129

Dielectric Constant Measurements

Each of polymer sample from SMA3000 (Styrene/MA, 75/25) and the polymer of Example 15 (d-IBU/NBTON/MA, 30/20/50) were dissolved in PGMEA to obtain polymer solutions of 20 wt. % each. These solutions were treated with 1-$C_4H_9NH_2$ or 1-$C_8H_{17}NH_2$ as described in Example 20 and to the resulting solution was added TrisP 3M6C-2-201 (25 wt. % based on the polymer weight) and TMPTGE (20 wt. % based on the polymer weight). Similarly, a solution of CVX50208 (Styrene/ROMI, 66/33) was dissolved in PGMEA to form a 20 wt. % solution and to this solution was added TrisP 3M6C-2-201 (25 wt. % based on the polymer weight) and TMPTGE (20 wt. % based on the polymer weight). The formulations were then spun onto an aluminum plate (200 µm thickness, 100 mm×100 mm) at 300 rpm for 23 sec, soft baked at 110° C. for 100 sec to obtain polymer films of about 3 microns, then exposed at 500 mJ/$cm^2$ using a mask aligner having a broad band Hg vapor light source (g, h and i bands). After exposure, the wafers were post-exposure baked at 220° C. for 60 min under nitrogen atmosphere to obtain cured films. The dielectric constants of the films were measured following the technique of JIS-K6911, a Japanese Industrial Standard. The film thicknesses were measured by using Dainippon Screen MFG CO., LTD. Lambda ace VM-1020. Dielectric constant measurements are summarized in Table 13.

TABLE 13

| | | | % MA | Dielectric constant | | | |
|---|---|---|---|---|---|---|---|
| Ex # | Polymer | Amine | treated | 1 kHz | 10 KHz | 100 kHz | 1 MHz |
| 126 | CVX50208 | 1-$C_4H_9NH_2$ | 100 | 3.4 | 3.3 | 3.3 | 3.2 |
| 127 | SMA3000 | 1-$C_4H_9NH_2$ | 100 | 3.4 | 3.2 | 3.2 | 3.1 |
| 128 | Poly. Ex. 15 | 1-$C_8H_{17}NH_2$ | 50 | 3.9 | 3.7 | 3.6 | 3.4 |
| 129 | Poly. Ex. 15 | 1-$C_8H_{17}NH_2$ | 100 | 4.3 | 4.0 | 3.8 | 3.6 |

Example 130

Thermal Decomposition Measurements by TGA Weight Loss

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, 120° C./3 min, H) to obtain a polymer film. The wafer was baked in an oven according to the cure protocols in Example 120 (cure protocol at 200° C./60 min, H) under nitrogen atmosphere. The film was removed from the wafer and dynamic TGA was run at room temperature to about 500° C. at 10° C./min heating rate. Thermal decomposition temperatures at 5 wt. % loss ($T_{d5}$) and 50 wt. % loss ($Td_{50}$) were determined and summarized in Table 14.

TABLE 14

| Polymer Ex # | Formulation Ex. 117 (FP) | TMPTGE (%) | Heloxy-84 (%) | $T_{d5}$ (° C.) | $T_{d50}$ (° C.) |
|---|---|---|---|---|---|
| 32 | J | 50 | 0 | 287 | 384 |
| 32 | J | 25 | 25 | 314 | 373 |
| 32 | J | 25 | 50 | 324 | 378 |
| 47 | K | 50 | 0 | 310 | 381 |
| 47 | K | 25 | 25 | 313 | 375 |
| 47 | K | 25 | 50 | 315 | 383 |

Example 131

Glass Transition Temperature Measurements

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, 120° C./3 min, H) to obtain a polymer film. The wafer was baked in an oven according to the cure protocols in Example 120 (cure protocol at 200° C./60 min, H) under nitrogen atmosphere. The film was removed from the wafer and glass transition temperatures measured using TMA, DSC and DMA techniques. $T_g$ measurements are summarized in Table 15.

Example 132

Coefficient of Thermal Expansion (CTE) Measurements

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, 120° C./3 min, H) to obtain a polymer film. The wafer was baked in an oven according to the cure protocols in Example 120 (cure protocol at 200° C./60 min, H) under nitrogen atmosphere. The film was removed from the wafer and the coefficients of thermal expansion (CTE) were measured using TMA. The CTE measurements are summarized in Table 15.

TABLE 15

| Polymer Ex # | Formulation Ex. 117 (FP) | TMPTGE (%) | Heloxy-84 (%) | T$_g$, TMA (°C.) | T$_g$, DSC (°C.) | T$_g$, DMA (°C.) | CTE, TMA (ppmK$^{-1}$) |
|---|---|---|---|---|---|---|---|
| 32 | J | 50 | 0 | 157 | 153 | 174 | 85 |
| 32 | J | 25 | 25 | 122 | 134 | 151 | 463 |
| 32 | J | 25 | 50 | 103 | 127 | 133 | 138 |
| 47 | K | 50 | 0 | 160 | 168 | 180 | 77 |
| 47 | K | 25 | 25 | 122 | 136 | 147 | 86 |
| 47 | K | 25 | 50 | 100 | 124 | 127 | 138 |

Example 133

Tensile Property Measurements

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, 120° C./3 min, H) to obtain a polymer film. The wafer was baked in an oven according to the cure protocols in Example 120 (cure protocol at 200° C./60 min, H) under nitrogen atmosphere. The film was removed from the wafer and the tensile properties were measured using Instron. Tensile property measurements are summarized in Table 16.

TABLE 16

| Polymer Ex # | Formulation Ex. 117 (FP) | TMPTGE (%) | Heloxy-84 (%) | Young's Modulus (GPa) | Tensile Strength (MPa) |
|---|---|---|---|---|---|
| 32 | J | 50 | 0 | 2.8 | 58 |
| 32 | J | 25 | 25 | 2.3 | 47 |
| 32 | J | 25 | 50 | 1.6 | 34 |
| 47 | K | 50 | 0 | 3.0 | 58 |
| 47 | K | 25 | 25 | 2.4 | 55 |
| 47 | K | 25 | 50 | 1.7 | 35 |

Example 134

Elongation to Break Measurements

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, 120° C./3 min, H) to obtain a polymer film. The wafer was baked in an oven according to the cure protocols in Example 120 (cure protocol at 200° C./60 min, G) under nitrogen atmosphere. The film was removed from the wafer and the Elongation to break (ETB) was measured using Instron. ETB measurements are summarized in Table 17.

Example 135

Wafer Stress Measurements

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, 120° C./3 min, H) to obtain a polymer film. The wafer was baked in an oven according to the cure protocols in Example 120 (cure protocol A through G) under nitrogen atmosphere. The wafer stress was measured using a Profilometer. Wafer stress measurements are summarized in Table 17.

TABLE 17

| Polymer Ex # | Formulation Ex. 117 (FP) | TMPTGE (%) | Heloxy-84 (%) | Ex. 120 Cure | ETB (%) | Wafer stress (MPa) |
|---|---|---|---|---|---|---|
| 32 | J | 50 | 0 | H | 6 | 28 |
| 32 | J | 25 | 25 | H | 10 | 15 |
| 32 | J | 25 | 50 | H | 32 | 6 |
| 32 | J | 25 | 25 | H | 10 | 15 |
| 34 | J | 50 | 0 | H | 1.4 | 19 |
| 47 | K | 50 | 0 | H | 3 | 36 |
| 47 | K | 25 | 25 | H | 11 | 14 |
| 47 | K | 25 | 50 | H | 21 | 6 |
| 48 | K | 50 | 0 | H | 0.6 | 29 |

Example 136

Surface Roughness Measurements

Selected polymers from Examples 20 through Example 116 were formulated into polymer compositions using one of the procedures set forth in Example 117 (FP, A through J). The formulations so formed were spun onto 4 inch thermal oxide silicon wafer using one of the procedures as set forth in Example 118 (SP, B) and post apply baked (PAB) in accordance with one of the procedures set forth in Example 119 (PAB protocol, G for polymer Example 47 containing TMPTGE and heloxy-4 and H for others) to obtain a polymer film. The surface roughness of the film was measured as $R_a$, $R_q$ and $R_t$ parameters using a Profilometer. Surface roughness measurements are summarized in Table 18.

TABLE 18

| Polymer Ex # | Formulation Ex. 117 (FP) | TMPTGE (%) | Heloxy-84 (%) | $R_a$ (nm) | $R_q$ (nm) | $R_t$ (nm) | Surface roughness |
|---|---|---|---|---|---|---|---|
| 32 | J | 50 | 0 | 13 | 30 | 487 | good |
| 32 | J | 25 | 25 | 12 | 32 | 509 | good |
| 32 | J | 25 | 50 | 92 | 148 | 3 | bad |
| 47 | K | 50 | 0 | 5 | 9 | 121 | good |
| 47 | K | 25 | 25 | 12 | 44 | 619 | good |
| 47 | K | 25 | 50 | 8 | 20 | 245 | good |

Example 137

Thermal Cycling Evaluation

Table 19 lists the polymer, formulation, photo-imaging, pattern integrity after cure, thermal cycling (TCT), surface roughness and wafer stress properties of the Examples of this invention.

TABLE 19

| Polymer Ex # | Formulation Ex. 108 (FP) | TMPTGE (%) | Photo imaging | Cure[a] | TCT | Surface roughness | Wafer stress (MPa) |
|---|---|---|---|---|---|---|---|
| 31 | J | 35 | Good | Good | Good | Good | 20 |
| 45 | K | 35 | Good | Good | Good | Good | 20 |
| 89 | J | 50 | Good | Good | Good | Good | 19 |

[a] quality of image after cure

Example 138

Film Swelling Tests

Various polymers as described in Examples 108 through 116 were formulated using the procedures as set forth in Example 117 and using the following ingredients: PA-28 (32.5 pphr), VG3101L (60 pphr), EHPE 3150 (80 pphr), KBM-303 (10 pphr), F-557 (0.7 pphr) in MAK (240 pphr) and PGME (160 pphr).

The formulations as made above were used to coat films (3.0-3.5 μm thick) on bare Si-substrates. These coated films were then baked at 230° C. for 60 minutes in Air. The film thicknesses of the baked films were measured using Optical film thickness meter (Dainippon Screen MFG CO., LTD. Lambda ace VM-1020). The baked films were immersed in a solvent mixture of 30 wt. % DMSO and 70 wt. % monoethanolamine at 70° C. for 15 minutes. The film thicknesses (FT) of these films were measured after this immersion in DMSO/MEA (30/70, wt./wt.) solvent mixture. These coated films were subjected to a 'recover bake' at 230° C. for 15 minutes and the film thicknesses (FT) were measured again. The results of these swelling tests are summarized in Table 20. The swelling of the films calculated as the percent increase in film thickness after bake, after immersion in DMSO/MEA and after recover bake shows that the amine-treated polymers exhibit minimum swelling (examples 4A and 5A2), no swelling (example 5A1) or minimum film thickness loss (example 7A) compared with the COMA polymer of NB/MA which is ring opened with 1-BuOH of Comparative Example 3. From this it is evident that the polymers of this invention, i.e., ROMI polymers generally exhibit superior properties when compared with ROMA polymers (Comparative Example 3). The polymer examples with a letter designation such as Example 108A and Example 113A means that these polymers were made essentially using the procedures of respective example but is from a different batch thus may feature somewhat different properties such as for example molecular weight.

TABLE 20

Swelling Test of ROMA and ROMI Polymers

| Polymer Example | Ring-open reagent | % FT increase after DMSO/MEA immersion | % FT change after recover bake |
|---|---|---|---|
| Comp. 3 | 1-$C_4H_9$OH | 23% | 8% |
| 108A | 1-$C_4H_9NH_2$ | 23% | 9% |
| 109 | 1-$C_8H_{17}NH_2$ | 11% | 5% |
| 111 | 1-$C_{12}H_{25}NH_2$ | 11% | 0% |
| 112 | 1-$C_{12}H_{25}NH_2$ | 13% | 2% |
| 113A | 1-$C_{16}H_{33}NH_2$ | 9% | -1% |

Example 139

Dissolution Studies

Similar formulations as used in Example 138 to measure the swelling properties were also used in this dissolution behavior studies employing various ROMI polymers having different molecular weights. The formulations were spun on Si-substrates. Their dissolution rate in 2.38% tetramethylammonium (TMAH) hydroxide was measured visually. Table 21 summarizes various ROMI polymers used in this study along with their weight average molecular weight (Mw), dissolution rate (DR) together with the observations made during DR measurements as to whether a residue generation was observed or not. The non-generation of residue when these films are developed with 2.38% TMAH is desired. As summarized in Table 21 the film spun from the formulation from Example 111 did not generate residue during development. The polymer Examples 111 and 111A used in the formulations achieved both desired dissolution properties in 2.38% TMAH as well as desired swelling properties in DMSO/MEA. It is further evident from the data presented in Table 21 that the polymers of this invention generally exhibit superior properties when compared with the formulations made in accordance with the ROMA polymers, Comparative Example 3.

TABLE 21

Dissolution Studies

| Polymer Example | Ring-open reagent | $M_w$ | DR (Å/sec) | Residue |
|---|---|---|---|---|
| Comp. 3 | 1-C$_4$H$_9$OH | 10,780 | 1530 | No |
| 109A | 1-C$_8$H$_{17}$NH$_2$ | 13,350 | 850 | No |
| 111 | 1-C$_{12}$H$_{25}$NH$_2$ | 7,650 | 990 | No |
| 111A | 1-C$_{12}$H$_{25}$NH$_2$ | 9,500 | 1080 | No |
| 113 | 1-C$_{16}$H$_{33}$NH$_2$ | 21,050 | 180 | Yes |
| 114 | 1-C$_{16}$H$_{33}$NH$_2$ | 9,390 | 560 | Yes |
| 115 | 1-C$_{16}$H$_{33}$NH$_2$ | 11,380 | 240 | Yes |
| 116 | 1-C$_{18}$H$_{37}$NH$_2$ | 22,660 | 40 | Yes |

Example 140

Transparency Measurements (% T)

A polymer from Example 108 was formulated with PA-28 (32.5 pphr), TMPTGE (30 pphr), KBM-303 (10 pphr), F-557 (1 pphr) in MAK (240 pphr) and PGME (160 pphr) and a polymer from Example 111 was formulated with TrisP 3M6C-2-201 (32.5 pphr), TMPTGE (30 pphr), KBM-303 (10 pphr) and F-557 (1 pphr) in MAK (240 pphr) and PGME (160 pphr). These formulations were spun onto a glass plate at 300 rpm for 23 sec, soft baked at 110° C. for 100 sec to give a polymer film of about 3 µm, then exposed at 500 mJ/cm$^2$ using a mask aligner having a broad band Hg vapor light source (g, h and i bands). After exposure, the wafer was post-exposure baked at 230° C. for 60 min under nitrogen atmosphere to obtain a cured film. The transparency of the film at 400 nm wavelength was measured by using ultraviolet-visible spectroscope (Hitachi U-2000). The results are summarized in Table 22.

Example 141

Dielectric Constant (k) Measurements

The formulations from polymer Example 108 and 111 as described for transparency measurements in Example 140 were spun onto an low resistance 4 inch Si bare wafer at 300 rpm for 23 sec, soft baked at 110° C. for 100 sec to give a polymer film of about 3 microns, then exposed at 500 mJ/cm$^2$ using a mask aligner having a broad band Hg vapor light source (g, h and i bands). After exposure, the wafer was post-exposure baked at 230° C. for 60 min under nitrogen atmosphere to obtain a cured film. The dielectric constant of the film was measured following the technique of JIS-K6911, a Japanese Industrial Standard. The film thickness was measured by using Dainippon Screen MFG CO., LTD. Lambda ace VM-1020. The results are summarized in Table 22.

Example 142

5% Weight Loss Temperature ($T_{d5}$) Measurement

The formulations from polymer Example 108 and 111 as described for transparency measurements in Example 140 were spun onto 4 inch thermal oxide silicon wafer at 300 rpm for 23 sec, soft baked at 110° C. for 100 sec to give a polymer film of about 3 microns, then exposed at 500 mJ/cm$^2$ using a mask aligner having a broad band Hg vapor light source (g, h and i bands). After exposure, the wafer was post-exposure baked at 220° C. for 60 min under nitrogen atmosphere to obtain a cured film. The film was removed from the wafer and 5% weight loss temperature ($T_{d5}$) of the film was measured by TGDTA. The measurement condition was 10° C./min under nitrogen flow.

The transparency data from Example 140, dielectric constant from Example 141 and 5% weight loss temperature ($T_{d5}$) from Example 142 for the formulated films are summarized in Table 22.

TABLE 22

| Polymer Example | % T | $T_{d5}$ (° C.) | k (10 kHz) | k (100 kHz) | k (1 MHz) |
|---|---|---|---|---|---|
| 108 | 83 | 330 | 2.6 | 2.6 | 2.5 |
| 111 | 53 | 321 | 2.5 | 2.4 | 2.3 |

Example 143

Polymers in Examples 26 and 27 were formulated with TrisP-2 (25 wt. %), TMPTGE (35 wt. %) and Si-75 (3 wt. %). These formulated polymers were spun coated on thermal oxide silicon wafers and soft baked at 110° C. for 3 min each. The photo imaging capability of these polymer formulations were tested following substantially the procedures as described in Example 122 (photo imaging studies). The results of these studies are summarized in Table 23. The dark field loss (DFL) of these formulated films show that when a polymer with lower molar content of the repeat units of formula (IIIB) is used (i.e., polymer Example 26) the DFL is higher (22% loss) than when a polymer with an increased molar content of the repeat units of formula (IIIB) (i.e., polymer Example 27) the DFL loss is low (5% loss).

TABLE 23

Comparison of DFL

| Poly Ex # | Amine treatment temperature/time | DR | Develop time | DFL (%) |
|---|---|---|---|---|
| 26 | 60° C./4 hrs | 1051 nm/s | 40 sec | 22% |
| 27 | 60° C./4 hrs | 204 nm/s | 40 sec | 5% |

The following Comparative Examples 1 to 3 are provided to show the comparative properties obtained for the corresponding ring opened maleic anhydride copolymers (ROMA) by the reaction of alcohols with copolymers of maleic anhydride with other olefinic monomers (COMA) as described in any one of the Examples 1 to 19 hereinabove.

Comparative Example 1

ROMA Conversion of PENB/MA with 1-C$_4$H$_9$OH

An appropriately sized reaction vessel was loaded with NaOH (5.5 g, 138 mmol), 1-C$_4$H$_9$OH (52 g, 700 mmol) and THF (40 g). The mixture was allowed to stir for about 2 hrs at 60° C., then an aliquot (100 g) of the polymer solution obtained in Example 19 was added to the reaction mixture, and maintained at 60-70° C. After about 20 hrs of the reaction at 60-70° C., the mixture was cooled to room temperature. The reaction mixture was then protonated with aqueous conc. hydrochloric acid (30 g) and stirred for 30 minutes. DI water (100 mL) added, stirred for 10 minutes and the aqueous layer removed. The polymer solution was then washed seven times (100 mL each wash) to remove residual salts and acid. Adequate amount of THF (about 20 g) was added during each wash to facilitate the phase separation. The organic phase was separated and the polymer was precipitated in hexanes (about 6 fold excess). The resulting slime was re-dissolved in THF (100 g) and the precipitation in excess hexanes was repeated. The solid polymer was finally separated by filtration and dried in a vacuum oven at 70° C. for 15 hrs to obtain 29 g of solid. (GPC (THF) $M_w$=5,150, $M_n$=2,800, yield=63%). FT-IR spectrum run in KBr pellet confirmed ring opening of the maleic anhydride repeat units as evidenced by the disappearance of anhydride carbonyl absorption peaks at 1776 and 1855 cm$^{-1}$, and the emergence of a broad peak at 1732 cm$^{-1}$ (for —C=O of ester and carboxylic acid) and a broad peak centered around 3100 cm$^{-1}$ (for —OH of the carboxylic acid).

Comparative Example 2

ROMA Conversion of SMA1000 with 1-$C_4H_9OH$

An appropriately sized reaction vessel was loaded with NaOH (11 g, 275 mmol), 1-$C_4H_9OH$ (102 g, 1200 mmol), Toluene (50 g) and THF (50 g). The mixture was allowed to stir for about 2 hrs at 60° C. To this mixture was added SMA1000 (50 g) dissolved in THF (80 g), and the reaction mixture was maintained at 60-70° C. After about 20 hrs of the reaction at 60-70° C., the mixture was cooled to room temperature. The reaction mixture was then protonated with aqueous conc. hydrochloric acid (57 g) and stirred for 15 minutes. DI water (200 mL) added, stirred for 15 minutes and the aqueous layer removed. The polymer solution was then washed six times (200 mL each wash) to remove residual salts and acid. Adequate amount of THF (about 25 g) was added during each wash to facilitate the phase separation. The organic phase (about 400 g) was separated and the polymer was precipitated in hexanes (about 6 fold excess). The resulting slime was dried in a vacuum oven at 60° C. for 15 hrs to obtain 54 g of solid. (GPC (THF) $M_w$=4,800, $M_n$=3,050, yield=79%). FT-IR spectrum run in KBr pellet confirmed ring opening of the maleic anhydride repeat units as evidenced by the disappearance of anhydride carbonyl absorption peaks at 1780 and 1856 cm$^{-1}$, and the emergence of a broad peaks at 1709 cm$^{-1}$ (for —C=O of ester) and 1709 cm$^{-1}$ (for —C=O of carboxylic acid) and a broad peak centered around 3100 cm$^{-1}$ (for —OH of the carboxylic acid).

Comparative Example 3

ROMA Conversion of NB/MA Copolymer with 1-$C_4H_9OH$

Maleic anhydride (MA, 98.1 g, 1 mol), norbornene (NB, 94.2 g, 1 mol) and dimethyl 2,2'-azobis(2-methylpropionate) (9.2 g, 40 mmol) was dissolved in toluene (37 g) and MEK (340 g) and charged to an appropriately sized reaction vessel. The solution was sparged with nitrogen for 10 min to remove oxygen and then heated with stirring to 70° C. The mixture was allowed to stir at 70° C. for 16 hrs. The reaction mixture was diluted with MEK (250 g). The reaction mixture was added to a suspension of NaOH (44.05 g, 1.1 mol), n-BuOH (370.91 g, 5 mol) and mixed at 65° C. for 3 hr. The mixture was then cooled to 40° C., treated with conc. HCl for protonation, and then washed with water three times. The organic phase was separated and residual monomer extracted with hexane. After the extraction, n-BuOH (74.18 g, 1 mol) was added to the reaction mixture and heated to 120° C. for additional esterification. Samples were removed to monitor the dissolution rate of the polymer and the reaction mixture cooled and solvent exchanged into PGMEA when the desired dissolution rate was achieved. 651.4 g of the ring-opened, additionally esterified, polymer as a 20 wt. % solution was obtained (GPC $M_w$=13,600).

Comparative Example 4

This Comparative Example 4 illustrates that the improper treatment of amines with copolymers of maleic anhydride will not result in the formation of polymers and polymer compositions of this invention.

CVX50208 was a copolymer purchased from Cray Valley that was formed by the reaction of styrene/MA (SMA2000) with n-butylamine. Attempts to make solutions of this polymer that are greater than 30% (w/w) in PGMEA were unsuccessful. For purpose of our experiments as described herein, higher than 30% (w/w) of polymer solutions are desirable for formulations that can be spin coated to obtain 10 micrometer or higher thick films. We prepared a solution of 25% (w/w) of this polymer in PGMEA and spin coated on Si-substrate and its dissolution rate in 2.38% (w/w) TMAH was measured. The dissolution rate of this film was 531 nm/s. The solubility of this polymer in PGMEA and dissolution rate in 2.38% (w/w) TMAH were not optimal for formulation and 10 micrometer thick film photo-imaging. FT-IR analysis of this polymer showed the presence of carboxylic acid functionality as evidenced by the presence of a peak at about 1730 cm$^{-1}$ and amide and carboxylic acid amine salt peaks at 1600 cm$^{-1}$. No evidence was found for the presence of repeat units of formula (IIIB), i.e., MI units, as typically evidenced by a sharp band at 1700 cm$^{-1}$. $^{13}$C-NMR spectrum of this polymer did not have distinct peaks for structure (IIIB) at 176-180 ppm as described in example 39. Amine treatment protocols of Examples 20-37 were employed to generate polymers having desired dissolution properties in PGMEA and 2.38% (w/w) TMAH by partially ring closing of amic-acid type structures of formula (IIIA) to MI units of formula (IIIB).

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A polymer comprising:

a first type of repeating unit represented by formula (IA), said first type of repeating unit is derived from a monomer of formula (I):

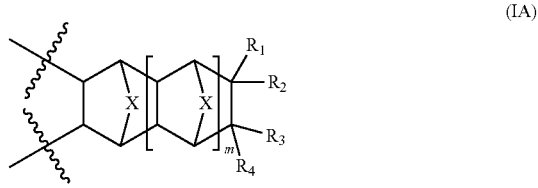

-continued

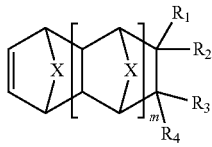
(I)

wherein:
m is an integer 0, 1 or 2;
X is $CH_2$, $CH_2$—$CH_2$, O or $NR_a$ where $R_a$ is linear or branched $(C_1\text{-}C_6)$alkyl;
$R_1$, $R_2$, $R_3$ and $R_4$ independently represents hydrogen, linear or branched $(C_1\text{-}C_{16})$alkyl, hydroxy$(C_1\text{-}C_{16})$alkyl, perfluoro$(C_1\text{-}C_{12})$alkyl, $(C_3\text{-}C_{12})$cycloalkyl, $(C_6\text{-}C_{12})$bicycloalkyl, $(C_7\text{-}C_{14})$tricycloalkyl, $(C_6\text{-}C_{10})$aryl, $(C_6\text{-}C_{10})$aryl$(C_1\text{-}C_3)$alkyl, perfluoro$(C_6\text{-}C_{10})$aryl, perfluoro$(C_6\text{-}C_{10})$aryl$(C_1\text{-}C_3)$alkyl, di$(C_1\text{-}C_2)$alkylmaleimide$(C_3\text{-}C_6)$alkyl, di$(C_1\text{-}C_2)$alkylmaleimide$(C_2\text{-}C_6)$alkoxy$(C_1\text{-}C_2)$alkyl, hydroxy, $(C_1\text{-}C_{12})$alkoxy, $(C_3\text{-}C_{12})$cycloalkoxy, $(C_6\text{-}C_{12})$bicycloalkoxy, $(C_7\text{-}C_{14})$tricycloalkoxy, $(C_6\text{-}C_{10})$aryloxy$(C_1\text{-}C_3)$alkyl, $(C_5\text{-}C_{10})$heteroaryloxy$(C_1\text{-}C_3)$alkyl, $(C_6\text{-}C_{10})$aryloxy, $(C_5\text{-}C_{10})$heteroaryloxy, $(C_1\text{-}C_6)$acyloxy, oxiranyl$(C_0\text{-}C_8)$alkyl, oxiranyl$(CH_2)_aO(CH_2)_b$—, halogen or a group of formula (A):

(A)

—$(CH_2)_a$—$(OCH_2$—$CH_2)_b$—OR wherein:
a is an integer 0, 1, 2, 3 or 4;
b is an integer 0, 1, 2, 3 or 4; and
R is linear or branched $(C_1\text{-}C_6)$alkyl, $(C_5\text{-}C_8)$cycloalkyl, $(C_6\text{-}C_{10})$aryl or $(C_7\text{-}C_{12})$aralkyl;
and/or
a second type of repeating unit represented by formula (IIA), said second type of repeating unit is derived from a monomer of formula (II):

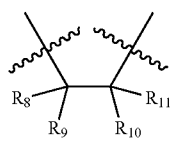
(IIA)

(II)

wherein
$R_8$, $R_9$, $R_{10}$ and $R_{11}$ are the same or different and each independently of one another is selected from hydrogen, linear or branched $(C_1\text{-}C_6)$alkyl, $(C_5\text{-}C_8)$cycloalkyl, $(C_6\text{-}C_{10})$aryl or $(C_7\text{-}C_{12})$aralkyl or a group of formula (B):

(B)

—$SiR_5R_6R_7$ wherein:
$R_5$, $R_6$, and $R_7$ are the same or different and each independently of one other is selected from linear or branched $(C_1\text{-}C_6)$alkyl, $(C_5\text{-}C_8)$cycloalkyl, $(C_6\text{-}C_{10})$aryl or $(C_7\text{-}C_{12})$aralkyl; or
one of $R_8$ or $R_9$ taken together with one of $R_{10}$ or $R_{11}$ and the carbon atoms to which they are attached form a $(C_5\text{-}C_8)$cycloalkyl ring; and a third type of repeating unit represented by formula (IIIA) or (IIIB), said third type of repeating unit (IIIA) or (IIIB) is derived from a monomer of formula (III):

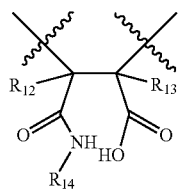
(IIIA)

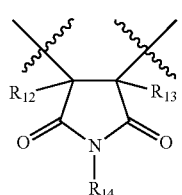
(IIIB)

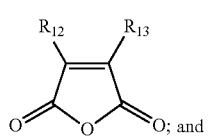
(III)

further comprising a third type of repeating unit represented by formula (IIIE) derived from the monomer of formula (III):

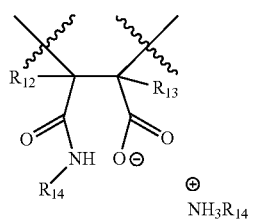
(IIIE)

wherein:
$R_{12}$ and $R_{13}$ are each independently of one another represents hydrogen or linear or branched $(C_1\text{-}C_9)$alkyl or fluorinated or perfluorinated $(C_1\text{-}C_9)$alkyl;
$R_{14}$ is hydrogen, linear or branched $(C_1\text{-}C_{20})$alkyl, $(C_5\text{-}C_8)$cycloalkyl, $(C_6\text{-}C_{10})$aryl or $(C_7\text{-}C_{12})$aralkyl; and
wherein each of aforementioned groups, where valence is permissible, is optionally substituted with one or more groups selected from linear or branched $(C_1\text{-}C_6)$alkyl, $(C_3\text{-}C_7)$cycloalkyl, $(C_1\text{-}C_6)$perfluoroalkyl, $(C_1\text{-}C_6)$alkoxy, $(C_3\text{-}C_7)$cycloalkoxy, $(C_1\text{-}C_6)$perfluoroalkoxy, halogen, hydroxy, linear or branched hydroxy$(C_1\text{-}C_6)$alkyl, $(C_6\text{-}C_{10})$aryl or $(C_7\text{-}C_{12})$aralkyl, wherein said polymer comprises one or more of said first type of repeating units.

2. The polymer of claim 1 wherein said polymer further comprises a third type of repeat unit represented by formula (IIIC) derived from the monomer of formula (III):

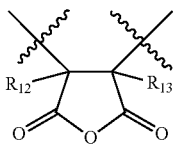

wherein R$_{12}$ and R$_{13}$ are as defined in claim 1.

3. The polymer of claim 1 wherein said polymer further comprises a third type of repeat unit represented by formula (IIID) derived from the monomer of formula (III):

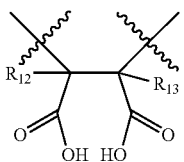

wherein R$_{12}$ and R$_{13}$ are as defined in claim 1.

4. The polymer of claim 1
wherein R$_{12}$ and R$_{13}$ independently of each other selected from the group consisting of hydrogen, methyl, ethyl and trifluoromethyl; and
R$_{14}$ is linear or branched (C$_8$-C$_{20}$)alkyl.

5. The polymer of claim 1 wherein:
X=CH$_2$;
m=0;
R$_1$, R$_2$, R$_3$ and R$_4$ independently represents hydrogen, hexyl, decyl, oxiranyl-CH$_2$OCH$_2$—, di(C$_1$-C$_2$)alkyl-maleimide(C$_3$-C$_6$)alkyl or a group of formula (A):

—(CH$_2$)$_a$—(OCH$_2$—CH$_2$)$_b$—OR    (A)

wherein:
a is 1 or 2;
b is 2 or 3; and
R is methyl, ethyl, n-propyl or n-butyl;
R$_8$, R$_9$, R$_{10}$ and R$_{11}$ are the same or different and each independently of one another is selected from hydrogen, methyl, ethyl, n-propyl, n-butyl, iso-butyl, tert-butyl, n-pentyl, iso-pentyl, neo-pentyl, phenyl, trimethylsilyl and triethylsilyl; or
R$_8$ and R$_{10}$ are the same or different and each independently of one another is selected from hydrogen, methyl or ethyl; and R$_9$ taken together with R$_{11}$ and the carbon atoms to which they are attached form cyclohexyl, cycloheptyl or cyclooctyl ring;
R$_{12}$ and R$_{13}$ are the same or different and each independently of one another is selected from hydrogen, methyl or ethyl; and
R$_{14}$ is (C$_4$-C$_{18}$)alkyl.

6. The polymer of claim 1 wherein said polymer comprises one or more second type of repeating units.

7. The polymer of claim 1 wherein said polymer comprises 0 to 75 mole percent of first type of repeating units, 0 to 90 mole percent of second type of repeating units and 10 to 60 mole percent of third type of repeating units.

8. The polymer of claim 1 wherein first type of repeating unit is derived from a monomer selected from the group consisting of:
bicyclo[2.2.1]hept-2-ene;
5-methylbicyclo[2.2.1]hept-2-ene;
5-ethylbicyclo[2.2.1]hept-2-ene;
5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1]hept-2-ene;
1-(4-(bicyclo[2.2.1]hept-5-en-2-yl)butyl)-3,4-dimethyl-1H-pyrrole-2,5-dione;
2-((bicyclo[2.2.1]hept-5-en-2-ylmethoxy)methyl)oxirane; and
5-phenethylbicyclo[2.2.1]hept-2-ene.

9. The polymer of claim 1 wherein second type of repeating unit is derived from a monomer selected from the group consisting of:
2-methylprop-1-ene;
2-methylpent-1-ene;
2,4,4-trimethylpent-1-ene;
2,4,4-trimethylpent-2-ene;
trimethyl(vinyl)silane; and
styrene.

10. A photoimageable composition comprising:
a polymer containing:
a first type of repeating unit represented by formula (IA), said first type of repeating unit is derived from a monomer of formula (I):

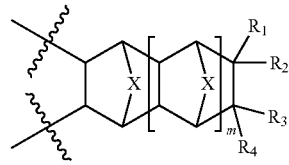

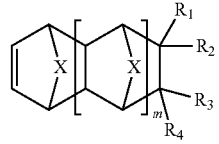

wherein:
m is an integer 0, 1 or 2;
X is CH$_2$, CH$_2$—CH$_2$, O or NR$_a$ where R$_a$ is linear or branched (C$_1$-C$_6$)alkyl;
R$_1$, R$_2$, R$_3$ and R$_4$ independently represents hydrogen, linear or branched (C$_1$-C$_{16}$)alkyl, hydroxy(C$_1$-C$_{16}$) alkyl, perfluoro(C$_1$-C$_{12}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, (C$_6$-C$_{10}$)aryl(C$_1$-C$_3$)alkyl, perfluoro(C$_6$-C$_{10}$)aryl, perfluoro(C$_6$-C$_{10}$)aryl(C$_1$-C$_3$)alkyl, di(C$_1$-C$_2$)alkylmaleimide(C$_3$-C$_6$)alkyl, di(C$_1$-C$_2$) alkylmaleimide(C$_2$-C$_6$)alkoxy(C$_1$-C$_2$)alkyl, hydroxy, (C$_1$-C$_{12}$)alkoxy, (C$_3$-C$_{12}$)cycloalkoxy, (C$_6$-C$_{12}$)bicycloalkoxy, (C$_7$-C$_{14}$)tricycloalkoxy, (C$_6$-C$_{10}$) aryloxy(C$_1$-C$_3$)alkyl, (C$_5$-C$_{10}$)heteroaryloxy(C$_1$-C$_3$) alkyl, (C$_6$-C$_{10}$)aryloxy, (C$_5$-C$_{10}$)heteroaryloxy, (C$_1$-C$_6$)acyloxy, oxiranyl(C$_0$-C$_8$)alkyl, oxiranyl(CH$_2$)$_a$O (CH$_2$)$_b$—, halogen or a group of formula (A):

—(CH$_2$)$_a$—(OCH$_2$—CH$_2$)$_b$—OR    (A)

wherein:
a is an integer 0, 1, 2, 3 or 4;
b is an integer 0, 1, 2, 3 or 4; and
R is linear or branched (C$_1$-C$_6$)alkyl, (C$_5$-C$_8$)cycloalkyl, (C$_6$-C$_{10}$)aryl or (C$_7$-C$_{12}$)aralkyl;
and/or
a second type of repeating unit represented by formula (IIA), said second type of repeating unit is derived from a monomer of formula (II):

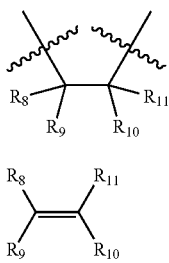

wherein $R_8$, $R_9$, $R_{10}$ and $R_{11}$ are the same or different and each independently of one another is selected from hydrogen, linear or branched $(C_1-C_6)$alkyl, $(C_5-C_8)$cycloalkyl, $(C_6-C_{10})$aryl or $(C_7-C_{12})$aralkyl or a group of formula (B):

—SiR$_5$R$_6$R$_7$           (B)

wherein:

$R_5$, $R_6$, and $R_7$ are the same or different and each independently of one other is selected from linear or branched $(C_1-C_6)$alkyl, $(C_5-C_8)$cycloalkyl, $(C_6-C_{10})$aryl or $(C_7-C_{12})$aralkyl; or one of $R_8$ or $R_9$ taken together with one of $R_{10}$ or $R_{11}$ and the carbon atoms to which they are attached form a $(C_5-C_8)$cycloalkyl ring; and a third type of repeating unit represented by formula (IIIA) or (IIIB), said third type of repeating unit (IIIA) or (IIIB) is derived from a monomer of formula (III):

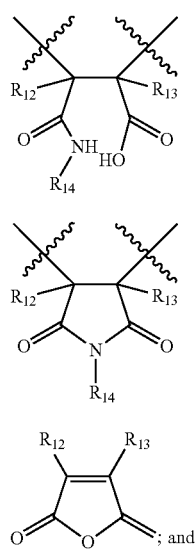

further comprising a third type of repeating unit represented by formula (IIIE) derived from the monomer of formula (III):

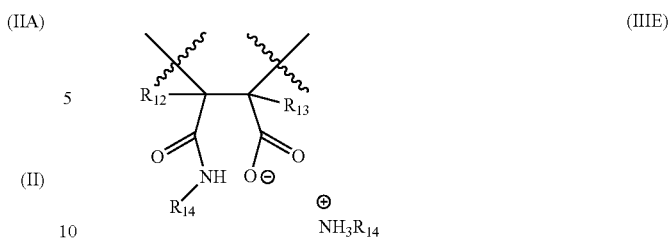

wherein:

$R_{12}$ and $R_{13}$ are each independently of one another represents hydrogen or linear or branched $(C_1-C_9)$alkyl or fluorinated or perfluorinated $(C_1-C_9)$alkyl;

$R_{14}$ is hydrogen, linear or branched $(C_1-C_{20})$alkyl, $(C_5-C_8)$cycloalkyl, $(C_6-C_{10})$aryl or $(C_7-C_{12})$aralkyl; and wherein each of aforementioned groups, where valence is permissible, is optionally substituted with one or more groups selected from linear or branched $(C_1-C_6)$alkyl, $(C_3-C_7)$cycloalkyl, $(C_1-C_6)$perfluoroalkyl, $(C_1-C_6)$alkoxy, $(C_3-C_7)$cycloalkoxy, $(C_1-C_6)$perfluoroalkoxy, halogen, hydroxy, linear or branched hydroxy $(C_1-C_6)$alkyl, $(C_6-C_{10})$aryl or $(C_7-C_{12})$aralkyl;

a photoactive compound containing a diazo functional moiety; and a carrier solvent.

11. The composition of claim 10 wherein said diazo functional moiety is of the formula (IV), (V) or (VI):

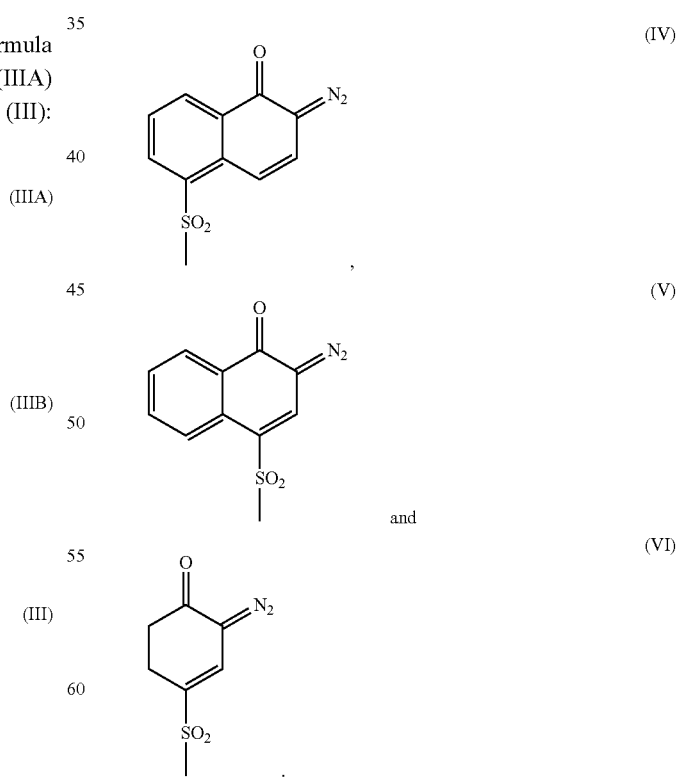

12. The composition of claim 11, wherein said photo active compound is selected from the group consisting of:

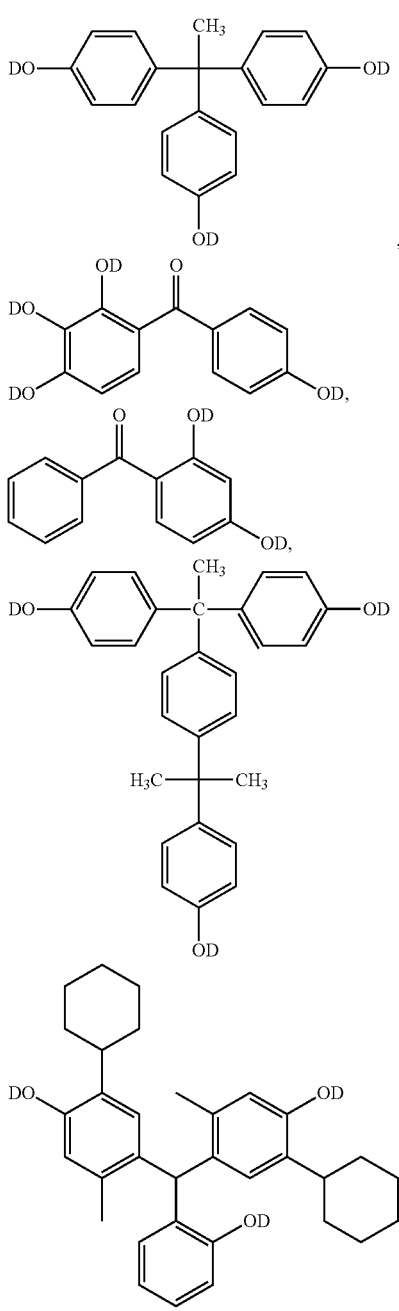

wherein at least one D is a diazo functional moiety of formula (IV), (V) or (VI) and the remainder Ds are hydrogen.

13. The composition of claim 10 wherein first type of repeating unit is derived from a monomer selected from the group consisting of:
bicyclo[2.2.1]hept-2-ene;
5-methylbicyclo[2.2.1]hept-2-ene;
5-ethylbicyclo[2.2.1]hept-2-ene;
5-hexylbicyclo[2.2.1]hept-2-ene;
5-octylbicyclo[2.2.1]hept-2-ene;
5-decylbicyclo[2.2.1]hept-2-ene;
5-((2-(2-methoxyethoxy)ethoxy)methyl)bicyclo[2.2.1] hept-2-ene;
1-(4-(bicyclo[2.2.1]hept-5-en-2-yl)butyl)-3,4-dimethyl-1H-pyrrole-2,5-dione;
2-((bicyclo[2.2.1]hept-5-en-2-ylmethoxy)methyl)oxirane; and
5-phenethylbicyclo[2.2.1]hept-2-ene.

14. The composition of claim 10 wherein second type of repeating unit is derived from a monomer selected from the group consisting of:
2-methylprop-1-ene;
2-methylpent-1-ene;
2,4,4-trimethylpent-1-ene;
2,4,4-trimethylpent-2-ene;
trimethyl(vinyl)silane; and
styrene.

15. The composition of claim 10 wherein said carrier solvent is selected from the group consisting of: cyclohexanone, cyclopentanone, diethylene glycol dimethyl ether, propylene glycol monomethyl ether acetate (PGMEA), N-methyl-2-pyrrolidone (NMP), gamma-butyrolactone (GBL), N,N-dimethylacetamide, N,N-dimethylformamide, anisole, acetone, methyl 3-methoxypropionate, tetrahydrofuran (THF) and mixtures in any combination thereof.

16. The composition of claim 10 further comprising one or more cross-linking agents selected from the group consisting of:
2,2'-(((2-ethyl-2-((oxiran-2-ylmethoxy)methyl)propane-1,3-diyl)bis(oxy))-bis(methylene))bis(oxirane) (TMPTGE);
bis(4-(oxiran-2-ylmethoxy)phenyl)methane (EPON 862);
polyglycidyl ether of an aliphatic triol (Heloxy 84);
glycidyl ether of para-tertiary butyl phenol (Heloxy 65);
polyethylene glycol diglycidyl ether (PEGDGE);
polypropylene glycol diglycidyl ether (PPGDGE);
and mixtures in any combination thereof.

17. The composition of claim 10, wherein said polymer is selected from the group consisting of:
a polymer containing repeating units derived from bicyclo[2.2.1]hept-2-ene and maleic anhydride ring opened with n-octyl amine, n-dodecylamine, n-hexadecylamine or n-octadecylamine; and
a polymer containing repeat units derived from styrene and maleic anhydride ring opened with n-octyl amine, n-dodecylamine, n-hexadecylamine or n-octadecylamine.

18. A method of forming a film for the fabrication of a microelectronic or optoelectronic device comprising:
coating a suitable substrate with a composition according to claim 10 to form a film;
patterning the film with a mask by exposing to a suitable radiation;
developing the film after exposure to form a photo-pattern; and
curing the film by heating to a suitable temperature.

19. An optoelectronic or microelectronic device comprising a cured product of a composition of claim 10.

* * * * *